United States Patent
Kawamura et al.

(10) Patent No.: US 12,543,389 B2
(45) Date of Patent: Feb. 3, 2026

(54) LIGHT-RECEIVING ELEMENT, X-RAY IMAGING ELEMENT, AND ELECTRONIC APPARATUS

(71) Applicants: SONY SEMICONDUCTOR SOLUTIONS CORPORATION, Kanagawa (JP); RIKEN, Saitama (JP)

(72) Inventors: Takahiro Kawamura, Kanagawa (JP); Hiroki Tojinbara, Kanagawa (JP); Takaki Hatsui, Saitama (JP); Shinichi Yoshida, Kanagawa (JP); Keiichi Nakazawa, Kanagawa (JP); Hikaru Iwata, Kanagawa (JP); Kazunobu Ota, Kanagawa (JP); Takuya Maruyama, Kanagawa (JP); Hiroaki Ishiwata, Kanagawa (JP); Chihiro Arai, Kanagawa (JP); Atsuhiro Ando, Kanagawa (JP); Toru Shirakata, Kanagawa (JP); Hisahiro Ansai, Kanagawa (JP); Satoe Miyata, Kanagawa (JP); Ryu Kamibaba, Kanagawa (JP); Yusuke Uesaka, Kanagawa (JP); Yukari Takeya, Kanagawa (JP)

(73) Assignees: Sony Semiconductor Solutions Corporation, Kanagawa (JP); RIKEN, Saitama (JP)

( * ) Notice: Subject to any disclaimer, the term of this patent is extended or adjusted under 35 U.S.C. 154(b) by 210 days.

(21) Appl. No.: 18/575,381

(22) PCT Filed: Mar. 25, 2022

(86) PCT No.: PCT/JP2022/014372
§ 371 (c)(1),
(2) Date: Dec. 29, 2023

(87) PCT Pub. No.: WO2023/281857
PCT Pub. Date: Jan. 12, 2023

(65) Prior Publication Data
US 2024/0313030 A1   Sep. 19, 2024

(30) Foreign Application Priority Data

Jul. 6, 2021  (JP) ................. 2021-112167

(51) Int. Cl.
*H10F 39/18*  (2025.01)
*H10F 39/00*  (2025.01)

(52) U.S. Cl.
CPC ....... *H10F 39/1892* (2025.01); *H10F 39/811* (2025.01)

(58) Field of Classification Search
CPC .... H10F 39/1892; H10F 39/811; H10F 30/20; H10F 30/221; H10F 39/12; H10F 39/10
See application file for complete search history.

(56) References Cited

U.S. PATENT DOCUMENTS 6,605,842 B2* 8/2003 Hoshino ............. H10D 84/83
257/376
2008/0286928 A1* 11/2008 Minami ............. H10D 84/038
438/275

(Continued)

FOREIGN PATENT DOCUMENTS

JP   H10-209486   8/1998
JP   H11-004012   1/1999

(Continued)

OTHER PUBLICATIONS

Segal et al., "A new structure for controlling dark current due to surface generation in drift detectors," Nuclear Instruments and Methods in Physics Research A, vol. 414, 1998, pp. 307-316.

(Continued)

*Primary Examiner* — Kiho Kim
(74) *Attorney, Agent, or Firm* — Sheridan Ross PC

(57) ABSTRACT

A first light-receiving element of an embodiment of the disclosure includes: a semiconductor substrate including a photoelectric conversion region; a first first electrically-conductive region provided at a first surface interface of the semiconductor substrate and coupled to a first electrode; a (Continued)

second first electrically-conductive region provided around the first first electrically-conductive region and coupled to a second electrode, at the first surface interface; a third first electrically-conductive region in an electrically floating state provided around the second first electrically-conductive region, at the first surface interface; a first second electrically-conductive region having a different electrically-conductive type between the first first electrically-conductive region and the second first electrically-conductive region, at the first surface interface; and a fourth first electrically-conductive region provided at least between the first first electrically conductive region and the first second electrically-conductive region and having an impurity concentration lower than the first first electrically-conductive region, near the first surface interface.

40 Claims, 34 Drawing Sheets

(56) References Cited

U.S. PATENT DOCUMENTS

2010/0133441 A1 6/2010 Aurola
2020/0006409 A1 1/2020 Bakowski Holtryd et al.

FOREIGN PATENT DOCUMENTS

| JP | 2008-511132 | 4/2008 |
| JP | 2020-148608 | 9/2020 |
| WO | WO 2020/005132 | 1/2020 |

OTHER PUBLICATIONS

International Search Report and Written Opinion prepared by the Japan Patent Office on May 17, 2022, for International Application No. PCT/JP2022/014372, 2 pgs.

* cited by examiner

FIG. 38
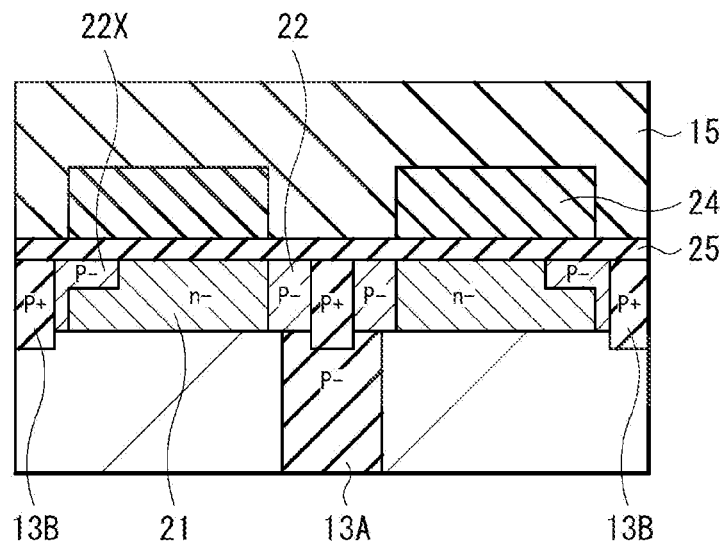
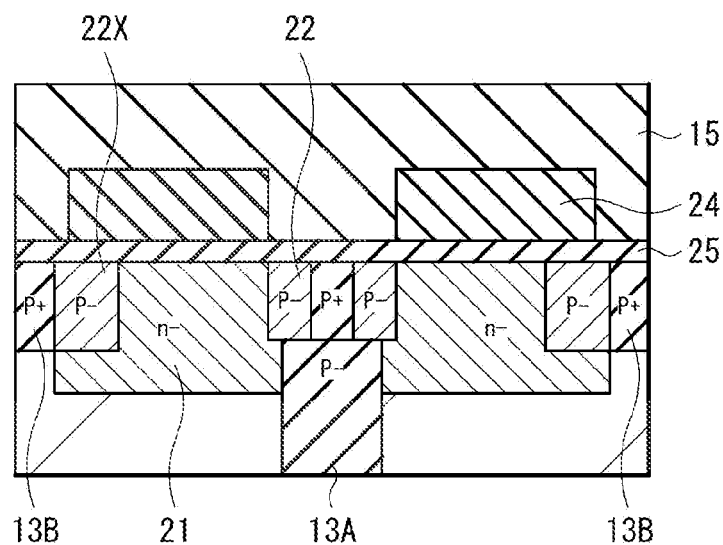

LIGHT-RECEIVING ELEMENT, X-RAY IMAGING ELEMENT, AND ELECTRONIC APPARATUS

CROSS REFERENCE TO RELATED APPLICATIONS

This application is a national stage application under 35 U.S.C. 371 and claims the benefit of PCT Application No. PCT/JP2022/014372, having an international filing date of 25 Mar. 2022, which designated the United States, which PCT application claimed the benefit of Japanese Patent Application No. 2021-112167, filed 6 Jul. 2021, the entire disclosures of each of which are incorporated herein by reference.

TECHNICAL FIELD

The present disclosure relates to a light-receiving element suitable for X-ray photography for medical application or non-destructive examination, for example, and an X-ray imaging element and an electronic apparatus including the light-receiving element.

BACKGROUND ART

Solid-state imaging devices are used in various applications including, for example, an imaging device such as a digital still camera or a video camera, an electronic apparatus such as a mobile terminal apparatus having an imaging function, or an electromagnetic wave sensor that detects various wavelengths other than that of visible light. Examples of the solid-state imaging devices include an APS (Active Pixel Sensor) including an amplifying element for each pixel; a CMOS (complementary MOS) image sensor (CIS) has been widely used that reads signal charge accumulated in a photodiode, as a photoelectric conversion element, via a MOS (Metal Oxide Semiconductor) transistor.

As a sensor for scientific use that requires high sensitivity measurement, a light-receiving element (PIN photodiode) has been used that has a structure in which a photoelectric conversion region and a floating diffusion region (Floating Diffusion; FD) are integrated (see, e.g., PTL 1). Such a light-receiving element is easy to be manufactured from a simple structure. In addition, any potential difference can be applied to a p-n junction that forms a photoelectric conversion region. This makes it easy to increase the thickness of the photoelectric conversion region.

CITATION LIST

Patent Literature

PTL 1: Japanese Unexamined Patent Application Publication No. H11-4012

SUMMARY OF THE INVENTION

Incidentally, a light-receiving element used in an X-ray imaging element is required to reduce an influence of a total dose effect due to X-ray irradiation.

It is desirable to provide a light-receiving element, an X-ray imaging element, and an electronic apparatus that make it possible to reduce an influence of a total dose effect due to X-ray irradiation.

A first light-receiving element according to an embodiment of the present disclosure includes: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a third first electrically-conductive region provided around the second first electrically-conductive region and being in an electrically floating state, at the interface of the first surface; a first second electrically-conductive region having a different electrically-conductive type provided between the first first electrically-conductive region and the second first electrically-conductive region, at the interface of the first surface; and a fourth first electrically-conductive region provided at least between the first first electrically-conductive region and the first second electrically-conductive region and having an impurity concentration lower than the first first electrically-conductive region, near the interface of the first surface.

A second light-receiving element according to an embodiment of the present disclosure includes: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a third first electrically-conductive region provided around the second first electrically-conductive region and being in an electrically floating state, at the interface of the first surface; an electrically-conductive film provided on a side of the first surface of the semiconductor substrate; and an insulating layer provided between the first surface and the electrically-conductive film, the insulating layer including a monolayer film of silicon oxide or a stacked film in which at least a silicon oxide film having a thickness of 30 nm or more and a silicon nitride film are provided in this order from the side of the first surface.

A third light-receiving element according to an embodiment of the present disclosure includes: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a third first electrically-conductive region provided around the second first electrically-conductive region and being in an electrically floating state, at the interface of the first surface; a first insulating layer provided on the first surface of the semiconductor substrate and including a high-dielectric material having a relative permittivity higher than silicon oxide; and an electrically-conductive film provided on a side of the first surface of the semiconductor substrate with at least the first insulating layer interposed therebetween.

A fourth light-receiving element according to an embodiment of the present disclosure includes: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a third first electrically-conductive region provided around the second first electrically-conductive region and being in an electrically floating state, at the interface of the first surface; and an insulating layer provided on a side of the first surface of the semiconductor substrate and having an air gap between the first first electrically-conductive region and the second first electrically-conductive region.

A fifth light-receiving element according to an embodiment of the present disclosure includes: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a plurality of third first electrically-conductive regions provided around the second first electrically-conductive region substantially concentrically and rectangularly or substantially concentrically about the first first electrically-conductive region and being in an electrically floating state, at the interface of the first surface; and a second second electrically-conductive region provided between the third first electrically-conductive regions adjacent to each other, at the interface of the first surface.

A sixth light-receiving element according to an embodiment of the present disclosure includes: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a third first electrically-conductive region provided around the second first electrically-conductive region and being in an electrically floating state, at the interface of the first surface; an electrically-conductive film provided above the first surface at least between the first first electrically-conductive region and the second first electrically-conductive region; a first second electrically-conductive region having a different electrically-conductive type provided between the first first electrically-conductive region and the second first electrically-conductive region, at the interface of the first surface; and a fourth first electrically-conductive region provided between the second first electrically-conductive region and the first second electrically-conductive region, at the interface of the first surface, the fourth first electrically-conductive region partially extending on the second first electrically-conductive region and having an impurity concentration lower than the second first electrically-conductive region.

A seventh light-receiving element according to an embodiment of the present disclosure includes: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a third first electrically-conductive region provided around the second first electrically-conductive region and being in an electrically floating state, at the interface of the first surface; an electrically-conductive film provided above the first surface between the first first electrically-conductive region and the second first electrically-conductive region; a first second electrically-conductive region having a different electrically-conductive type formed up to a position deeper than the second first electrically-conductive region between the first first electrically-conductive region and the second first electrically-conductive region, at the interface of the first surface; and a fourth first electrically-conductive region provided between the first first electrically-conductive region and the second first electrically-conductive region and between the second first electrically-conductive region and the first second electrically-conductive region, at the interface of the first surface, the fourth first electrically-conductive region having an impurity concentration lower than the second first electrically-conductive region.

An X-ray imaging element according to an embodiment of the present disclosure includes a plurality of the light-receiving elements according to the embodiment of the present disclosure generating signal charge based on an X-ray.

An electronic apparatus according to an embodiment of the present disclosure includes the X-ray imaging element according to the embodiment of the present disclosure.

In the first light-receiving element according to the embodiment of the present disclosure, the X-ray imaging element according to the embodiment of the present disclosure, and the electronic apparatus according to the embodiment of the present disclosure, the first second electrically-conductive region having a different electrically-conductive type is provided between the first first electrically-conductive region coupled to the first electrode and the second first electrically-conductive region coupled to the second electrode, provided near the interface of the first surface of the semiconductor substrate including the photoelectric conversion region, and the fourth first electrically-conductive region having an impurity concentration lower than the first electrically-conductive region is further provided between the first first electrically-conductive region and the first second electrically-conductive region. In the second light-receiving element according to the embodiment of the present disclosure, the insulating layer including a monolayer film of silicon oxide or a stacked film in which at least a silicon oxide film having a thickness of 30 nm or more and a silicon nitride film are provided in this order from the side of the first surface is provided between the first surface of the semiconductor substrate and the electrically-conductive film provided thereabove. In the third light-receiving element according to the embodiment of the present disclosure, the electrically-conductive film is provided on the first surface of the semiconductor substrate with the first insulating layer, including a high-dielectric material having a relative permittivity higher than silicon oxide, being interposed therebetween. In the fourth light-receiving element according to the embodiment of the present disclosure, the insulating layer having an air gap between the first first electrically-conductive region and the second first electrically-conductive region is provided on the side of the first surface of the semiconductor substrate. In the fifth light-receiving element according to the embodiment of the present disclosure, the third first electrically-conductive region being in an electrically floating state is provided substantially concentrically and rectangularly or substantially concentrically about the first first electrically-conductive region, and the second second electrically-conductive region is further provided between the third first electrically-conductive regions adjacent to each other, at the interface of the first surface of the semiconductor substrate. In the sixth light-receiving element according to the embodiment of the present disclosure, the first second electrically-conductive region is provided between the first first electrically-conductive region and the second first electrically-conductive region, and the fourth first electrically-conductive region partially extending on the second first electrically-conductive region and having an impurity concentration lower than the second first electrically-conductive region is provided between the second first electrically-conductive region and the first second electrically-conductive region, at a first interface of the semiconductor substrate. In the seventh light-receiving element according to the embodiment of the present disclosure, there are provided the first second electrically-conductive region having a different electrically-conductive type formed up to a position deeper than the second first electrically-conductive region between the first first electrically-conductive region and the second first electrically-conductive region, and the fourth first electrically-conductive region provided between the first first electrically-conductive region and the second first electrically-conductive region and between the second first electrically-conductive region and the first second electrically-conductive region and having an impurity concentration lower than the second first electrically-conductive region, at the interface of the first surface. This makes it possible to hinder the interface of the first surface of the semiconductor substrate having been irradiated with an X-ray from being brought into the second electrically-conductive type.

BRIEF DESCRIPTION OF THE DRAWINGS

FIG. 38 is a schematic cross-sectional view of an example of a configuration of a main part of a light-receiving element according to Modification Example 13 of the present disclosure.

FIG. 39 is a schematic cross-sectional view of another example of the configuration of the main part of the light-receiving element according to Modification Example 13 of the present disclosure.

MODES FOR CARRYING OUT THE INVENTION

Figure 1:
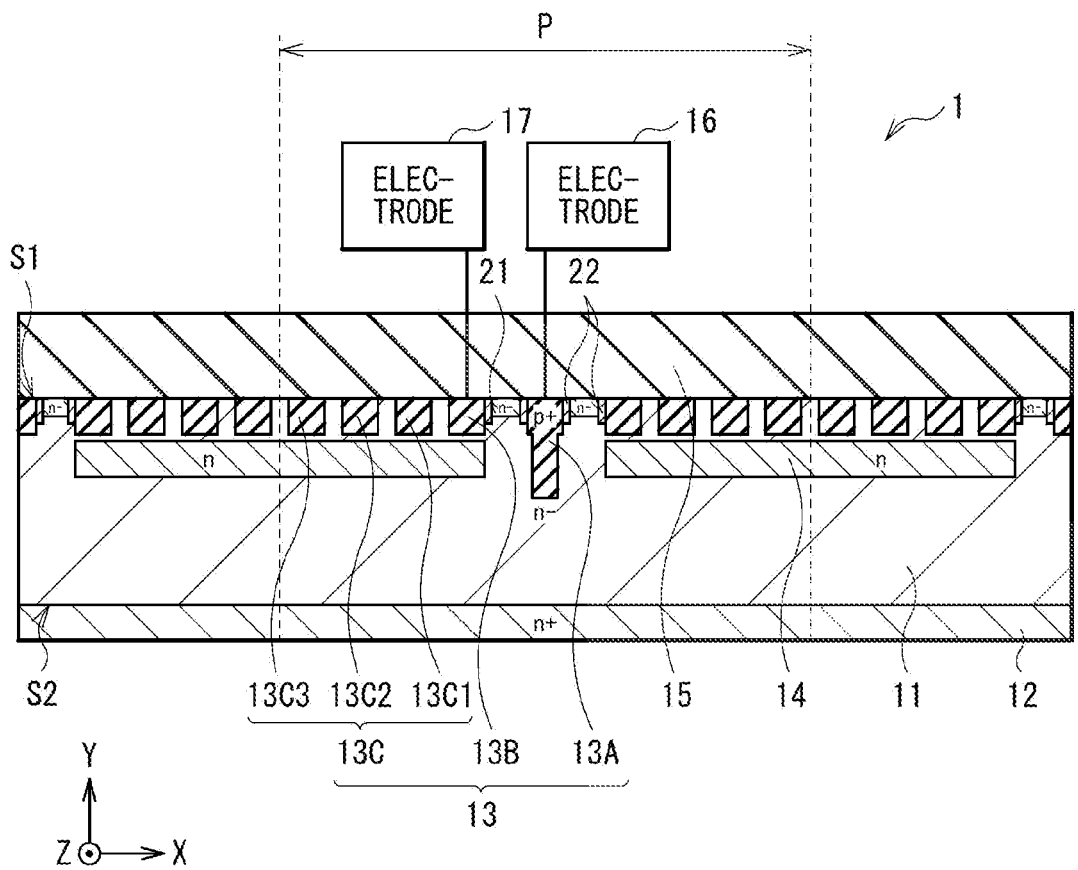
FIG. 1 is a schematic cross-sectional view of an example of a configuration of a light-receiving element according to an embodiment of the present disclosure.

In the following, a description is given in detail of embodiments of the present disclosure with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. Embodiment (An example of a light-receiving element provided with an n-type electrically-conductive region and an LDA on a front surface of a semiconductor substrate between an anode and a drain
    1-1. Configuration of Light-Receiving Element
    1-2. Method of Manufacturing Light-Receiving Element
    1-3. Workings and Effects
2. Modification Examples
    2-1. Modification Example 1 (An example of an insulating layer between a front surface of a semiconductor substrate and a wiring layer)
    2-2. Modification Example 2 (An example of an insulating layer on a front surface of a semiconductor substrate)
    2-3. Modification Example 3 (An example of a layout of a gate electrode)
    2-4. Modification Example 4 (An example of providing an air gap between an anode and an n-type electrically-conductive region)
    2-5. Modification Example 5 (An example of providing a field plate above a guard ring)
    2-6. Modification Example 6 (An example of providing an n-type electrically-conductive region between a drain and a guard ring and between guard rings)
    2-7. Modification Example 7 (An example of controlling an interval between a front surface of a semiconductor substrate and a wiring layer)
    2-8. Modification Example 8 (An example of providing an n-type or p-type electrically-conductive region between guard rings between pixels adjacent to each other)
    2-9. Modification Example 9 (An example of application of a voltage to a guard ring)
    2-10. Modification Example 10 (An example of providing an interval between an embedded layer and a p-type electrically-conductive region on a front surface of a semiconductor substrate)
    2-11. Modification Example 11 (An example of removing an overlap of an increased width section of an anode with a drain)
    2-12. Modification Example 12 (An example of partially providing an increased width section)
    2-13. Modification Example 13 (Another example of a layout of an n-type electrically-conductive region and an LDD between an anode and a drain)
    2-14. Modification Example 14 (An example of an impurity concentration of an n-type electrically-conductive region in multiple steps between an anode and a drain)
    2-15. Modification Example 15 (An example of embedding an insulating film between an anode and a drain)
    2-16. Modification Example 16 (An example of embedding a gate electrode between an anode and a drain)
    2-17. Modification Example 17 (An example of embedding a gate of a vertical transfer transistor around an anode)
3. Application Example

1. Embodiment

FIG. 1 schematically illustrates an example of a cross-sectional configuration of a light-receiving element (a light-receiving element 1) according to an embodiment of the present disclosure. The light-receiving element 1 includes, for example, a PIN (Positive Intrinsic Negative) type photodiode that applies a reverse bias between a front surface and a back surface of a semiconductor substrate 11. For example, the light-receiving element 1 constitutes one pixel (unit pixel P) in an electromagnetic wave detector or a radiation imaging element (e.g., an X-ray imaging element 100; see FIG. 45) to read information on a subject (to capture an image of a subject), for example, on the basis of a radioactive ray (e.g., α-ray, β-ray, γ-ray, and X-ray, etc.).

1-1. Configuration of Light-Receiving Element

In the light-receiving element 1, for example, a p-type electrically-conductive region (first electrically-conductive region) 13 is partially formed at an interface of a front surface S1 (first surface) of the semiconductor substrate 11 of n-type, and an n-type electrically-conductive layer (second electrically-conductive type layers) 12 is formed at an interface of a surface (a back surface S2; second surface) on a side opposite to the front surface S1. The p-type electrically-conductive region 13 includes a plurality of regions; the light-receiving element 1 includes, for example, a region (first first electrically-conductive region) constituting an anode 13A, a region (second first electrically-conductive region) constituting a drain 13B, and a region (third first electrically-conductive region) constituting a guard ring 13C. In the light-receiving element 1, an n-type electrically-conductive region (second electrically-conductive region) is further formed as an embedded layer 14 inside the semiconductor substrate 11. The light-receiving element 1 of the present embodiment further includes an n-type electrically-conductive region (first second electrically-conductive region) 21 at the interface of the front surface S1 between the anode 13A and the drain 13B, and a p-type electrically-conductive region (fourth first electrically-conductive region) having an impurity concentration lower than that of a region constituting the anode 13A or the like as a Lightly Doped Anode (LDA) 22 at least between the anode 13A and an n-type electrically-conductive region 21.

It is to be noted that, in the present embodiment, a description is given of a case where holes, of excitons (electron/hole pairs) generated by photoelectric conversion, are read as signal charge. In addition, in the drawings, "− (minus)" attached to "p" and "n" indicates that a p-type or n-type impurity has a low concentration, and "+ (plus)" indicates that the p-type or n-type impurity has a high concentration. The magnitude relationships among concentrations of the p-type and n-type impurities are $p^-<p<p^+$ and $n^-<n<n^+$, respectively.

The semiconductor substrate 11 is configured by, for example, an n-type, p-type, or i-type (intrinsic semiconductor) semiconductor, and includes, therein, a p-i-n junction or a p-n junction to serve as a photoelectric conversion region. Specifically, in the present embodiment, an n-type semiconductor substrate is used as the semiconductor substrate 11, and a plurality of p-type electrically-conductive regions (first electrically-conductive region) 13 and an n-type electrically-conductive region (second electrically-conductive region) are formed at the interface of the front surface S1, as described above. A film thickness (hereinafter, simply referred to as a "thickness") of the semiconductor substrate 11 in a stacking direction (Y-axis direction) is, for example, 10 μm or more and 700 m or less.

As the semiconductor substrate 11, for example, a silicon substrate is used, but this is not limitative. As the semiconductor substrate 11, for example, there may be used a substrate including germanium (Ge), gallium arsenide (GaAs), indium gallium arsenide (InGaAs), zinc selenium (ZnSe), gallium nitride (GaN), indium gallium nitride (InGaN), or the like.

The p-type electrically-conductive region 13 is a region including p-type impurities (p-type impurity region) at a concentration of $1e^{18}$ cm$^{-3}$ to $1e^{21}$ cm$^{-3}$, for example, and a plurality of p-type electrically-conductive regions 13 is formed at the interface of the front surface S1 of the semiconductor substrate 11. Specifically, the p-type electrically-conductive region 13 includes three regions: a region constituting the anode 13A; a region constituting the drain 13B; and a region constituting the guard ring 13C. The regions are spaced apart from each other, and the drain 13B is formed in a ring shape around the anode 13A. The guard ring 13C is formed in a ring shape around the drain 13B. As for a thickness, for example, the p-type electrically-conductive region 13 is formed at a thickness of 3 μm or less, for example, from the interface of the front surface S1 of the semiconductor substrate 11, for example, in a case where a pitch of the unit pixel P is 10 m or more and 100 m or less, depending on a configuration of the unit pixel P.

The anode 13A receives application of a voltage to read holes (h+) as signal charge, for example, among carriers generated by photoelectric conversion; the anode 13A is coupled to an electrode 16 (first electrode), for example. For example, the anode 13A is individually formed at substantially the middle of the unit pixel P. The planar shape of the anode 13A is not particularly limited, and may be a circular shape (see, e.g., FIG. 2) or a polygonal shape. For example, the anode 13A partially protrudes to a side closer to the back surface S2 than a bottom surface of the embedded layer 14 described later. A size of the anode 13A is, for example, 0.1 m or more and 10 m or less in a case where the pitch of the unit pixel P is 10 μm or more and 100 m or less, for example, depending on a size of the unit pixel P.

The drain 13B receives application of a voltage to discharge a dark current generated at the interface of the front surface S1 at the time of X-ray irradiation, for example; the drain 13B is coupled to, for example, an electrode 17 (second electrode). The drain 13B is formed in a ring shape around the anode 13A, and the dark current generated at the interface of the front surface S1 at the time of X-ray irradiation on the semiconductor substrate 11 is constantly discharged from the drain 13B. This makes it possible to prevent the dark current from flowing into the anode 13A. A planar shape of the drain 13B is not particularly limited, and may be an annular shape or a polygonal shape (see, e.g., FIG. 2).

Figure 2:
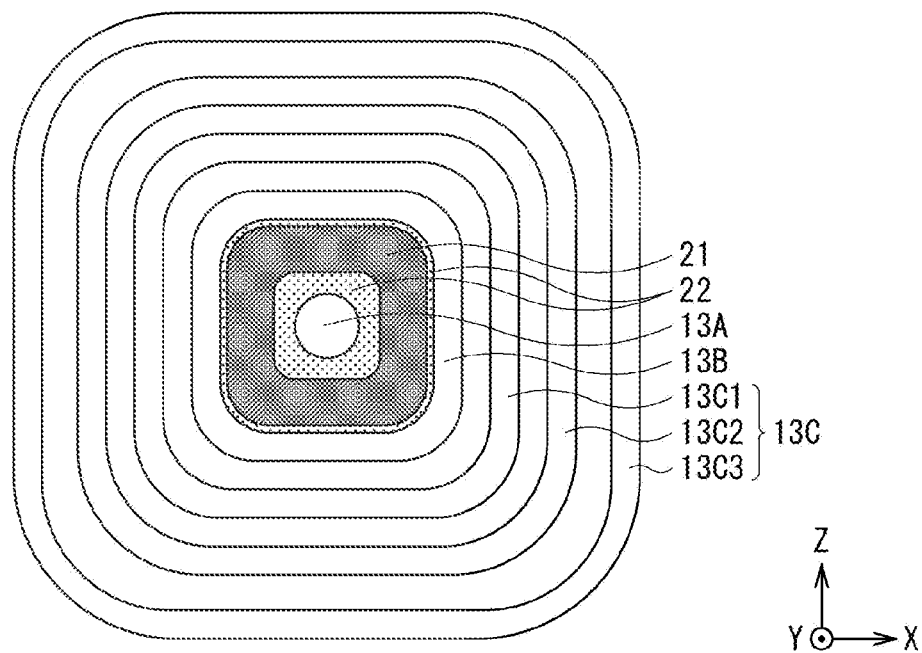
FIG. 2 is a schematic plan view of an example of a pattern of each electrically-conductive region on a front surface of a semiconductor substrate of the light-receiving element illustrated in FIG. 1.

The guard ring 13C is provided to generate a horizontal electric field that alleviates the concentration of an electric field on the drain 13B and simultaneously assists transfer of signal charge (holes) in a horizontal direction (e.g., X-Y plane direction). The guard ring 13C is formed in a ring shape around the drain 13B to surround the anode 13A and the drain 13B. Unlike the anode 13A and drain 13B, the guard ring 13C is in an electrically floating state. For example, a plurality of guard rings 13C is formed at the interface of the front surface S1 of the semiconductor substrate 11 substantially concentrically or substantially concentrically and polygonally about the anode 13A, for example. Specifically, as illustrated in FIGS. 1 and 2, the guard ring 13C includes, for example, three p-type electrically-conductive regions, and is formed triply (guard rings 13C1, 13C2, and 13C3) around the drain 13B. In this manner, providing the plurality of guard rings 13C enables the concentrated electric field to be distributed to a plurality of locations and at the same time to generate the horizontal electric field in a wide region. In addition, on both sides of the guard ring 13C1, 13C2, or 13C3, there may be further formed a p-type electrically-conductive region (fifth first electrically-conductive region) having an impurity concentration lower than that of the p-type electrically-conductive region 13, e.g., a concentration of about $1e^{16}$ cm$^{-3}$ to $1e^{19}$ cm$^{-3}$.

In a case where the drain 13B and the guard ring 13C are formed to have a polygonal shape (e.g., a rectangular shape), the corners are preferably formed to have a curved shape, as illustrated in FIG. 2. This allows the concentration of the electric field at the corners to be alleviated. In addition, although FIG. 2 exemplifies the drain 13B and the guard ring 13C being continuously provided around the anode 13A, this is not limitative. For example, a portion thereof may be cut, or, alternatively, they may be formed intermittently.

A linewidth of the ring constituting the drain 13B and the guard ring 13C is, for example, 0.100 μm or more and 10 μm or less. An interval between the drain 13B and the guard ring 13C is, for example, 0.100 μm or more and 10 μm or less. It is to be noted that the linewidths of the drain 13B and the guard ring 13C are not necessarily constant.

In addition, as illustrated in FIGS. 1 and 2, in a case where the plurality of guard rings 13C are provided, intervals therebetween are preferably uniform in all formation regions. Thus, as in a light-receiving element 1A of Modification Example 1 described later, for example, even in a case where a wiring layer 23 (see, e.g., FIG. 24) is provided that straddles the plurality of guard rings 13C above the front surface S1 of the semiconductor substrate 11 (e.g., in an insulating layer 15), a potential difference, that occurs due to X-ray irradiation, at the front surface S1 of the semiconductor substrate 11 between a region where the wiring layer 23 is formed and a region where the wiring layer 23 is not formed (specifically, an electric field difference between the front surface S1 (n-type diffusion region) of the semiconductor substrate 11 and the p-type electrically-conductive region) is reduced.

The n-type electrically-conductive layer 12 is a region (n-type impurity region) including n-type impurities at a concentration of $1e^{18}$ cm$^{-3}$ to $1e^{21}$ cm$^{-3}$, for example, and is formed at an interface of the back surface S2 of the semiconductor substrate 11. For example, a power supply VDD (see FIG. 3) is coupled to the n-type electrically-conductive layer 12. In a case where, for example, holes, among carriers generated by photoelectric conversion, are read as signal charge through the anode 13A, electrons (e−) are discharged through the n-type electrically-conductive layer 12. As for a thickness, for example, the n-type electrically-conductive layer 12 is formed at a thickness of 1 m, for example, from the interface of the back surface S2 of the semiconductor substrate 11, for example, in a case where the pitch of the unit pixel P is 10 μm or more and 100 μm or less, depending on the configuration of the unit pixel P.

Figure 3:
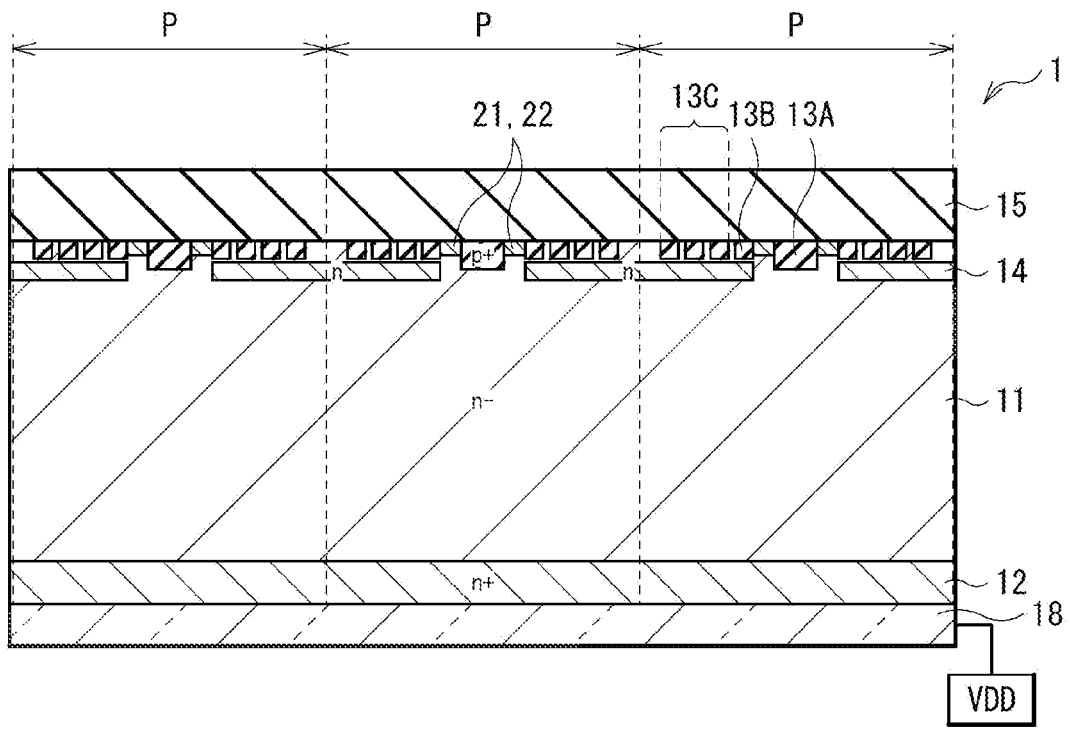
FIG. 3 is a schematic view of an example of coupling of a power supply to an n-type electrically-conductive region in the light-receiving element illustrated in FIG. 1.
Figure 4:
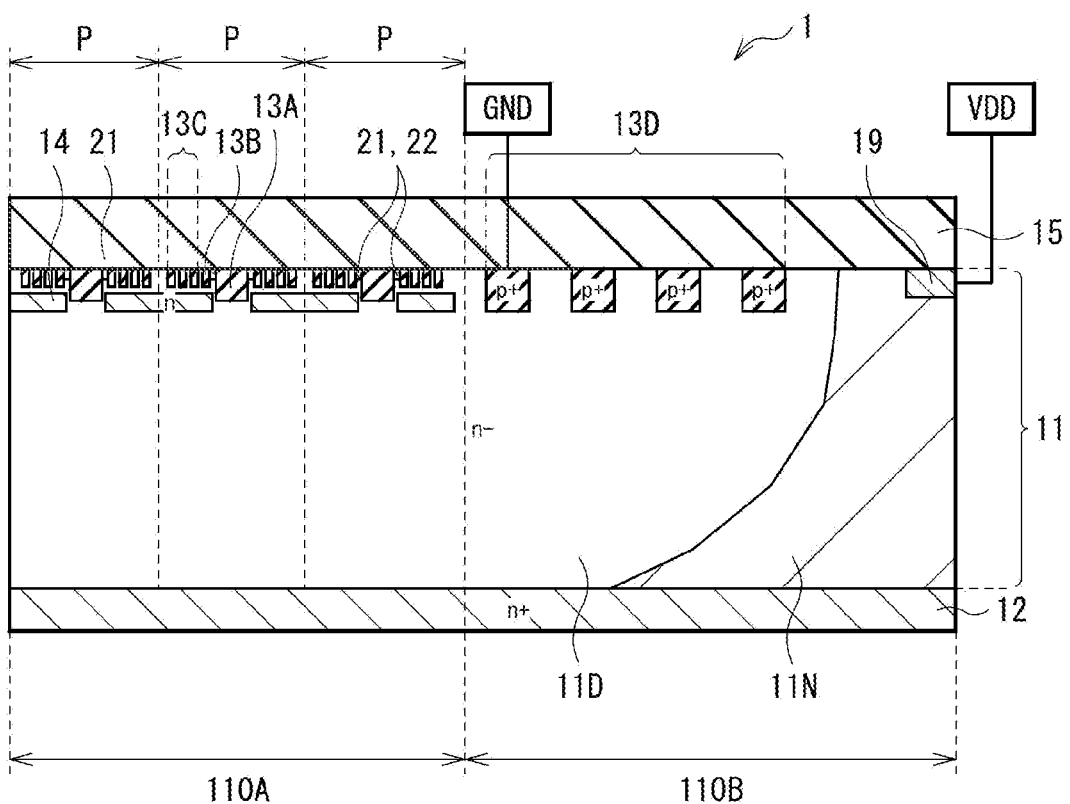
FIG. 4 is a schematic view of another example of the coupling of the power supply to the n-type electrically-conductive region in the light-receiving element illustrated in FIG. 1.

FIGS. 3 and 4 each illustrate an example of a method of coupling a power supply to the n-type electrically-conductive layer 12. FIG. 3 illustrates an example in which a transparent electrode 18 is formed on the n-type electrically-conductive layer 12, and the power supply VDD is coupled to the transparent electrode 18 to apply a voltage from the side of the back surface S2 of the semiconductor substrate 11. FIG. 4 illustrates an example in which, in a peripheral region 110B around a pixel region 110A where a plurality of unit pixels P are arranged in matrix, for example, a neutral region 11N is formed outside a depletion region 11D formed in the semiconductor substrate 11, through which a voltage is applied via an n-type electrically-conductive region 19 provided at the interface of the front surface S1 of the semiconductor substrate 11. It is to be noted that, in this case, as illustrated in FIG. 4, it is preferable to form, at the interface of the front surface S1 of the semiconductor substrate 11 in the peripheral region 110B, a plurality of high-voltage guard rings 13D between the unit pixel P formed in the pixel region 110A and the n-type electrically-conductive region 19. Among the plurality of high-voltage guard rings 13D, a high-voltage guard ring arranged closest to the pixel region 110A is preferably coupled to a ground GND.

The embedded layer 14 is provided to prevent holes (signal charge), among carriers generated in the semiconductor substrate 11 by photoelectric conversion, from being transferred to the drain 13B or the guard ring 13C. The embedded layer 14 is an n-type electrically-conductive region including n-type impurities of higher concentration than those of the n-type semiconductor substrate 11 at a concentration of $1e^{14}$ cm$^{-3}$ to $1e^{17}$ cm$^{-3}$, for example, and embedded inside the semiconductor substrate 11, specifically, near the p-type electrically-conductive region 13. More particularly, the embedded layer 14 is provided in a region corresponding to the drain 13B and the guard ring 13C, of the p-type electrically-conductive region 13, and has an opening in a region facing the anode 13A. This allows signal charge generated in the semiconductor substrate 11 to be efficiently read from the anode 13A. It is to be noted that the embedded layer 14 is formed not to be in direct contact with the drain 13B and the guard ring 13C. A thickness of the embedded layer 14 is, for example, 0.100 μm or more and 10 μm or less, although it varies depending on the magnitude of an applied reverse bias voltage to be applied between the front surface S1 and the back surface S2 of the semiconductor substrate 11.

The insulating layer 15 is formed on the front surface S1 of the semiconductor substrate 11. The insulating layer 15 is formed using an inorganic insulating material. Examples of the inorganic insulating material include silicon oxide ($SiO_2$), silicon nitride (SiN), aluminum oxide ($Al_2O_3$), and hafnium oxide ($HfO_2$). The insulating layer 15 is formed to include at least one of these materials.

The n-type electrically-conductive region 21 is a region including n-type impurities, and is provided at the interface of the front surface S1 of the semiconductor substrate 11 between anode 13A and the drain 13B, as described above. The impurity concentration of the n-type electrically-conductive region 21 is, for example, a concentration of about $1e^{16}$ cm$^{-3}$ to $1e^{19}$ cm$^{-3}$. As for a thickness, for example, the n-type electrically-conductive region 21 is formed at a thickness of 0.1 μm or more and 3 μm or less, for example, from the interface of the front surface S1 of the semiconductor substrate 11, for example, in a case where the pitch of the unit pixel P is 10 μm or more and 100 μm or less, depending on the configuration of the unit pixel P.

The LDA 22 is a region including p-type impurities (p-type impurity region), and is provided at the interface of the front surface S1 of the semiconductor substrate 11 between the anode 13A and the n-type electrically-conductive region 21 and between the drain 13B and the n-type electrically-conductive region 21, for example, as illustrated in FIGS. 1 and 2. The impurity concentration of the LDA 22 is lower than the impurity concentration of the p-type electrically-conductive region 13 forming the anode 13A, the drain 13B, and guard ring 13C, and is such a concentration as to cause depletion by fixed electric charge (holes)

generated at the interface of the insulating layer 15 with the front surface S1 of the semiconductor substrate 11 due to X-ray irradiation, for example. Specifically, for example, the peak concentration is a low concentration of $1e^{17}$ cm$^{-3}$ to $1e^{19}$ cm$^{-3}$, depending on an amount of X-ray irradiation. As for a thickness, for example, the LDA 22 is formed at a thickness of 0.1 μm or more and 3 μm or less, for example, from the interface of the front surface S1 of the semiconductor substrate 11, for example, in a case where the pitch of the unit pixel P is 10 μm or more and 100 μm or less, depending on the configuration of the unit pixel P.

Although not illustrated, for example, a substrate in which the above-described electrodes 16 and 17, a logic circuit, and the like are formed is disposed on the insulating layer 15.

Figure 5A:
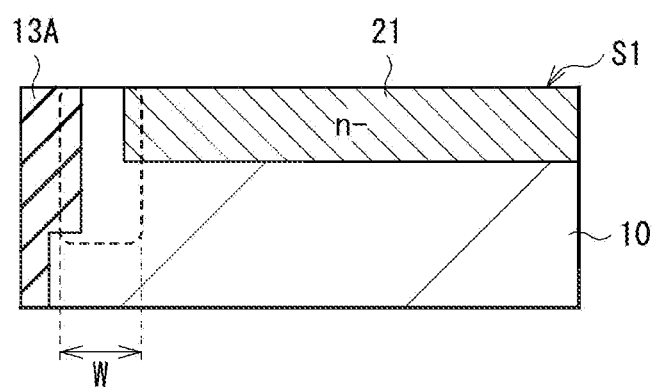
FIG. 5A is an explanatory diagram of a mode before or after X-ray irradiation in a case where an n-type electrically-conductive region is provided around an anode as a comparative example.
Figure 5B:
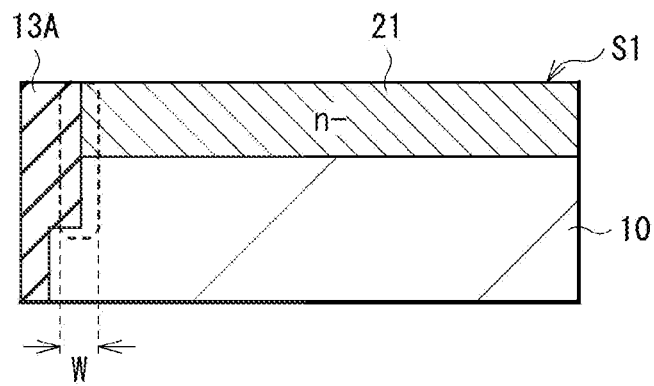
FIG. 5B is an explanatory diagram of a mode before or after the X-ray irradiation in a case where the n-type electrically-conductive region is provided around the anode as a comparative example.

FIGS. 5A and 5B schematically illustrate modes of the interface of the front surface S1 of the semiconductor substrate 11 before X-ray irradiation (FIG. 5A) and after the X-ray irradiation (FIG. 5B) in a case where only the n-type electrically-conductive region 21 is provided around the anode 13A. As described above, X-ray irradiation causes generation of fixed electric charge (holes) at the interface of the insulating layer 15 with the front surface S1 of the semiconductor substrate 11. The interface of the front surface S1 of the semiconductor substrate 11 is induced by the positive fixed electric charge to be brought into an n-type. This causes a width W of a depletion layer to be reduced and a p-n junction to be steep. At that time, the capacity is increased to 1.5 times or more, for example, partly because of a large area of the p-n junction.

Figure 6A:
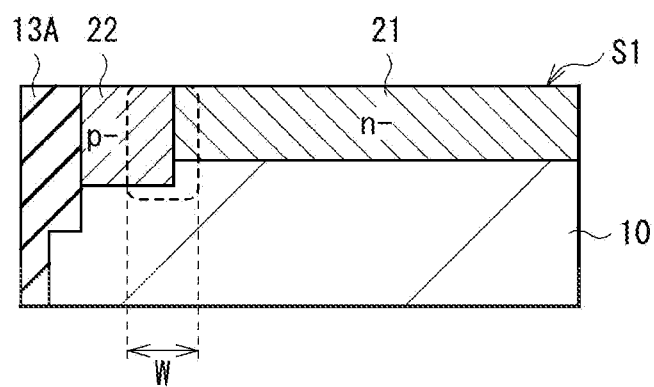
FIG. 6A is an explanatory diagram of a mode before or after X-ray irradiation in a case where an LDA is provided between an anode and the n-type electrically-conductive region of the light-receiving element illustrated in FIG. 1.
Figure 6B:
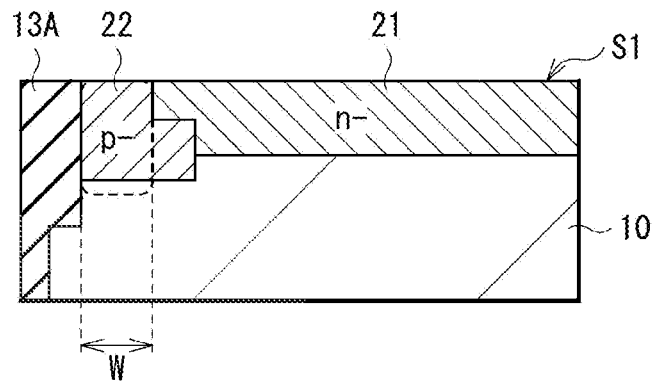
FIG. 6B is an explanatory diagram of a mode before or after the X-ray irradiation in a case where the LDA is provided between the anode and the n-type electrically-conductive region of the light-receiving element illustrated in FIG. 1.

FIGS. 6A and 6B schematically illustrate modes of the interface of the front surface S1 of the semiconductor substrate 11 before X-ray irradiation (FIG. 6A) and after the X-ray irradiation (FIG. 6B) in a case where the LDA 22 is provided between the anode 13A and the n-type electrically-conductive region 21. In a case where the LDA 22 is provided between the anode 13A and the n-type electrically-conductive region 21 as in the present embodiment, the area of the p-n junction is reduced, and the LDA 22 is depleted resulting from being brought into an n-type due to X-ray irradiation, thus suppressing a reduction in the width W of the depletion layer. It is therefore possible to suppress a fluctuation (increase) in the capacity before and after the X-ray irradiation.

1-2. Method of Manufacturing Light-Receiving Element

The light-receiving element 1 can be produced, for example, as follows. First, the n-type electrically-conductive layer 12 is formed on the back surface S2 of the semiconductor substrate 11 using an ion implantation technique. Subsequently, a mask is formed on a predetermined region of the front surface S1 of the semiconductor substrate 11, and then n-type impurities (e.g., phosphorus (P)) are doped using an ion implantation technique to form an n-type electrically-conductive layer (embedded layer 14). Next, a mask is formed on a predetermined region of the front surface S1 of the semiconductor substrate 11, and then p-type impurities (e.g., boron (B)) are doped using an ion implantation technique to form p-type electrically-conductive regions 13 (anode 13A, drain 13B, and guard ring 13C). Likewise, a mask is subsequently formed on a predetermined region of the front surface S1 of the semiconductor substrate 11, and then n-type impurities (e.g., phosphorus (P)) or p-type impurities (e.g., boron (B)) are doped using an ion implantation technique to form the n-type electrically-conductive region 21 and the LDA 22 in sequence. Next, the insulating layer 15 is formed, as a film, on the front surface S1 of the semiconductor substrate 11 using a CVD (Chemical Vapor Deposition) method, for example. This completes the light-receiving element 1 illustrated in FIG. 1.

1-3. Workings and Effects

In the light-receiving element 1 of the present embodiment, the n-type electrically-conductive region 21 is provided between the anode 13A and the drain 13B provided at the interface of the front surface S1 of the semiconductor substrate 11, and the LDA 22 is provided between the anode 13A and the n-type electrically-conductive region 21. This prevents an increase in the capacity resulting from the interface of the front surface S1 of the semiconductor substrate 11 being brought into the n-type after X-ray irradiation. This is described below.

As described above, solid-state imaging devices are used in various applications including, for example, an imaging device such as a digital still camera or a video camera, an electronic apparatus such as a mobile terminal apparatus having an imaging function, or an electromagnetic wave sensor that detects various wavelengths other than that of visible light. In these solid-state imaging devices, a CMOS image sensor has been widely used that reads signal charge accumulated in a photodiode, as a photoelectric conversion element, via a MOS transistor.

A unit pixel of the CMOS image sensor includes, in a semiconductor substrate, for example, a photodiode (PD) including an HAD (Hole Accumulated Diode) structure and a floating diffusion region (FD) disposed at a position across the photodiode with a transfer gate interposed therebetween. In addition thereto, the unit pixel includes, for example, a reset transistor, a select transistor, and an amplifier transistor.

In addition, examples of another form of the unit pixel of the CMOS image sensor include a structure in which the photoelectric conversion region and the FD are integrated in a semiconductor substrate without including the HAD. In addition to being simple and easy to be manufactured, this structure is able to add any potential difference to a p-n junction that forms the photoelectric conversion region. Therefore, it is easy to increase the thickness of the photoelectric conversion region, and thus the structure has often been used, by taking advantage thereof, in a sensor for scientific use that requires high sensitivity measurement.

Incidentally, it is required, in a radiation imaging element and an electromagnetic wave detector, to reduce an influence of a total dose effect due to X-ray irradiation. The total dose effect refers to a phenomenon in which degradation occurs in a material due to accumulation of all incident radioactive rays; when large amounts of radioactive rays such as X-rays are incident on a semiconductor element, electron-hole pairs are generated in an oxide film by an ionization action. Although depending on an electric field in an oxide film, for example, holes, among electron-hole pairs, serve as fixed electric charge, and electrons break an Si-H bond at the interface of the front surface S1 of the semiconductor substrate 11, thus increasing an interface state. This degrades various characteristics of the semiconductor element.

In contrast, in the present embodiment, the n-type electrically-conductive region 21 is provided on the front surface S1 of the semiconductor substrate 11 between the anode 13A and the drain 13B, and the LDA 22 including a p-type electrically-conductive region is provided between the anode 13A and the n-type electrically-conductive region 21. This reduces the influence resulting from the interface of the front surface S1 of the semiconductor substrate 11 being brought into the n-type caused by the generation of fixed electric charge (holes) at the interface of the insulating layer 15 with the front surface S1 of the semiconductor substrate 11 due to X-ray irradiation.

As described above, it is possible, in the light-receiving element 1 of the present embodiment, to reduce the influence of the total dose effect by X-ray irradiation.

In addition, in the light-receiving element 1 of the present embodiment, the LDA 22 has such an impurity concentration as to cause depletion resulting from the interface of the front surface S1 of the semiconductor substrate 11 being brought into the n-type due to X-ray irradiation. This reduces an area of the p-n junction with the n-type electrically-conductive region 21, and suppresses a reduction in the width of the depletion layer, as compared with a case where the LDA 22 is not provided (see, e.g., FIG. 5B). It is therefore possible to suppress a fluctuation (increase) in the capacity before or after the X-ray irradiation, and thus to suppress a decrease in conversion efficiency.

Next, descriptions are given of Modification Examples 1 to 17 and an application example of the present disclosure. Hereinafter, components similar to those of the foregoing embodiment are denoted by the same reference numerals, and descriptions thereof are omitted as appropriate.

2. Modification Examples

2-1. Modification Example 1

Figure 7:
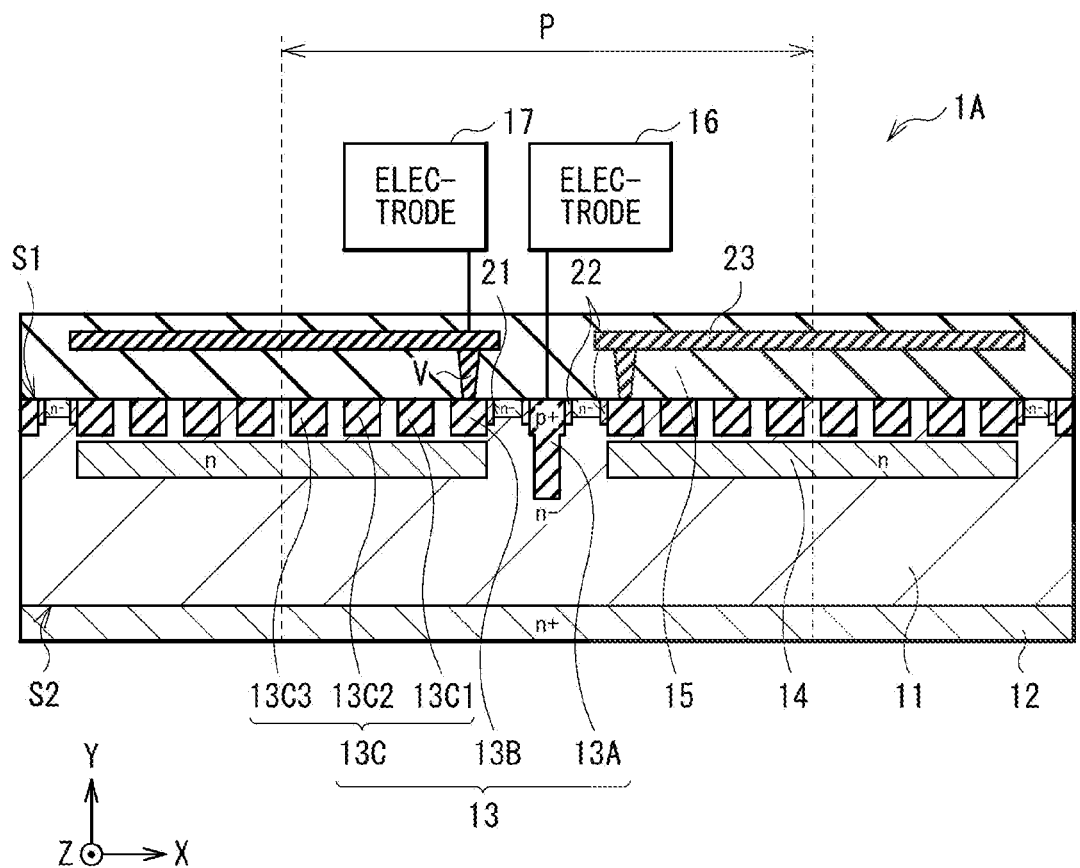
FIG. 7 is a schematic cross-sectional view of an example of a configuration of a light-receiving element according to Modification Example 1 of a the present disclosure.

FIG. 7 schematically illustrates an example of a cross-sectional configuration of a light-receiving element (a light-receiving element 1A) according to Modification Example 1 of the present disclosure. In the same manner as the foregoing embodiment, the light-receiving element 1A includes, for example, a PIN type photodiode that applies a reverse bias between a front surface and a back surface of the semiconductor substrate 11. For example, the light-receiving element 1A constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.).

Figure 24:
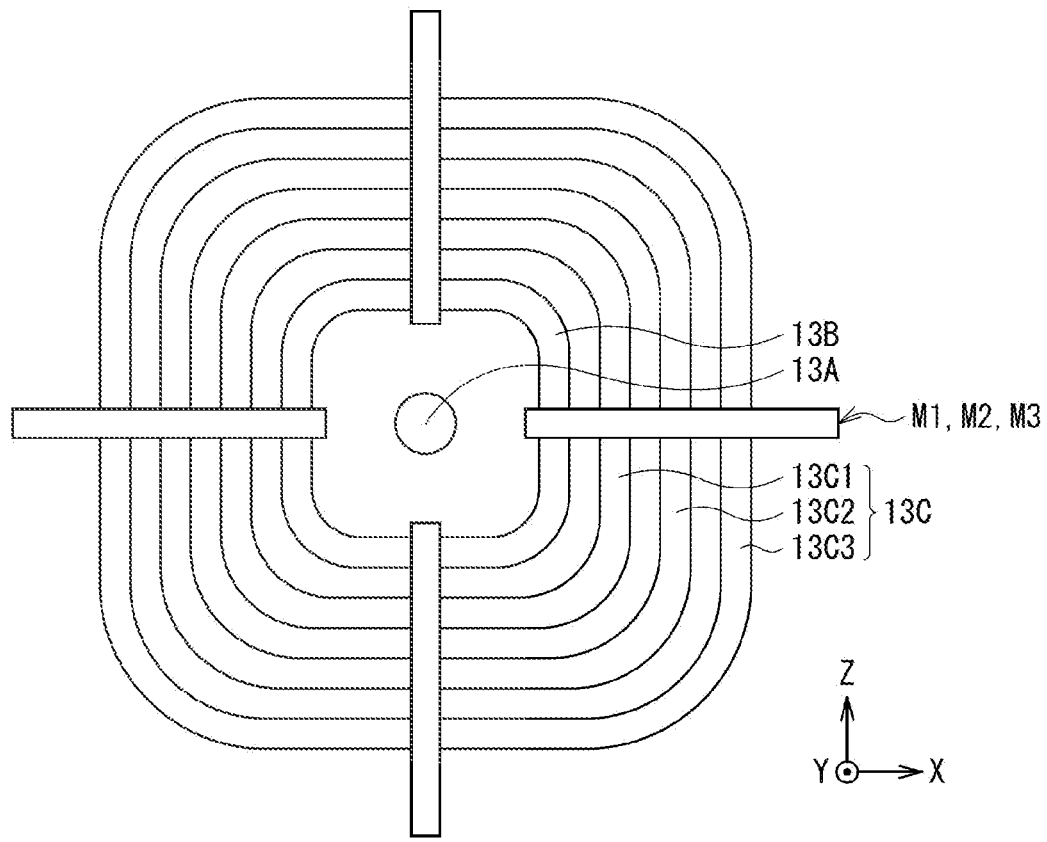
FIG. 24 is a schematic plan view of an example of a wiring layout of the light-receiving element illustrated in FIG. 23.

For example, as illustrated in FIG. 24, in a case where the wiring layer 23 electrically coupled to the drain 13B and straddling the plurality of guard rings 13C is provided in the insulating layer 15, the insulating layer 15 between the front surface S1 of the semiconductor substrate 11 and the wiring layer 23 is preferably a monolayer film including silicon oxide. Alternatively, in a case where silicon nitride is used as a constituent material of the insulating layer 15, the silicon nitride film is preferably formed at a position distant from the front surface S1 of the semiconductor substrate 11 by 30 nm or more. In other words, in a case where the insulating layer 15 is a stacked film of a silicon oxide film and a silicon nitride film, it is preferable to stack a silicon oxide film having a thickness of 30 nm or more from the front surface S1 of the semiconductor substrate 11 and a silicon nitride film in this order.

In a typical CMOS technique, a film, such as a silicon nitride film, allowing for a selection ratio to a silicon oxide film in dry etching is disposed, as a CS interlayer film, near a silicon substrate, and is used as an etching stopper film in CS etching. However, the silicon nitride film includes more fixed electric charge than the silicon oxide film; therefore, the silicon nitride film disposed near a front surface of the silicon substrate having a low impurity concentration may influence a carrier concentration in the silicon substrate in some cases. In addition, a defect may occur in which the front surface of the silicon substrate may be nitrided by a material gas upon formation of the silicon nitride film to increase an interface state, thus increasing a dark current.

In contrast, in the present modification example, the insulating layer 15 between the front surface S1 of the semiconductor substrate 11 and the wiring layer 23 formed thereabove is provided as a monolayer film including silicon oxide or a stacked film in which a silicon oxide film having a thickness of 30 nm or more from the front surface S1 of the semiconductor substrate 11 and a silicon nitride film are stacked in this order. This reduces generation of an interface state of the front surface S1 of the semiconductor substrate 11 upon X-ray irradiation. It is therefore possible to reduce a generation-recombination current, in addition to the effects of the foregoing embodiment, thus making it possible to reduce the generation of a dark current.

In addition, in a case where the silicon nitride film is disposed near the semiconductor substrate 11, electric charge of one of the electron-hole pairs ionized in the insulating layer 15, for example, by the total dose effect of an X-ray depends on an electric field in the insulating layer 15; for example, holes are accumulated in the silicon nitride film, thus resulting in the front surface of the semiconductor substrate 11 being brought into an n-type. In the present modification example, however, it is possible to further reduce the influence thereof.

Further, in the light-receiving element 1 (1A) of a direct-conversion type that depletes a silicon substrate (semiconductor substrate 11) as in the foregoing embodiment and the present modification example, a concentration of impurities included in the semiconductor substrate 11 is a very low concentration. Therefore, in a case where dispersion occurs in the amount of fixed electric charge included in the silicon nitride film due to dispersion or the like of a manufacturing process, the dispersion is likely to cause electrical conductivity of the front surface S1 of the semiconductor substrate 11 to fluctuate. The fluctuation in the electrical conductivity of the front surface S1 of the semiconductor substrate 11 causes dispersion of pixel characteristics. In contrast, in the present modification example, a silicon oxide film is provided at least near the front surface S1 of the semiconductor substrate 11, thus reducing the fluctuation in the electrical conductivity of the front surface S1 of the semiconductor substrate 11. It is therefore possible to reduce the dispersion in the pixel characteristics, in addition to the effects of the foregoing embodiment.

It is to be noted that a wiring structure formed above the front surface S1 of the semiconductor substrate 11 of the light-receiving element 1A of the present modification example can be formed, for example, as follows. First, the insulating layer 15 including silicon oxide is formed, as a film, on the front surface S1 of the semiconductor substrate 11 using a CVD method, for example. Subsequently, a resist is patterned on the insulating layer 15 using a photolithography method, and then an opening that reaches the anode 13A and the drain 13B is formed by dry etching. At that time, an etching condition is used in which an etching rate difference is taken between silicon oxide (insulating layer 15) and silicon (semiconductor substrate 11) to stop etching on the front surface of the semiconductor substrate 11. Next, the resist is removed to form a tungsten film on the insulating layer 15 and in the opening using a CVD method, for example. Thereafter, dry etching or a CMP (Chemical Mechanical Polishing) method is used to remove the tungsten film on the insulating layer 15, and then the wiring layer 23 is appropriately formed. This completes the light-receiving element 1A illustrated in FIG. 7.

2-2. Modification Example 2

Figure 8:
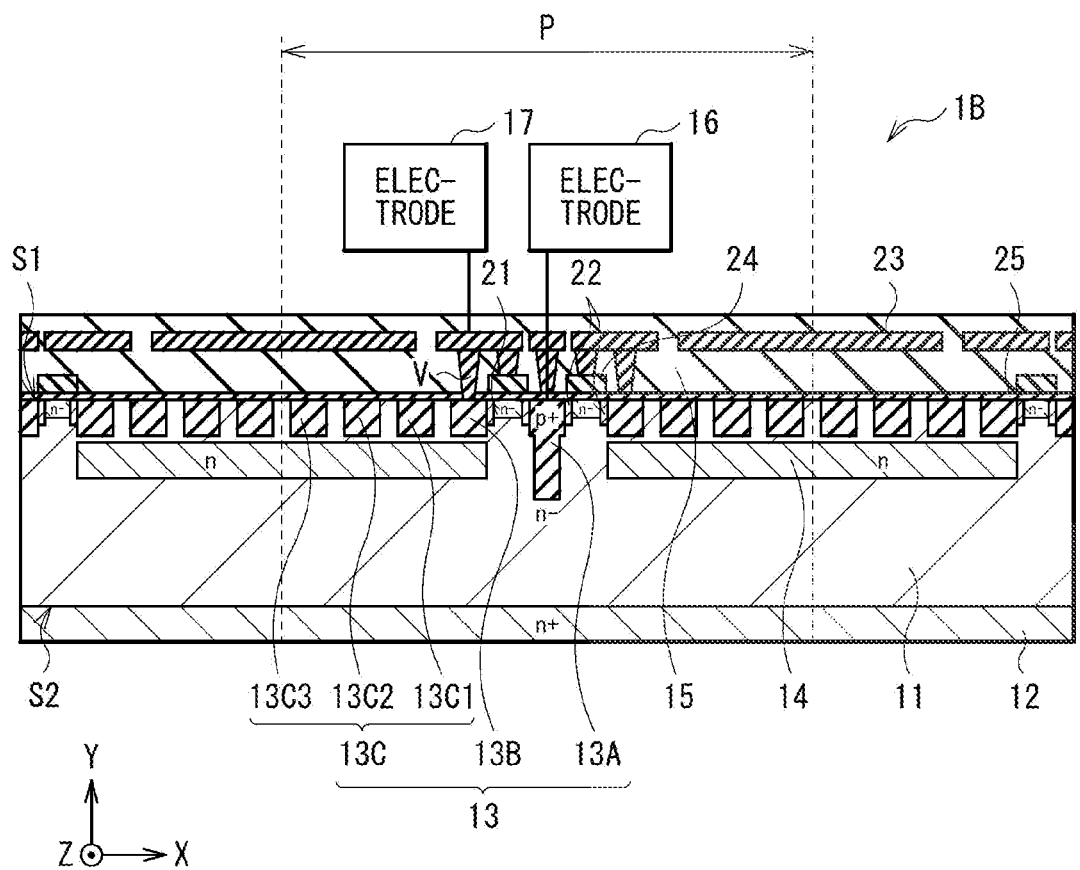
FIG. 8 is a schematic cross-sectional view of an example of a configuration of a light-receiving element according to Modification Example 2 of the present disclosure.

FIG. 8 schematically illustrates an example of a cross-sectional configuration of a light-receiving element (a light-receiving element 1B) according to Modification Example 2 of the present disclosure. In the same manner as the foregoing embodiment, the light-receiving element 1B includes, for example, a PIN type photodiode that applies a reverse bias between a front surface and a back surface of the semiconductor substrate 11. For example, the light-receiving element 1B constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1B of the present modification example, a gate electrode 24 is provided in the insulating layer 15 between the anode 13A and drain 13B, and an insulating layer (a gate insulating layer 25) between the semiconductor substrate 11 and the gate electrode 24 is formed using a high-dielectric material.

As described above, the gate electrode 24 is provided to apply an electric field to the interface of the front surface S1 of the semiconductor substrate 11 between the anode 13A and the drain 13B, for example. Specifically, the gate electrode 24 applies an electric field in a direction to distance holes, generated near the interface of the front surface S1 of the semiconductor substrate 11, away from the interface of the semiconductor substrate 11. More specifically, a minus (−) voltage with respect to a potential of the semiconductor substrate 11 is applied to the gate electrode 24, thereby applying an electric field of, for example, 0.5 MV/cm or more to the interface of the front surface S1 of the semiconductor substrate 11. In addition, the gate electrode 24 is provided to reduce the volume of the insulating layer 15 provided on the semiconductor substrate 11 between the anode 13A and the drain 13B, for example. This reduces an increase in positive fixed electric charge generated near the interface of the insulating layer 15 with the front surface S1 of the semiconductor substrate 11 due to X-ray irradiation as well as an increase in an interface state of the front surface S1 of the semiconductor substrate 11.

For example, the gate electrode 24 is provided between the anode 13A and the drain 13B via a gate insulating film 15A to surround the anode 13A in a plan view. The gate electrode 24 can be formed using, for example, polysilicon (poly-S1). The polysilicon constituting the gate electrode 24 may be an intrinsic semiconductor including no impurities or an impurity semiconductor including n-type or p-type impurities. Other than those described above, the polysilicon constituting the gate electrode 24 may include a plurality of semiconductor regions having different impurity concentrations, for example.

The gate insulating layer 25 is formed on the front surface S1 of the semiconductor substrate 11 using a high-dielectric material (High-k) having a relative permittivity higher than that of the silicon oxide constituting the insulating layer 15. As the high-dielectric material constituting the gate insulating layer 25, it is preferable to adopt a material that forms a bonded surface with a band offset smaller than a bonded interface between the semiconductor substrate 11 and the insulating layer 15 and has less interface state with the semiconductor substrate 11. Specific examples thereof include tantalum oxide ($Ta_2O_5$), hafnium oxide, aluminum oxide, and yttrium oxide ($Y_2O_3$).

In this manner, in the present modification example, the gate electrode 24 is provided via the gate insulating layer 25 at the front surface S1 of the semiconductor substrate 11 between the anode 13A and the drain 13B provided at the interface of the front surface S1 of the semiconductor substrate 11. This makes it possible to reduce an increase in positive fixed electric charge generated at the interface of the front surface S1 of the semiconductor substrate 11 upon X-ray irradiation as well as reduce the fluctuations in a capacity of the anode 13A and an electric field at the interface of the front surface S1 of the semiconductor substrate 11. In addition thereto, the generation of an interface state on the front surface S1 of the semiconductor substrate 11 is suppressed. It is therefore possible to reduce the generation of a dark current.

Further, in the present modification example, the gate insulating layer 25 is formed using a high-dielectric material, and therefore a band gap from the insulating layer 15 to the semiconductor substrate 11 becomes narrower stepwise, thus reducing an interface state density between the insulating layer 15 and the semiconductor substrate 11. It is therefore possible to further reduce the generation of a dark current.

2-3. Modification Example 3

Figure 9:
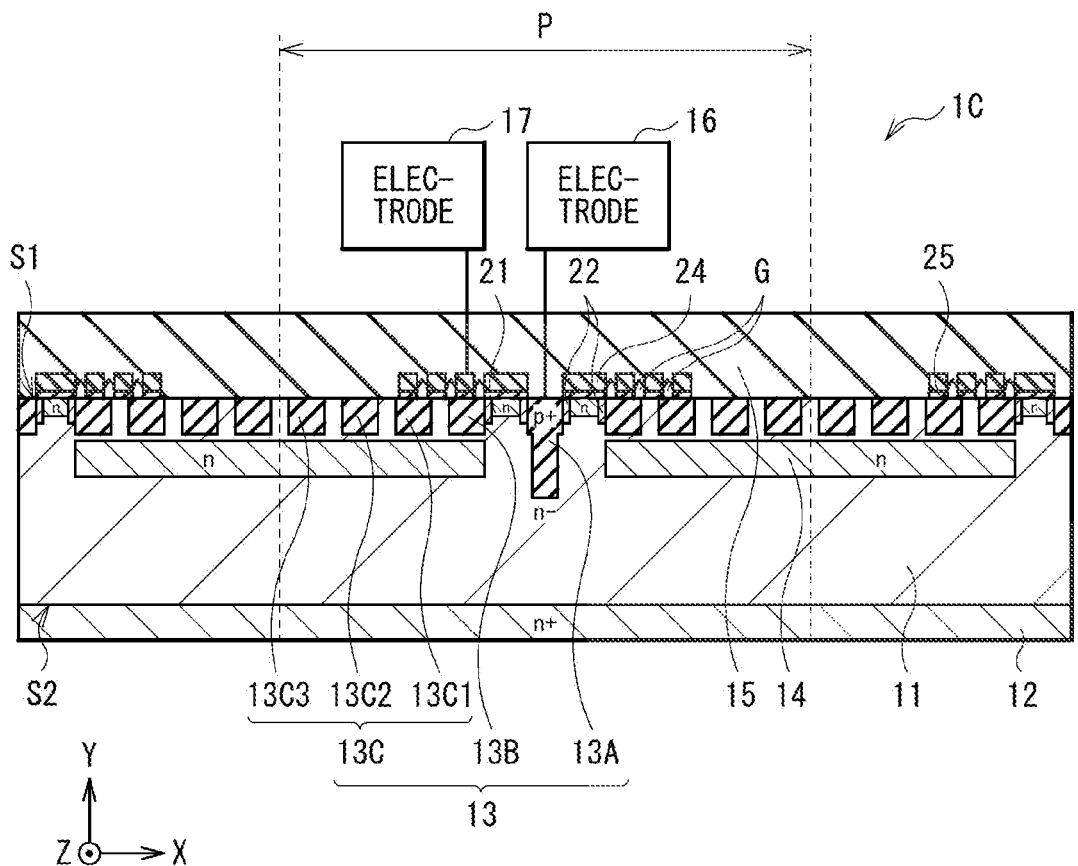
FIG. 9 is a schematic cross-sectional view of an example of a configuration of a light-receiving element according to Modification Example 3 of the present disclosure.
Figure 10:
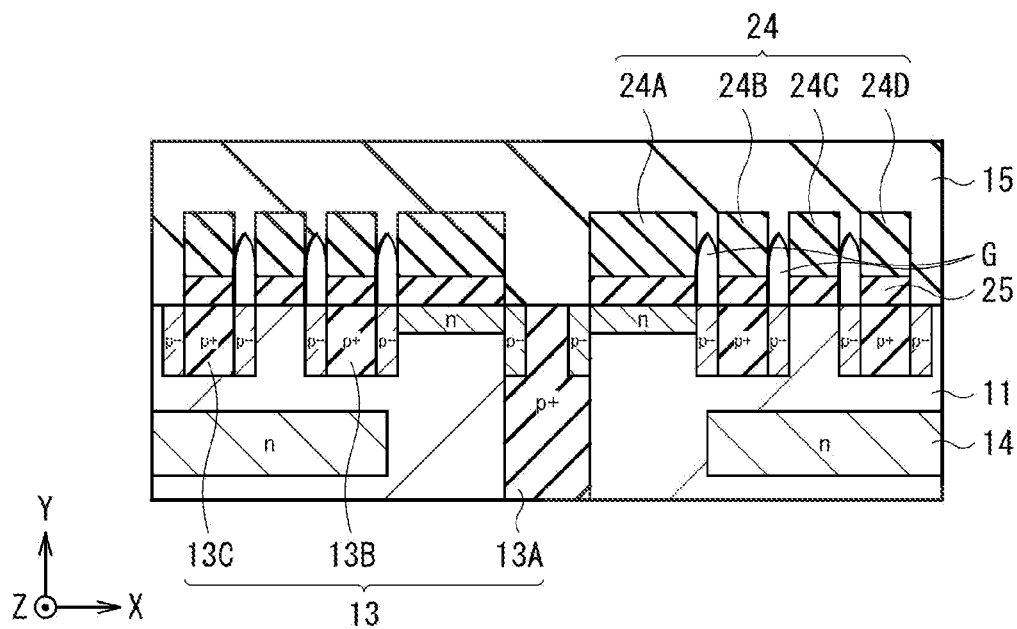
FIG. 10 is a schematic cross-sectional view of a configuration of a main part of the light-receiving element illustrated in FIG. 9.

FIG. 9 schematically illustrates an example of a cross-sectional configuration of a light-receiving element (a light-receiving element 1C) according to Modification Example 3 of the present disclosure. FIG. 10 is an enlarged view of a cross-sectional configuration of a main part of the light-receiving element 1C illustrated in FIG. 9. In the same manner as the foregoing embodiment, the light-receiving element 1C includes, for example, a PIN type photodiode that applies a reverse bias between a front surface and a back surface of the semiconductor substrate 11. For example, the light-receiving element 1C constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.).

Figure 11:
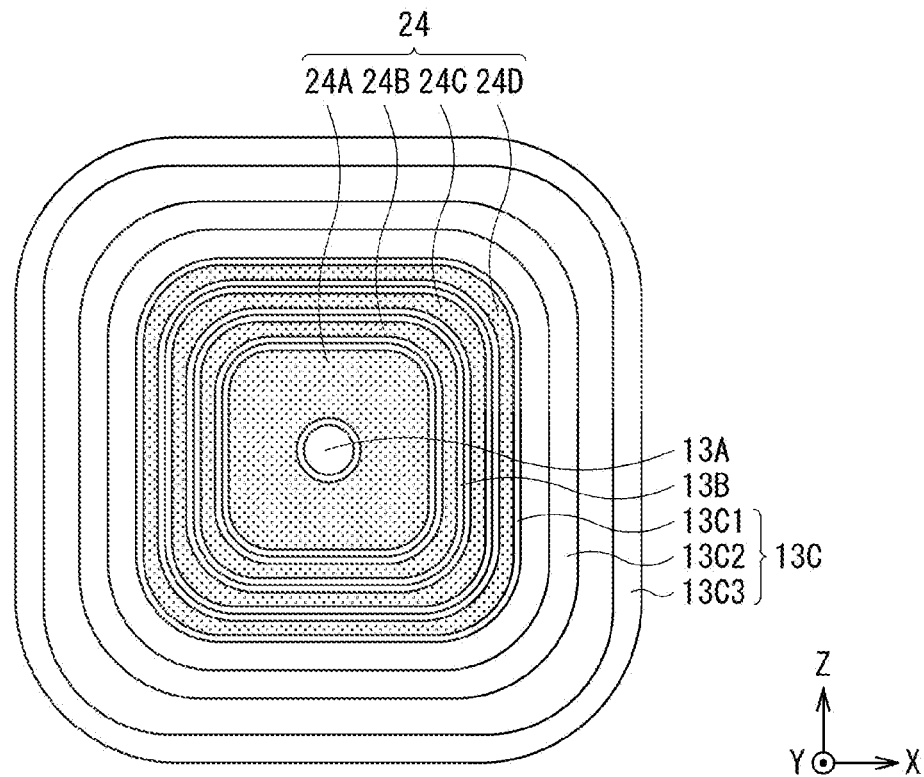
FIG. 11 is a schematic plan view of an example of a layout of a gate electrode of the light-receiving element illustrated in FIG. 9.

Modification Example 2 exemplifies the gate electrode 24 provided selectively on the semiconductor substrate 11 between the anode 13A and the drain 13B. However, as illustrated in FIG. 11, for example, the gate electrode 24 may be further formed on the drain 13B, between the drain 13B and the guard ring 13C1, and on the anode 13A. This allows for formation of a narrow gap between the gate electrodes 24 at the end of the drain 13B and at the end of the guard ring 13C1, which have high electric fields. Further, in this case, the gate insulating layers 25 may be patterned for the respective gate electrodes 24, and an air gap G may be provided between respective stacked films of the gate insulating layers 25 and gate electrodes 24.

The gate electrode 24 can be worked using, for example, a lithography method and reactive ion etching (RIE). In addition, the gate insulating layer 25 can be worked using, for example, wet etching. The air gap G between the respective stacked films of the gate insulating layers 25 and the gate electrodes 24 can be formed by setting an appropriate coverage condition and forming, as a film, the insulating layer 15 using a lithography method and a CVD method, for example.

Figure 12:
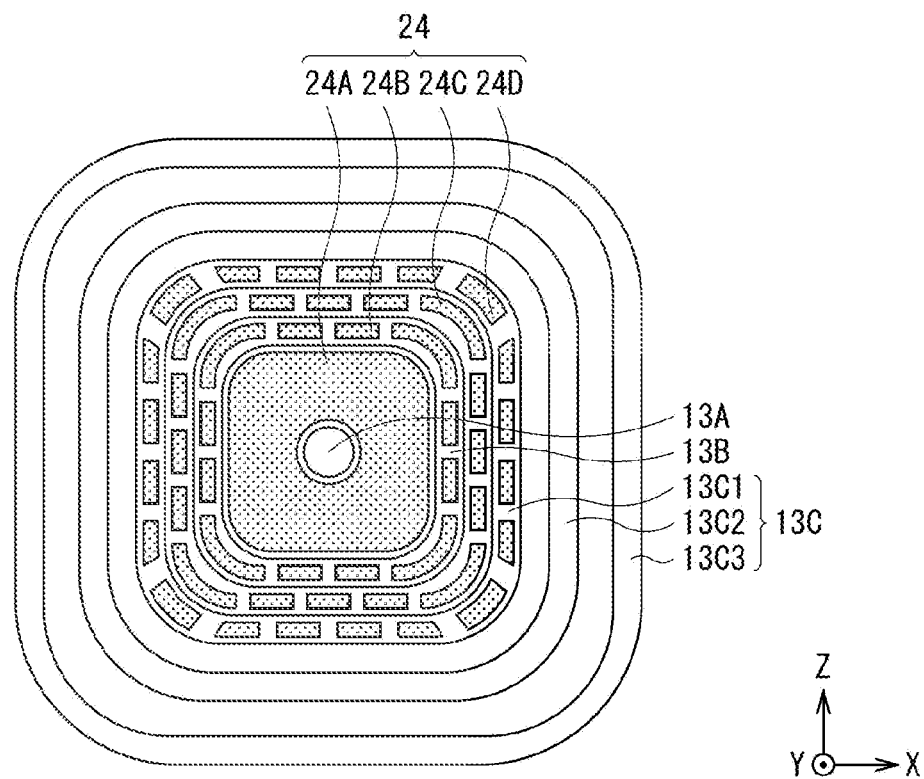
FIG. 12 is a schematic plan view of another example of the layout of the gate electrode of the light-receiving element illustrated in FIG. 9.

It is to be noted that the gate electrode 24 provided on the drain 13B, between the drain 13B and the guard ring 13C1, and on the guard ring 13C1 may be provided intermittently, for example, as illustrated in FIG. 12.

In this manner, in the present modification example, the gate electrode 24 is formed on the drain 13B, between the drain 13B and the guard ring 13C1, and on the guard ring 13C1, and the gate electrodes 24 are patterned for the respective gate insulating layers 25, with the air gap G being provided between the respective stacked films of the gate insulating layers 25 and the gate electrodes 24. In the same manner as the foregoing Modification Example 2, this reduces an increase in positive fixed electric charge generated at the interface of the front surface S1 of the semiconductor substrate 11 upon X-ray irradiation as well as reduce the fluctuations in a capacity of the anode 13A and an electric field at the interface of the front surface S1 of the semiconductor substrate 11. In addition thereto, the generation of an interface state on the front surface S1 of the semiconductor substrate 11 is suppressed. It is therefore possible to reduce the generation of a dark current.

2-4. Modification Example 4

Figure 13:
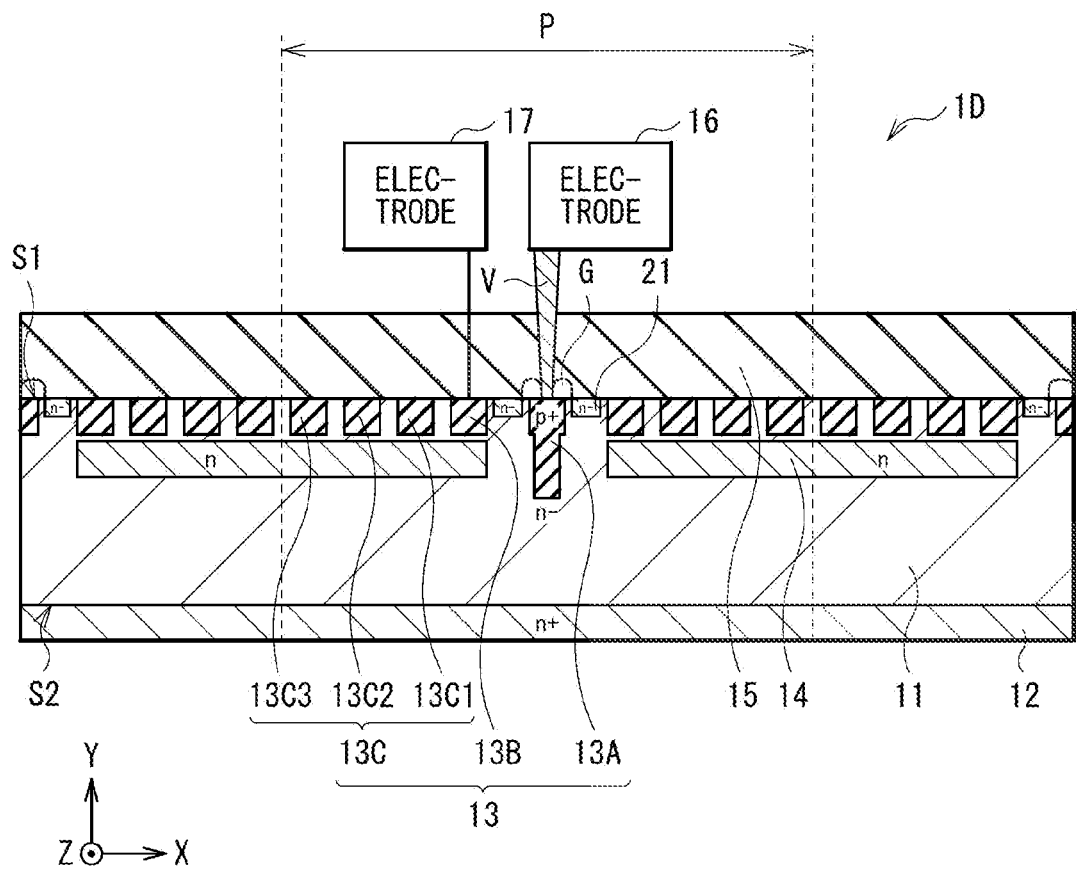
FIG. 13 is a schematic cross-sectional view of an example of a configuration of a light-receiving element according to Modification Example 4 of the present disclosure.

FIG. 13 schematically illustrates an example of a cross-sectional configuration of a light-receiving element (a light-receiving element 1D) according to Modification Example 4 of the present disclosure. In the same manner as the foregoing embodiment, the light-receiving element 1D includes, for example, a PIN type photodiode that applies a reverse bias between a front surface and a back surface of the semiconductor substrate 11. For example, the light-receiving element 1D constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1D of the present modification example, there is formed the air gap G closed by the insulating layer 15 on the front surface S1 of the semiconductor substrate 11 to cover a p-n junction region around the anode 13A.

Specifically, the air gap G is formed around a via V that electrically couples the anode 13A and the electrode 16 to each other; more particularly, the air gap G is formed on the anode 13A which is a strong electric field generating region and on the semiconductor substrate 11 between the anode 13A and the n-type electrically-conductive region 21 provided therearound.

Figure 14:
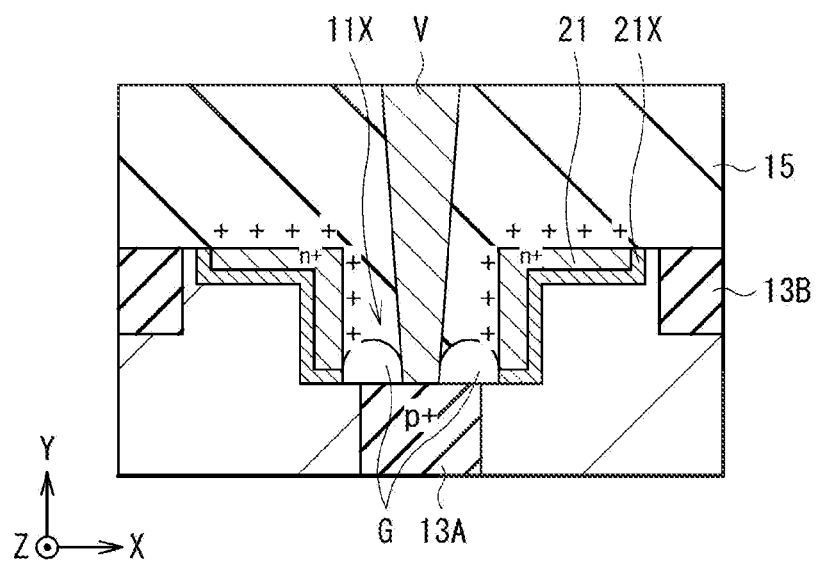
FIG. 14 is a schematic cross-sectional view of another example of a configuration of a main part of the light-receiving element illustrated in FIG. 13.

In addition, for example, as illustrated in FIG. 14, the front surface S1 of the semiconductor substrate 11 may be engraved to form a groove 11X, the anode 13A may be formed at the bottom of the groove 11X, and the air gap G may be formed in the groove 11X. This makes it possible to form the air gap G more easily than the formation of the air gap G on the front surface S1 of the semiconductor substrate 11, which is planar, as illustrated in FIG. 13.

In this manner, in the present modification example, the air gap G closed by the insulating layer 15 is provided to cover the p-n junction region around the anode 13A. This eliminates the generation of fixed electric charge on the anode 13A and its circumference at the interface of the front surface S1 of the semiconductor substrate 11, thus making it possible to prevent the interface of the front surface S1 of the semiconductor substrate 11 around the anode 13A from being brought into the n-type due to X-ray irradiation, and thus to suppress a decrease in the width of the depletion layer. This eliminates a fluctuation in the capacity, thus making it possible to prevent a decrease in conversion efficiency. In addition, the capacity of the anode 13A is reduced, thus enabling high-speed operation.

2-5. Modification Example 5

Figure 15:
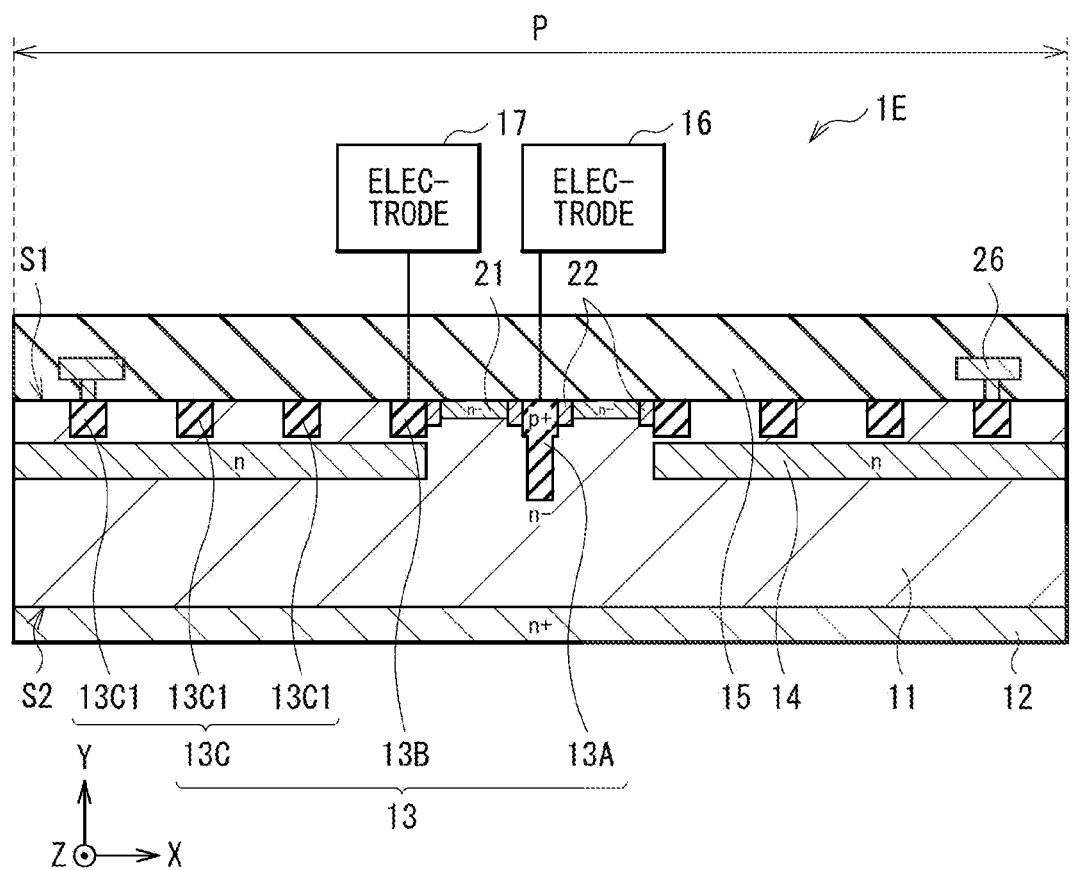
FIG. 15 is a schematic cross-sectional view of an example of a configuration of a light-receiving element according to Modification Example 5 of the present disclosure.

FIG. 15 schematically illustrates an example of a cross-sectional configuration of a light-receiving element (a light-receiving element 1E) according to Modification Example 5 of the present disclosure. In the same manner as the foregoing embodiment, the light-receiving element 1E includes, for example, a PIN type photodiode that applies a reverse bias between a front surface and a back surface of the semiconductor substrate 11. For example, the light-receiving element 1E constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1E of the present modification example, a field plate 26 in an electrically floating state is provided above the guard ring 13C.

Figure 16A:
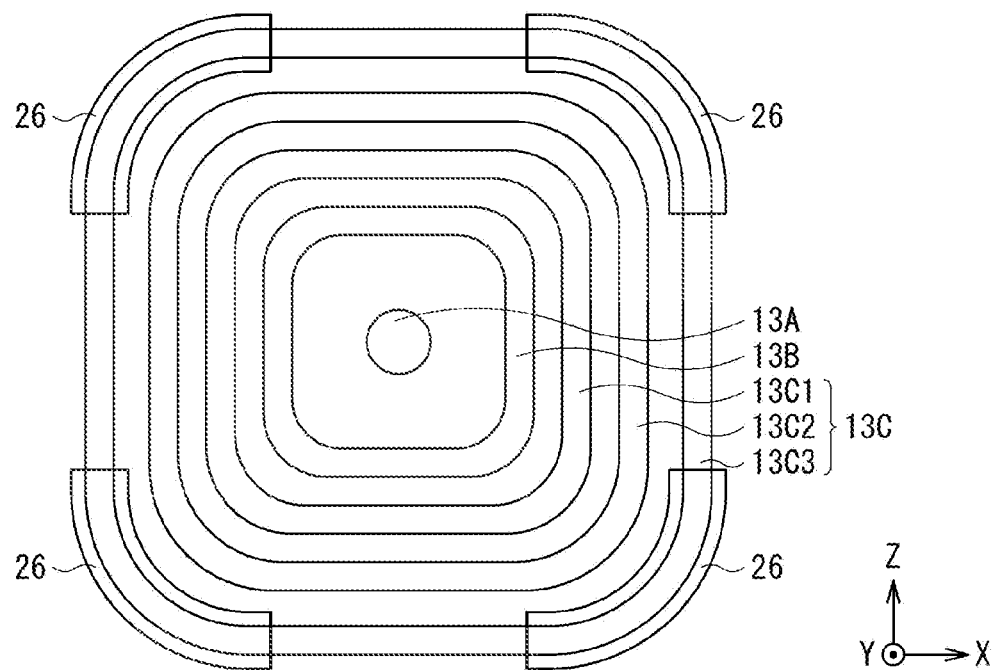
FIG. 16A is a schematic plan view of an example of a configuration of a field plate of the light-receiving element illustrated in FIG. 15.

The field plate 26 is provided above the guard ring 13C, for example, above the corner of the guard ring 13C3 provided on the outermost periphery to cover the guard ring 13C3, for example, in a width larger than the guard ring 13C3, for example, as illustrated in FIG. 16A. The field plate 26 can be formed using an electrically-conductive metal material or polysilicon. The field plate 26 is electrically coupled to the guard ring 13C3, for example, through a via V, and is in an electrically floating state, as described above. The field plate 26 and the guard ring 13C3 form an ohmic junction, for example.

When an X-ray is irradiated, a high electric field is generated not only around the anode 13A, but also at the interface of the semiconductor substrate 11 between the guard rings 13C1, 13C2, and 13C3, for example, thus generating a steep potential. In particular, in a case where there is a far distance between unit pixels adjacent to each other at the corner of the guard ring 13C3 on the outermost periphery, an electric field stronger than that of a linear part is generated, thus causing degradation in withstand voltage to easily occur.

In contrast, in the present modification example, the field plate 26 covering the guard ring 13C3 is provided above the guard ring 13C, in particular, above the corner of the guard ring 13C3 provided on the outermost periphery where a strong electric field easily occurs. This alleviates the concentration of the electric field at the corner, and thus to reduce an increase in the potential due to X-ray irradiation.

Figure 16B:
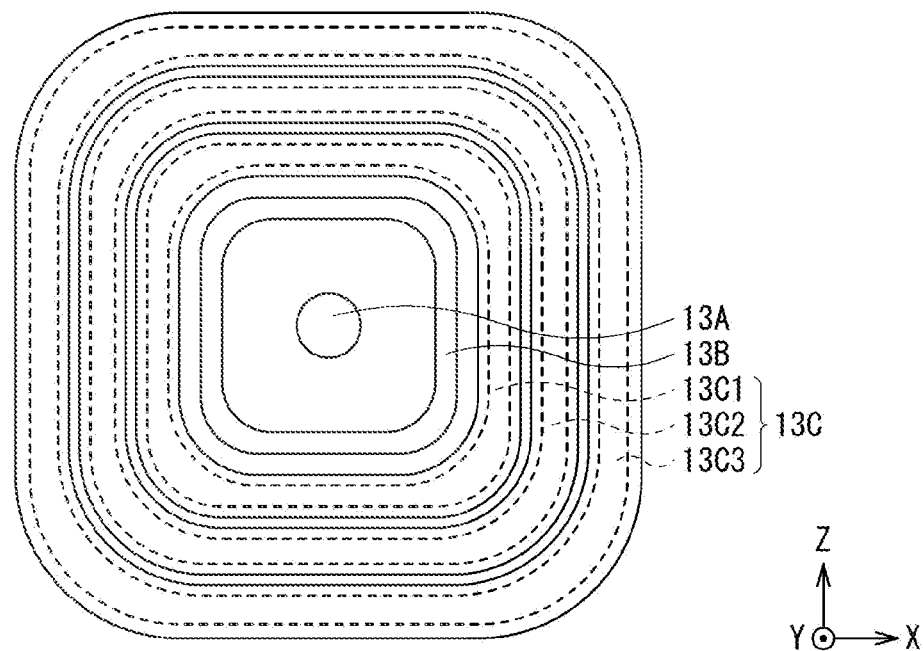
FIG. 16B is a schematic plan view of another example of the configuration of the light-receiving element according to Modification Example 5 of the present disclosure.
Figure 17:
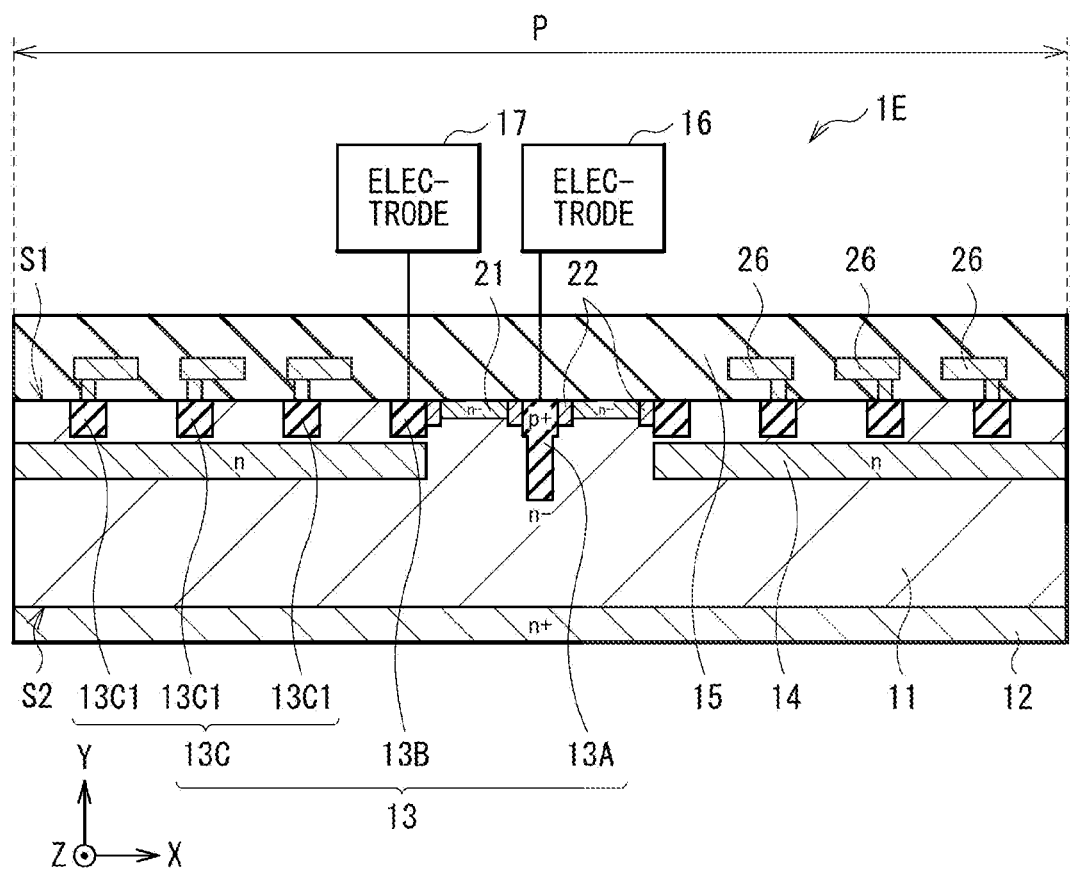
FIG. 17 is a schematic cross-sectional view of an example of a configuration of a field plate of the light-receiving element illustrated in FIG. 16B.

It is to be noted that the field plate 26 may be continuously formed to cover not only the corner of the guard ring 13C3 but also the entire guard ring 13C3. Further, as illustrated in FIG. 16B, the field plate 26 may be formed not only for the guard ring 13C3, but also for each of all the guard rings 13C1, 13C2, and 13C3 that constitute the guard ring 13C. At that time, it is difficult for the field plate 26 to overhang both sides of each of the guard rings 13C1, 13C2, and 13C3 due to limitation in the layout. Therefore, as illustrated in FIG. 17, the field plate 26 may overhang only one side of each of the guard rings 13C1, 13C2, and 13C3 (e.g., the inside (a side of the anode 13A) of the unit pixel P)). This makes it possible to reduce an increase in the potential due to X-ray irradiation on the entire guard rings 13C1, 13C2, and 13C3.

2-6. Modification Example 6

Figure 18:
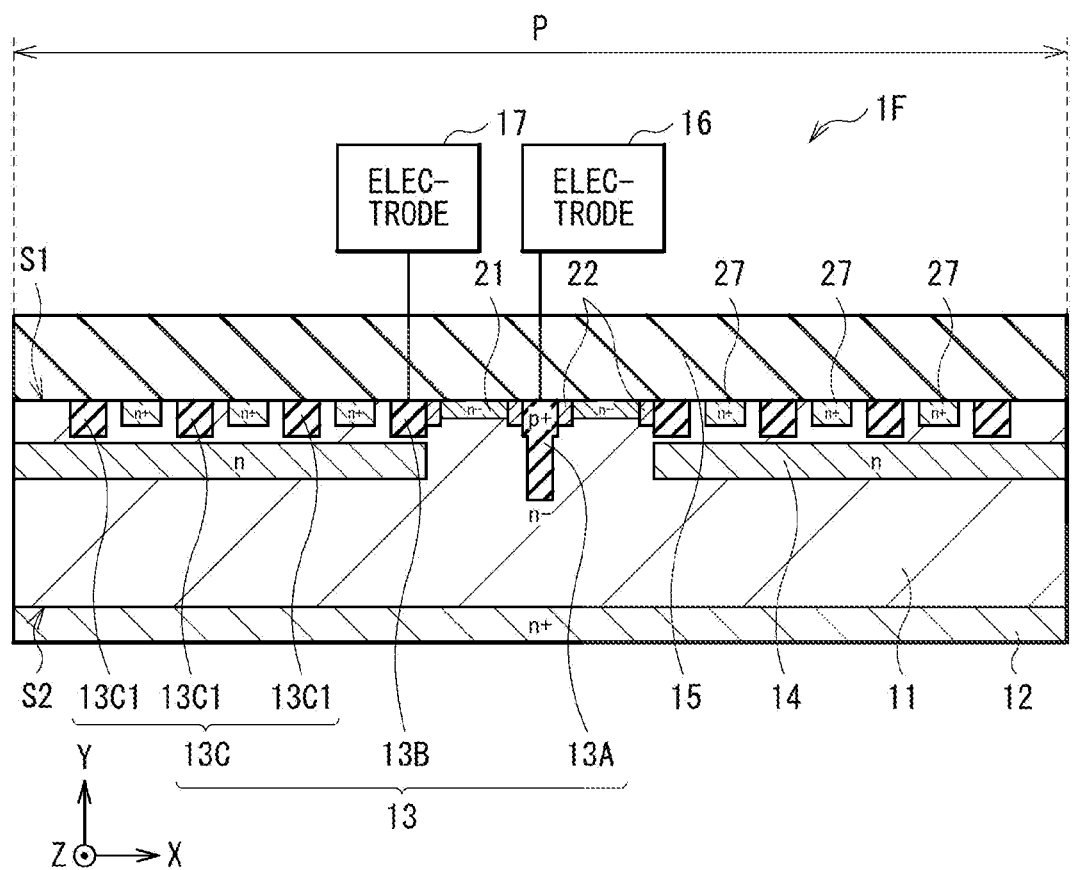
FIG. 18 is a schematic cross-sectional view of an example of a configuration of a light-receiving element according to Modification Example 6 of the present disclosure.

FIG. 18 schematically illustrates an example of a cross-sectional configuration of a light-receiving element (a light-receiving element 1F) according to Modification Example 6 of the present disclosure. In the same manner as the foregoing embodiment, the light-receiving element 1F includes, for example, a PIN type photodiode that applies a reverse bias between a front surface and a back surface of the semiconductor substrate 11. For example, the light-receiving element 1F constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1F of the present modification example, an n-type electrically-conductive region 27 is further provided near the interface of the front surface S1 of the semiconductor substrate 11 between the drain 13B and the guard ring 13C1 and between the guard rings 13C1, 13C2, and 13C3 adjacent to each other.

The n-type electrically-conductive region 27 is a region including n-type impurities, and corresponds to a specific example of a "second second electrically-conductive region" of the present disclosure. As described above, the n-type electrically-conductive region 27 is provided near the interface of the front surface S1 of the semiconductor substrate 11 between the drain 13B and the guard ring 13C1 and between the guard rings 13C1, 13C2, and 13C3 adjacent to each other. The impurity concentration of the n-type electrically-conductive region 27 is higher than the impurity concentration of the n-type electrically-conductive region constituting the embedded layer 14, and is a high concentration of about $1e^{16}$ cm$^{-3}$ to $1e^{19}$ cm$^{-3}$, for example. As for a thickness, the n-type electrically-conductive region 27 is formed at a thickness of 0.1 μm or more and 3 μm or less, for example, from the interface of the front surface S1 of the semiconductor substrate 11, for example, in a case where the pitch of the unit pixel P is 10 μm or more and 100 m or less, depending on the configuration of the unit pixel P.

In this manner, in the present modification example, the n-type electrically-conductive region 27 is provided near the interface of the front surface S1 of the semiconductor substrate 11 between the drain 13B and the guard ring 13C1 and between the guard rings 13C1, 13C2, and 13C3 adjacent to each other. This reduces a change in a current path between the drain 13B and the guard ring 13C1 and between the guard rings 13C1, 13C2, and 13C3 adjacent to each other before or after the X-ray irradiation. Therefore, the increase in the potential of each of the guard rings 13C1, 13C2, and 13C3 after the X-ray irradiation is reduced, thus making it possible to suppress an increase in a leak current due to the concentration of the electric field as well as transfer failure of electric charge due to weakened horizontal transfer electric field.

Figure 19:
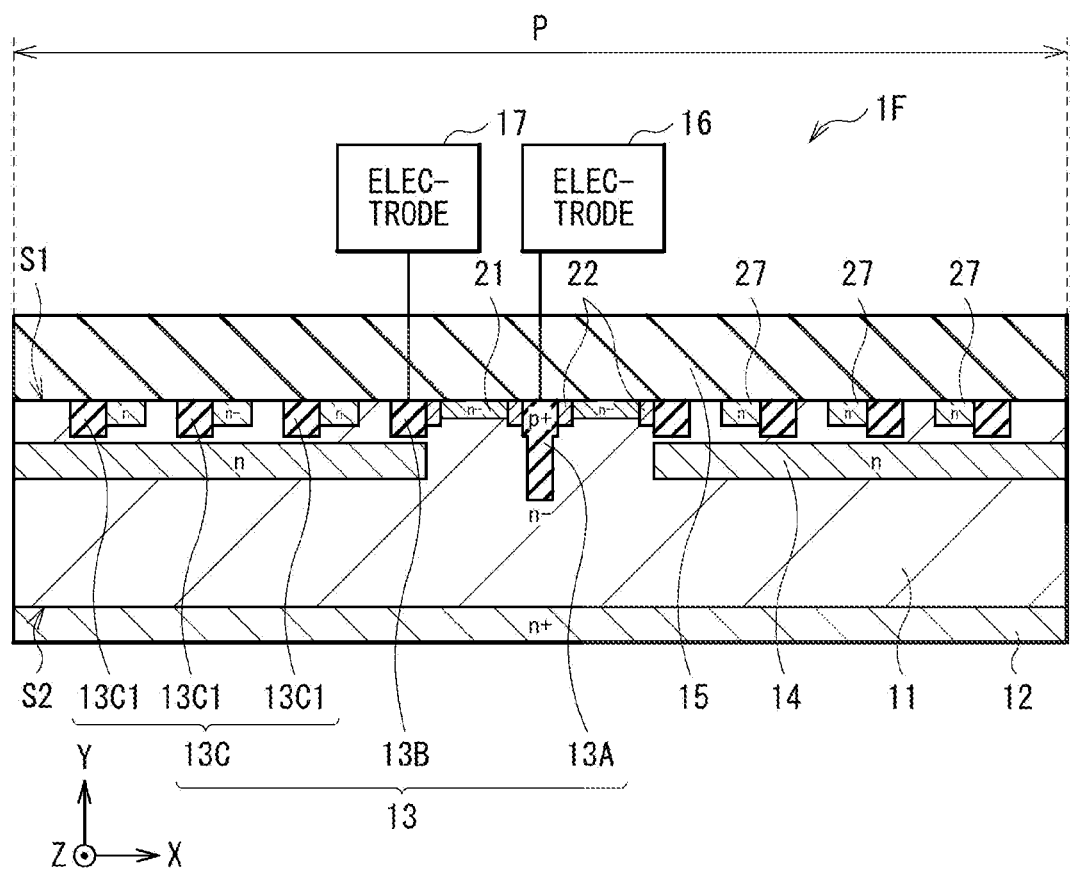
FIG. 19 is a schematic cross-sectional view of another example of the configuration of the light-receiving element according to Modification Example 6 of the present disclosure.
Figure 20:
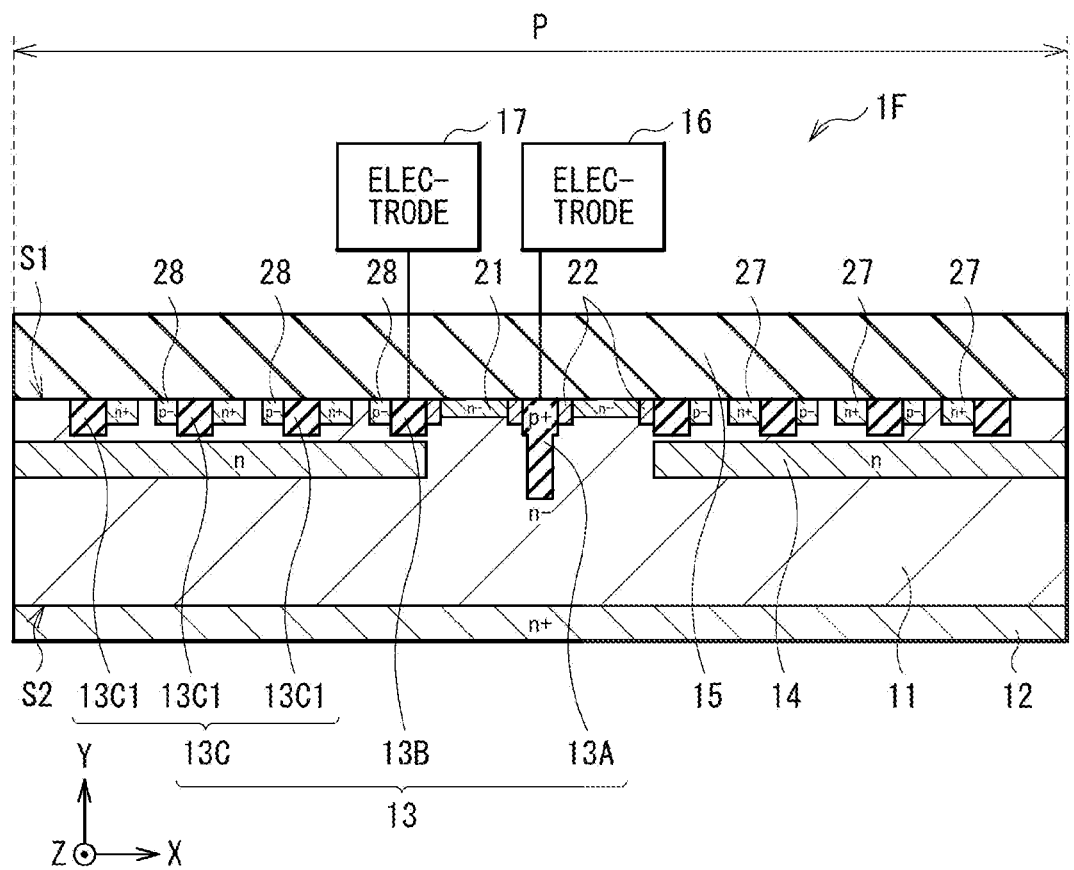
FIG. 20 is a schematic cross-sectional view of another example of the configuration of the light-receiving element according to Modification Example 6 of the present disclosure.
Figure 21:
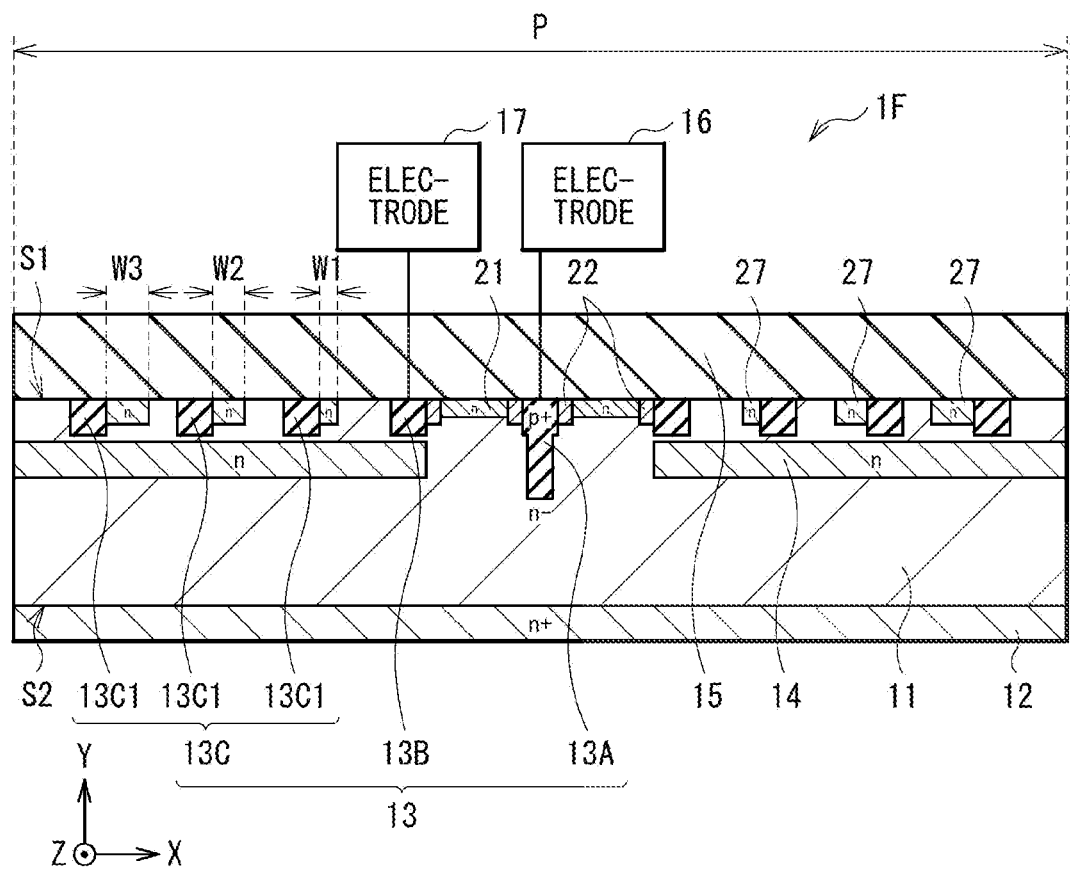
FIG. 21 is a schematic cross-sectional view of another example of the configuration of the light-receiving element according to Modification Example 6 of the present disclosure.
Figure 22:
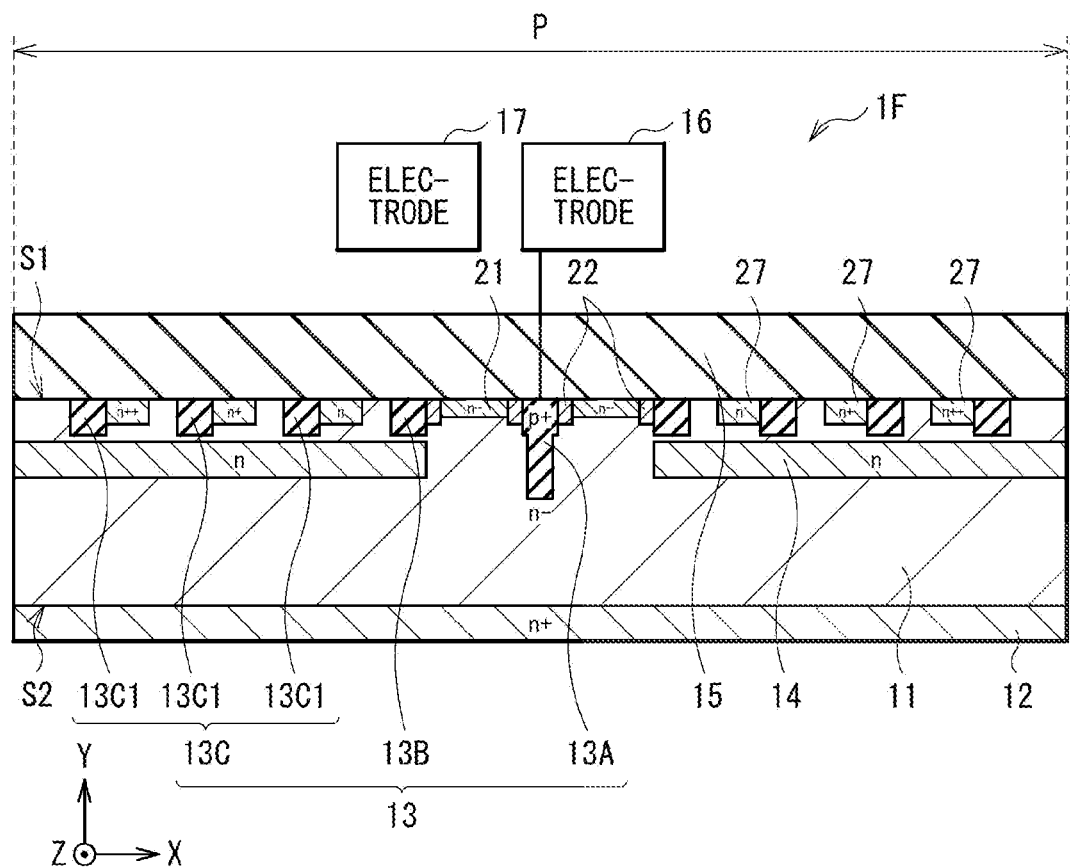
FIG. 22 is a schematic cross-sectional view of another example of the configuration of the light-receiving element according to Modification Example 6 of the present disclosure.

In addition, the n-type electrically-conductive region 27 provided near the interface of the front surface S1 of the semiconductor substrate 11 between the drain 13B and the guard ring 13C1 and between the guard rings 13C1, 13C2, and 13C3 adjacent to each other may be provided in contact with the guard rings 13C1, 13C2, and 13C3 on a side opposite thereto with respect to a side of the anode 13A, for example, as illustrated in FIG. 19. This causes a distance between the n-type electrically-conductive region 27 and each of the guard rings 13C1, 13C2, and 13C3 to be far to thereby relax the electric field, thus making it possible to obtain an effect of reducing the generation of a leak current. Further, a p-type electrically-conductive region 28 corresponding to a specific example of a "sixth first electrically-conductive region" of the present disclosure may be provided on a side surface of the drain 13B on a side of the guard ring 13C1 and on side surfaces of the guard rings 13C1, 13C2, and 13C3 on sides opposite to the sides with which the n-type electrically-conductive regions 27 are in contact, for example, as illustrated in FIG. 20. The p-type electrically-conductive region 28 has an impurity concentration of about $1e^{16}$ cm$^{-3}$ to $1e^{19}$ cm$^3$, for example, which is lower than the impurity concentration of the p-type semiconductor region forming the guard rings 13C1, 13C2, and 13C3. This relaxes the electric field of the front surface S1 of the semiconductor substrate 11 between the drain 13B and the guard ring 13C1 and between the guard rings 13C1, 13C2, and 13C3 adjacent to each other, thus making it possible to further reduce an increase in the electric field at the time when the potential of the front surface S1 of the semiconductor substrate 11 rises due to X-ray irradiation. Furthermore, widths (W1, W2, and W3) of the n-type electrically-conductive regions 27 provided between the drain 13B and the guard ring 13C1 and between the guard rings 13C1, 13C2, and 13C3 adjacent to each other may not necessarily be uniform. For example, as illustrated in FIG. 21, the n-type electrically-conductive region 27 may be gradually larger (W1<W2<W3) toward the outside of the unit pixel P. This causes the guard ring 13C located on an outer side to have an increased potential, thus making it possible to obtain an effect of facilitating transfer of signal charge in a lateral direction. In addition, impurity concentrations of the n-type electrically-conductive regions 27 provided between the drain 13B and the guard ring 13C1 and between the guard rings 13C1, 13C2, and 13C3 adjacent to each other may not necessarily be uniform. For example, as illustrated in FIG. 22, the n-type electrically-conductive region 27 may have gradually increased one toward the outside of the unit pixel P. In the same manner as described above, this causes the guard ring 13C located on an outer side to have an increased potential, thus making it possible to obtain the effect of facilitating transfer of signal charge in a lateral direction.

2-7. Modification Example 7

Figure 23:
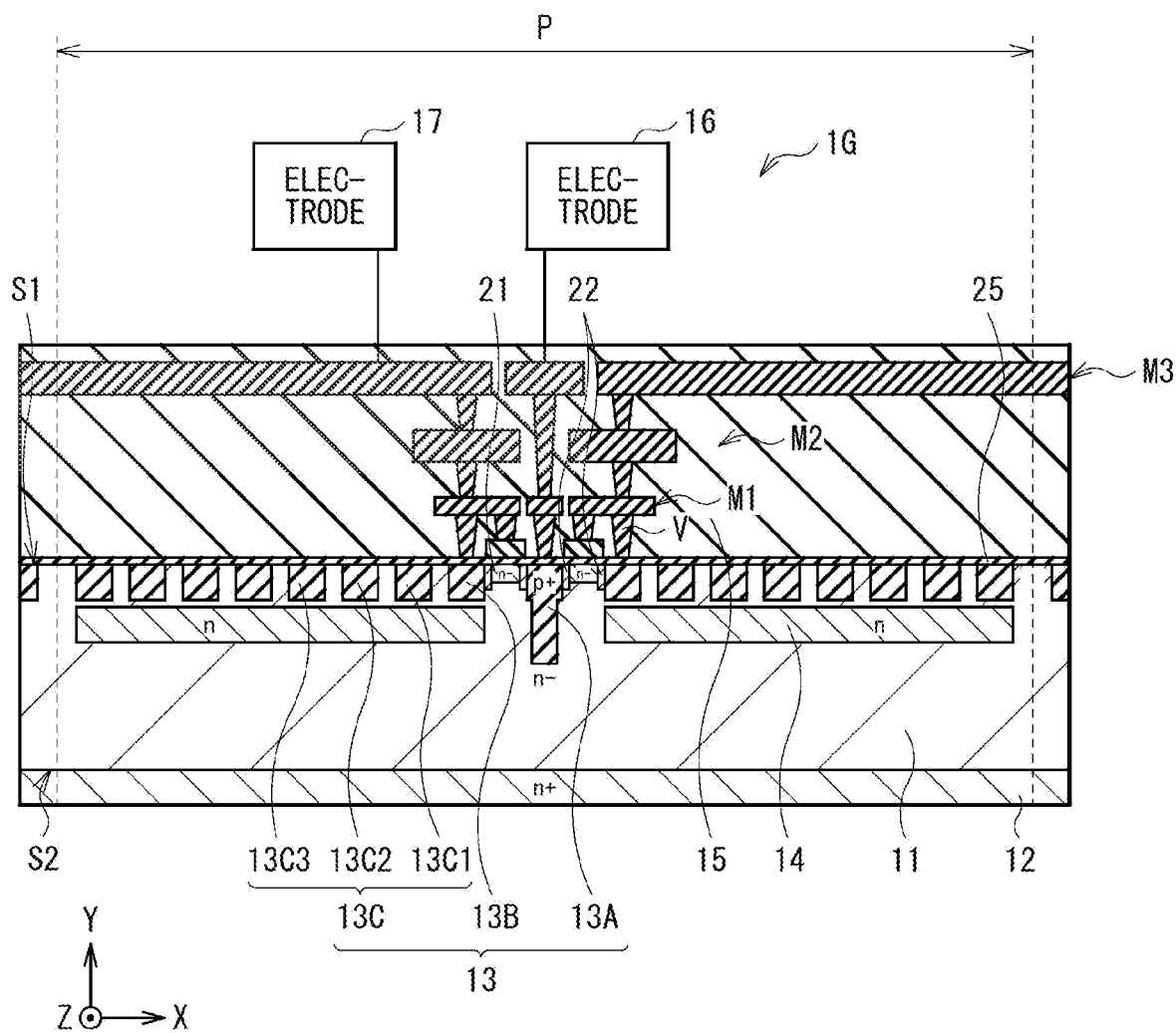
FIG. 23 is a schematic cross-sectional view of an example of a configuration of a light-receiving element according to Modification Example 7 of the present disclosure.

FIG. 23 schematically illustrates an example of a cross-sectional configuration of a light-receiving element (a light-receiving element 1G) according to Modification Example 7 of the present disclosure. In the same manner as the foregoing embodiment, the light-receiving element 1G includes, for example, a PIN type photodiode that applies a reverse bias between a front surface and a back surface of the semiconductor substrate 11. For example, the light-receiving element 1G constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1G of the present modification example, in a case where a wiring line straddling the drain 13B and the plurality of guard rings 13C is provided above the unit pixel P, for example, as illustrated in FIG. 24, the wiring line is provided in a wiring layer M2 or a subsequent layer, among wiring layers M1, M2, and M3 formed in multiple layers in the insulating layer 15 provided on the front surface S1 of the semiconductor substrate 11.

Figure 25:
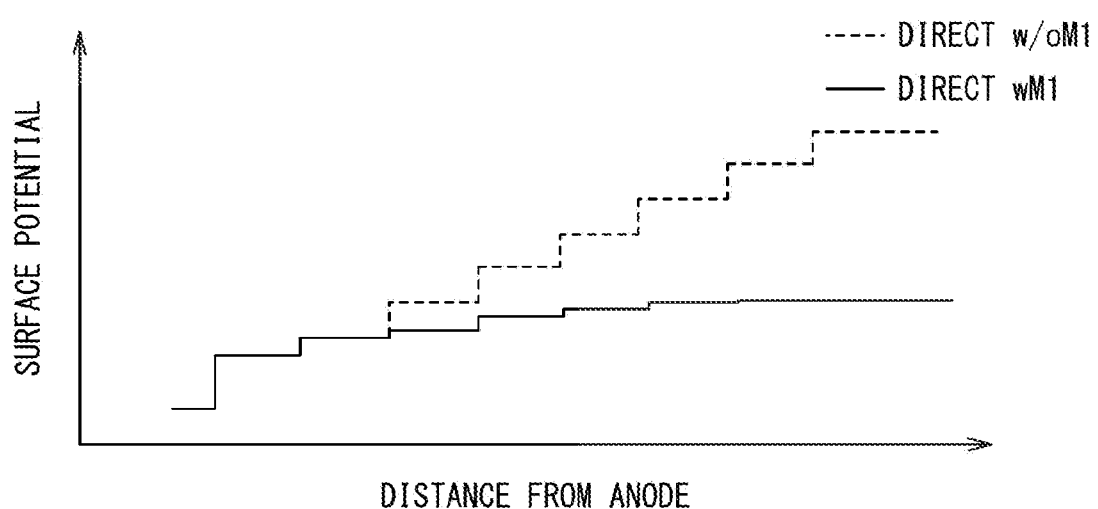
FIG. 25 is a diagram illustrating surface potentials depending on positions of the light-receiving element illustrated in FIG. 23.

As described above, when an X-ray is irradiated, a potential of the front surface S1 of the semiconductor substrate 11 rises as in direct w/o M1 illustrated in FIG. 25, for example. Meanwhile, in a case where a wiring line (e.g., a low-voltage application wiring line for the drain 13B, a GND terminal, etc.) that straddles the guard rings 13C1, 13C2, and 13C3 is formed above the front surface S1 of the semiconductor substrate 11, the potential of the front surface S1 of the semiconductor substrate 11 between the guard rings 13C1, 13C2, and 13C3 below the wiring line is suppressed as in direct wM1 illustrated in FIG. 25, for example.

In contrast, in the present modification example, the wiring line straddling the drain 13B and the plurality of guard rings 13C is provided in the wiring layer M2 or a subsequent layer, among the plurality of wiring layers M1, M2, and M3 formed in multiple layers in the insulating layer 15. For example, the wiring layer is spaced apart at least 500 nm or more from the front surface S1 of the semiconductor substrate 11. This suppresses modulation of the potential, due to X-ray irradiation, of the front surface S1 of the semiconductor substrate 11 between the guard rings 13C1, 13C2, and 13C3 above which the wiring line is formed. This makes it possible to reduce a difference in electric fields of the front surface S1 of the semiconductor substrate 11 after X-ray irradiation due to presence or absence of the wiring line, and thus to suppress degradation in withstand voltage.

2-8. Modification Example 8

Figure 26:
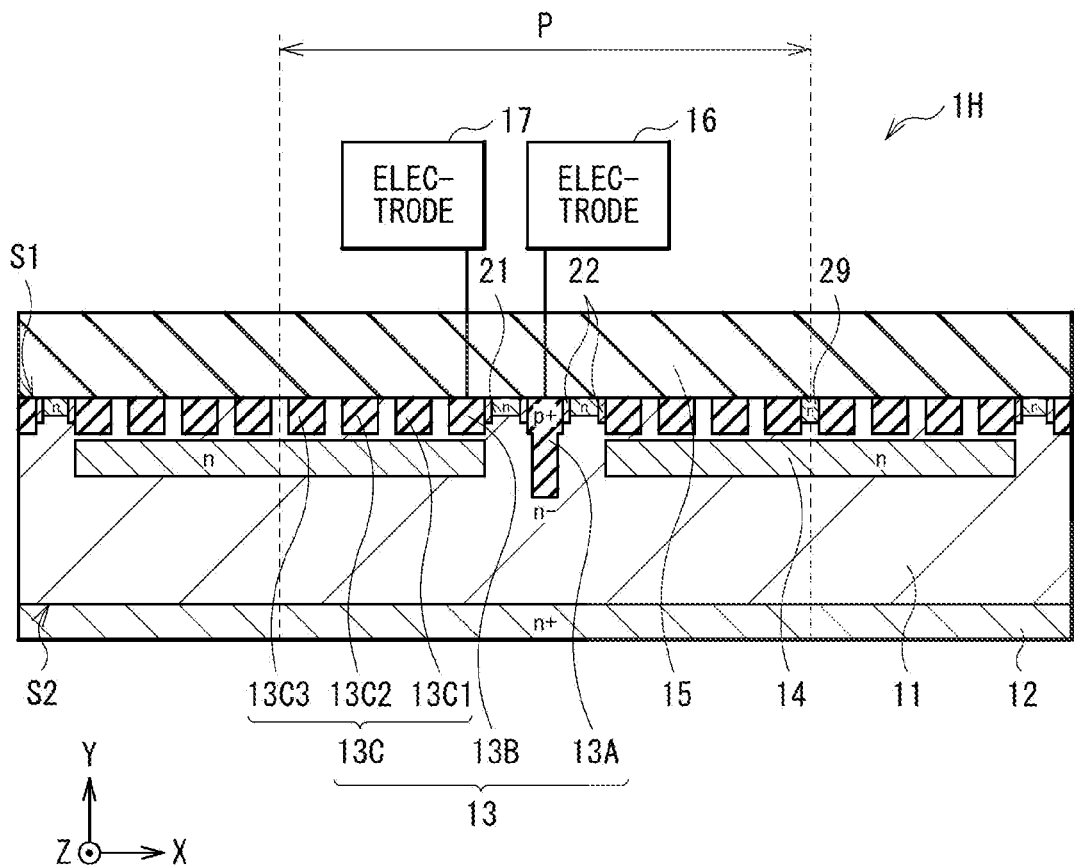
FIG. 26 is a schematic cross-sectional view of an example of a configuration of a light-receiving element according to Modification Example 8 of the present disclosure.
Figure 27:
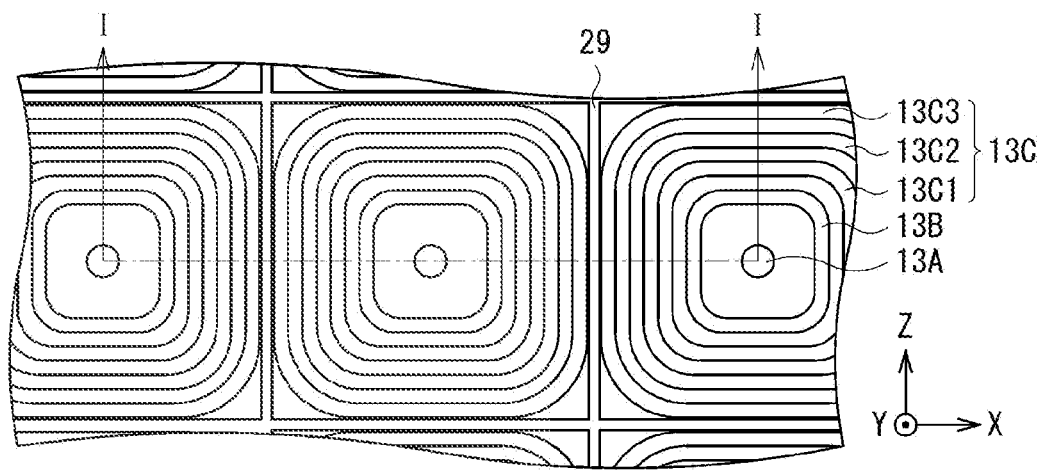
FIG. 27 is a schematic plan view of an example of a layout of the light-receiving element illustrated in FIG. 26.

FIG. 26 schematically illustrates an example of a cross-sectional configuration of a light-receiving element (a light-receiving element 1H) according to Modification Example 8 of the present disclosure. FIG. 27 schematically illustrates a planar configuration of the light-receiving element 1H illustrated in FIG. 26, and FIG. 26 illustrates a cross-section taken along a line I-I illustrated in FIG. 27. In the same manner as the foregoing embodiment, the light-receiving element 1H includes, for example, a PIN type photodiode that applies a reverse bias between a front surface and a back surface of the semiconductor substrate 11. For example, the light-receiving element 1H constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1H of the present modification example, an n-type electrically-conductive region 29 is provided near the interface of the front surface S1 of the semiconductor substrate 11 between the unit pixels P adjacent to each other.

The n-type electrically-conductive region 29 is a region including n-type impurities, and corresponds to a specific example of a "fourth second electrically-conductive region" of the present disclosure. The n-type electrically-conductive region 29 is provided to make a potential at a boundary between the unit pixels P adjacent to each other higher than that of the inside of the unit pixel P, and is provided near the interface of the front surface S1 of the semiconductor substrate 11 to surround the unit pixel P. In other words, as illustrated in FIG. 27, for example, the n-type electrically-conductive region 29 is provided in a grid pattern, for example, in the pixel region 110A in which the unit pixels P are arranged in matrix. The impurity concentration of the n-type electrically-conductive region 29 is higher than the impurity concentration of the n-type electrically-conductive region constituting the embedded layer 14, and is a high concentration of $1e^{16}$ cm$^{-3}$ to $1e^{19}$ cm$^{-3}$, for example. As for a thickness, the n-type electrically-conductive region 29 is shallower than the embedded layer 14, and is formed at a thickness of 0.1 μm or more and 3 m or less, for example, from the interface of the front surface S1 of the semiconductor substrate 11, for example, in a case where the pitch of the unit pixel P is 10 μm or more and 100 μm or less, depending on the configuration of the unit pixel P.

As described above, the guard ring 13C is provided to alleviate the concentration of the electric field on the drain 13B and at the same time to generate a horizontal electric field that assists the transfer of signal charge in a horizontal direction. At the boundary between the unit pixels P adjacent to each other, however, it is difficult to form a potential gradient enough to transfer signal charge at a high speed. In addition, in a case where there is a large difference in the X-ray irradiation between the unit pixels P adjacent to each other, the potential of the guard ring 13C may sometimes differ in the unit pixels P adjacent to each other. At that time, for example, a difference occurs between a potential of the guard ring 13C (e.g., the guard ring 13C3) located on the outermost periphery of a unit pixel P2 adjacent to a unit pixel P1 having an increased potential and a potential of the guard ring 13C of the unit pixel P1 having the increased potential. Therefore, a potential difference occurs between the guard rings 13C3 of the unit pixel P1 and the unit pixel P2 adjacent to each other. This increases the percentage at which electric charge is transferred to the unit pixel P1, thus preventing electric charge generated between the unit pixel P1 and the unit pixel P2 adjacent to each other from being transferred correctly.

In contrast, in the present modification example, the n-type electrically-conductive region 29 is provided near the interface of the front surface S1 of the semiconductor substrate 11 between the unit pixels P adjacent to each other to allow the potential at the boundary between the unit pixels P adjacent to each other to have a potential higher than that of the inside of the unit pixels P. This prevents the flow of signal charge into the unit pixels adjacent to each other and enables high-speed transfer of signal charge. In addition, reduced transfer time of signal charge enables a frame rate to be increased.

Figure 28:
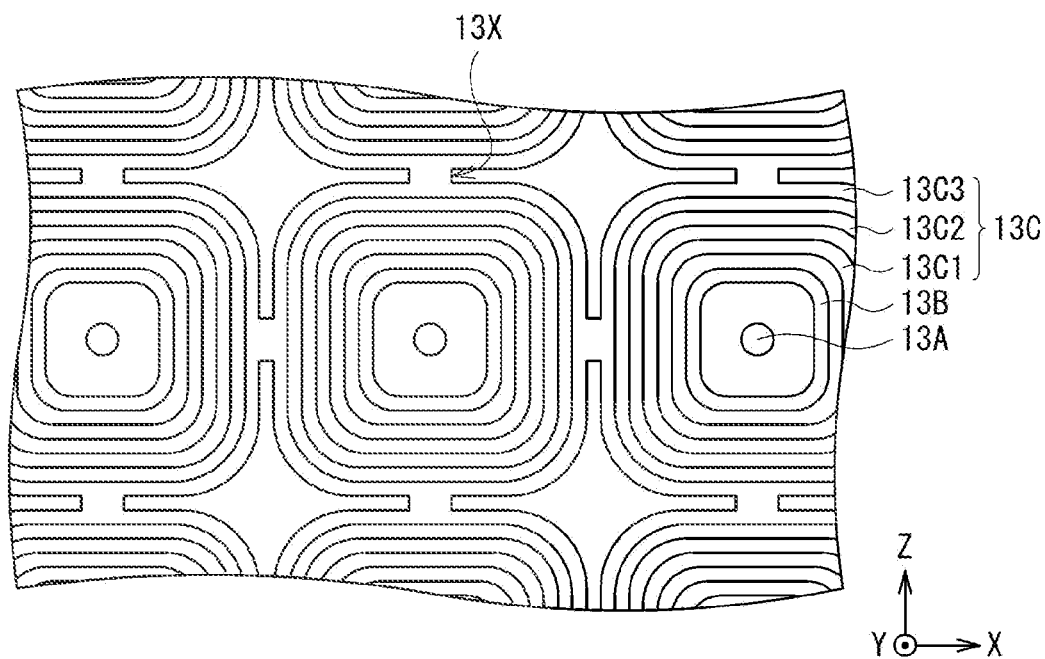
FIG. 28 is a schematic plan view of another example of the configuration of the light-receiving element according to Modification Example 8 of the present disclosure.

In addition, the present modification example exemplifies the n-type impurity region (n-type electrically-conductive region 29) provided between the unit pixels P adjacent to each other; however, as illustrated in FIG. 28, for example, a p-type impurity region (a p-type electrically-conductive region 13X) may be provided at a boundary between the unit pixels P adjacent to each other to couple the respective guard rings 13C (e.g., the guard rings 13C3) located on the outermost peripheries thereof.

The p-type electrically-conductive region 13X is a region including p-type impurities, and corresponds to a specific example of a "seventh first electrically-conductive region" of the present disclosure. The p-type electrically-conductive region 13X has an impurity concentration equivalent to that of the p-type electrically-conductive region 13 forming the guard ring 13C or the like, for example. As for a thickness, the p-type electrically-conductive region 13X is formed at a thickness equivalent to that of the guard ring 13C.

In this manner, providing the p-type electrically-conductive region 13X at the boundary between the unit pixels P adjacent to each other to couple the guard rings 13C1 on the outermost peripheries thereof makes it possible to align potentials between the unit pixels P adjacent to each other. Therefore, the drop in the potential between the unit pixels P adjacent to each other is eliminated, thus making it possible to suppress loss of electric charge. In addition, electric charge distribution characteristics between pixels are aligned between the unit pixels P adjacent to each other, thereby making it possible to reduce software processing or a system necessary to correct the electric charge distribution characteristics, for example, in the X-ray imaging element 100.

Figure 29:
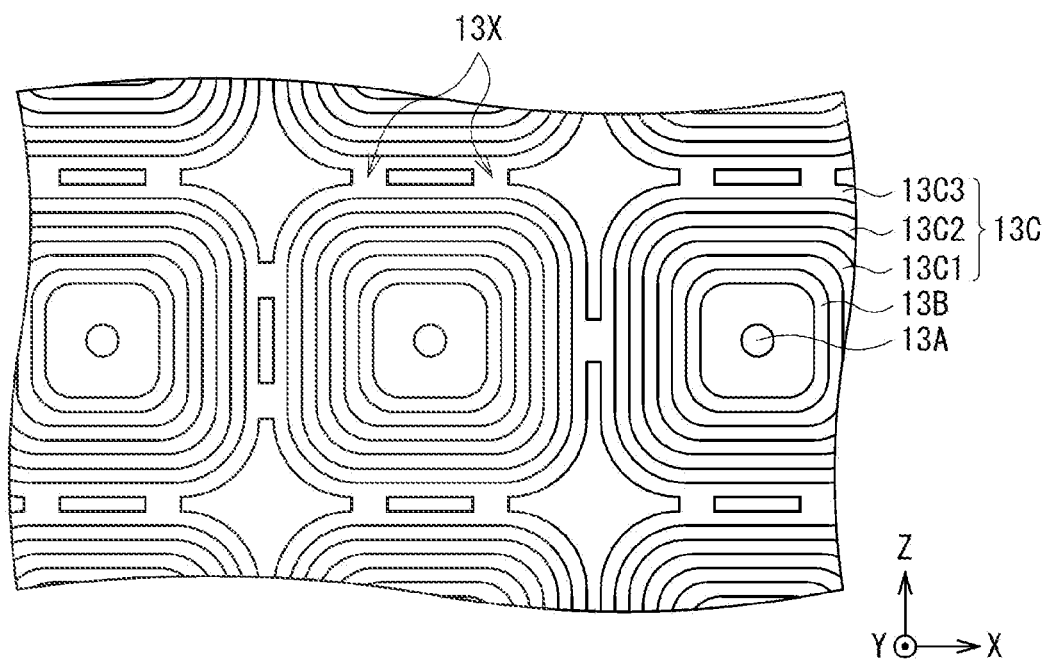
FIG. 29 is a schematic plan view of another example of the layout of the light-receiving element illustrated in FIG. 28.
Figure 30:
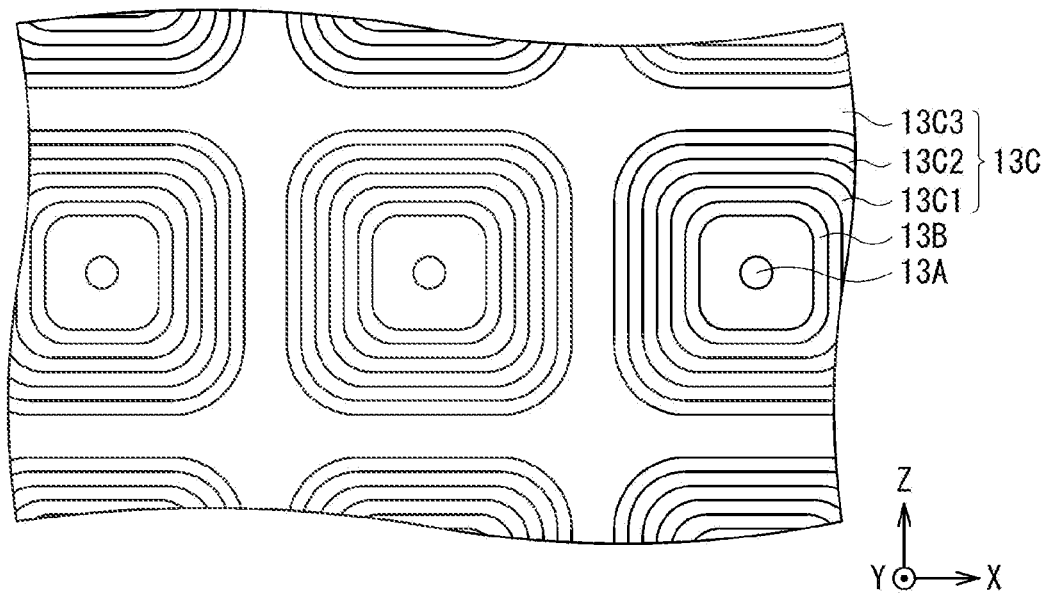
FIG. 30 is a schematic plan view of another example of the layout of the light-receiving element illustrated in FIG. 28.

It is to be noted that FIG. 28 exemplifies coupling between the guard rings 13C3 on the outermost peripheries of the unit pixels P adjacent to each other at one location in each direction; however, as illustrated in FIG. 29, for example, the guard rings 13C3 may be coupled at two locations in each direction. Alternatively, for example, as illustrated in FIG. 30, the guard ring 13C3 on the outermost periphery may be formed across the entire interface of the front surface S1 of the semiconductor substrate 11, as a region common to the unit pixels P adjacent to each other.

2-9. Modification Example 9

Figure 31:
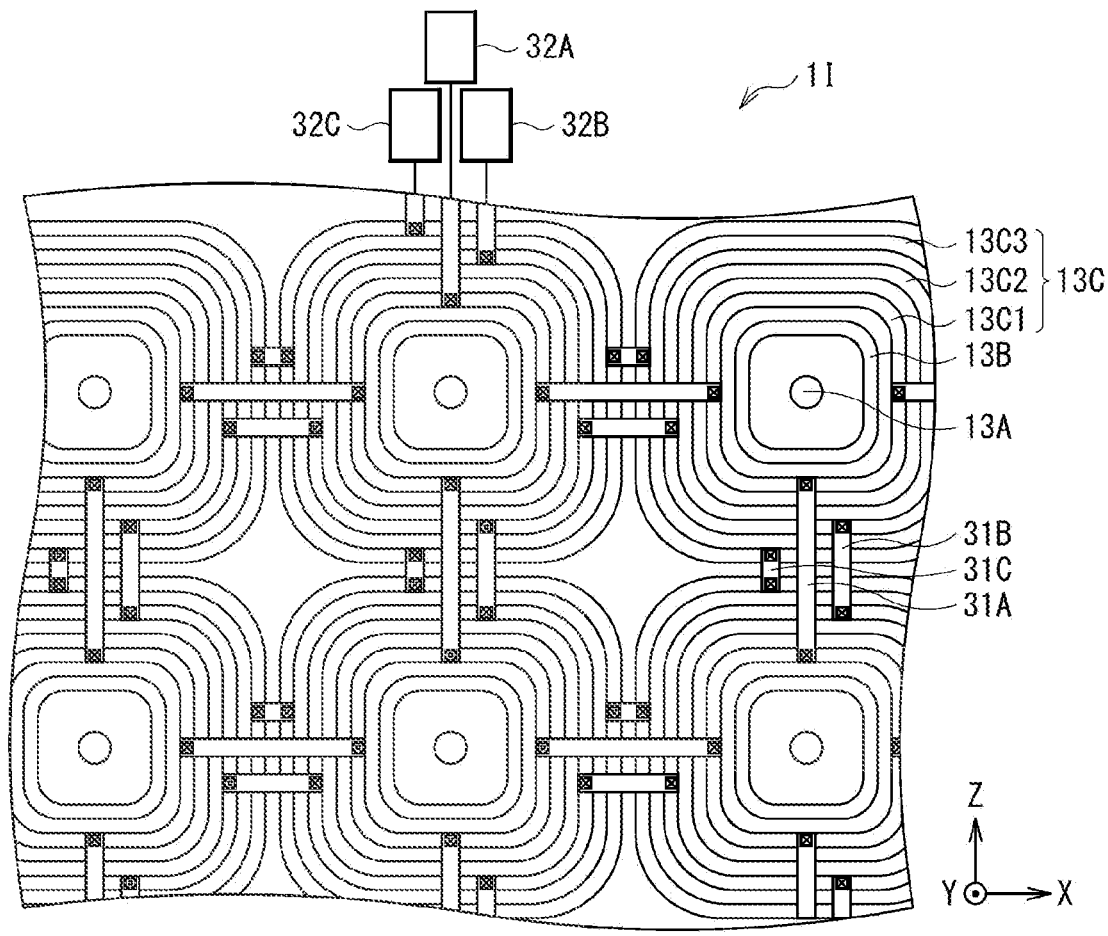
FIG. 31 is a schematic plan view of an example of a configuration of a light-receiving element according to Modification Example 9 of the present disclosure.

FIG. 31 schematically illustrates an example of a planar configuration of a light-receiving element (a light-receiving element 1I) according to Modification Example 9 of the present disclosure. In the same manner as the foregoing embodiment, the light-receiving element 1I includes, for example, a PIN type photodiode that applies a reverse bias between a front surface and a back surface of the semiconductor substrate 11. For example, the light-receiving element 1I constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1I of the present modification example, the guard rings 13C1, the guard rings 13C2, and the guard rings 13C3 provided in the unit pixels P adjacent to each other are electrically coupled to each other via a wiring line 31A, a wiring line 31B, and a wiring line 31C, respectively, formed in the insulating layer 15, for example.

In this manner, in the present modification example, the guard rings 13C1, the guard rings 13C2, and the guard rings 13C3 provided in the respective unit pixels P adjacent to each other are electrically coupled to each other. Therefore, even in a case where a potential of the guard ring 13C of a portion of the unit pixel P is increased as a result of local irradiation by an X-ray, the increase in the potential is averaged by the plurality of unit pixels P arranged in the pixel region 110A, thus making it possible to reduce degradation in withstand voltage.

In addition, for example, the guard rings 13C1, the guard rings 13C2, and the guard rings 13C3 coupled to each other by the wiring line 31A, the wiring line 31B, and the wiring line 31C may be coupled to a power supply 32A, a power supply 32B, and a power supply 32C, respectively. This makes it possible to prevent an increase in the potential of each of the guard ring 13C1, the guard ring 13C2, and the guard ring 13C3 due to X-ray irradiation, and thus to further reduce the degradation in withstand voltage.

It is to be noted that when applying voltages to the guard ring 13C1, the guard ring 13C2, and the guard ring 13C3, the voltages are set in consideration of a trade-off relationship between power consumption and pixel characteristics. As an example, voltages of 10 V, 20 V, and 30 V or voltages of 20 V, 40 V, and 60 V, for example, are applied to the guard ring 13C1, the guard ring 13C2, and the guard ring 13C3, respectively, to allow the voltage to increase from the inner periphery of the unit pixel P toward the outer periphery thereof. This allows for formation of a desired step potential on the front surface S1 of the semiconductor substrate 11, thus enabling high-speed transfer of signal charge.

2-10. Modification Example 10

Figure 32:
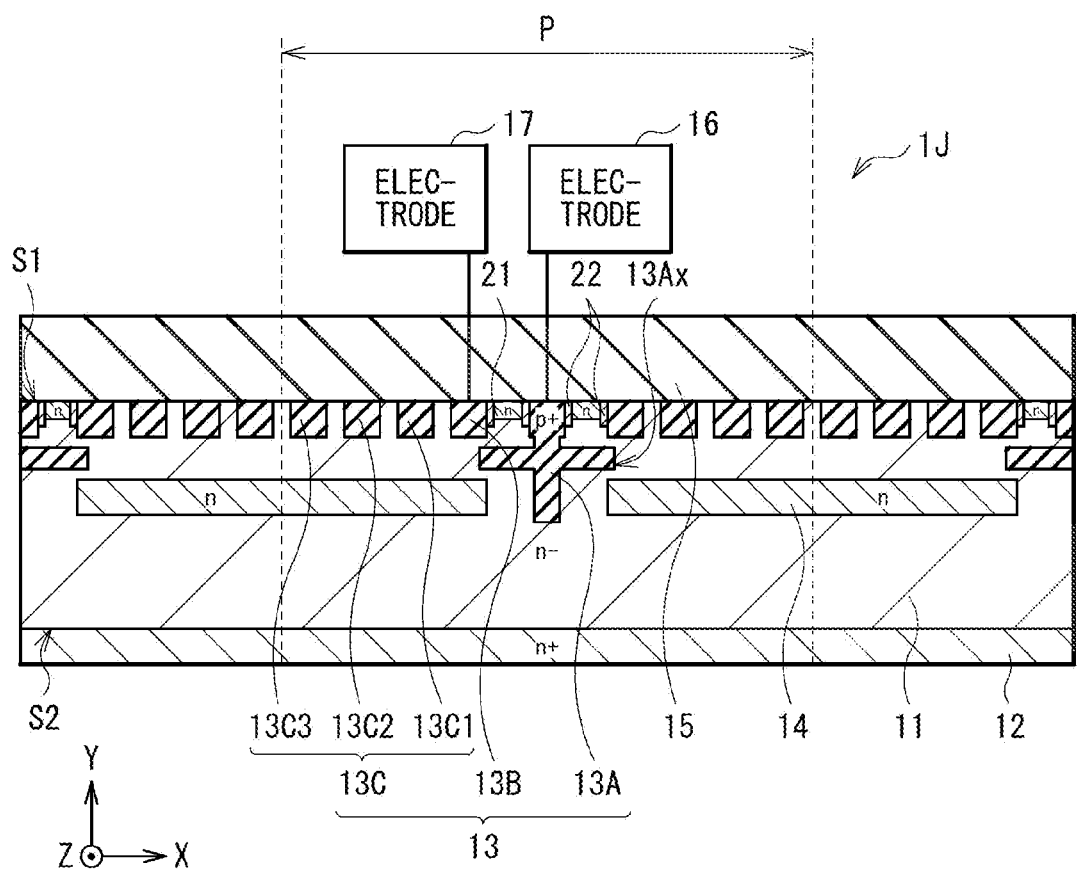
FIG. 32 is a schematic cross-sectional view of an example of a configuration of a light-receiving element according to Modification Example 10 of the present disclosure.

FIG. 32 schematically illustrates an example of a cross-sectional configuration of a light-receiving element (a light-receiving element 1J) according to Modification Example 10 of the present disclosure. In the same manner as the foregoing embodiment, the light-receiving element 1J includes, for example, a PIN type photodiode that applies a reverse bias between a front surface and a back surface of the semiconductor substrate 11. For example, the light-receiving element 1J constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.).

Figure 33:
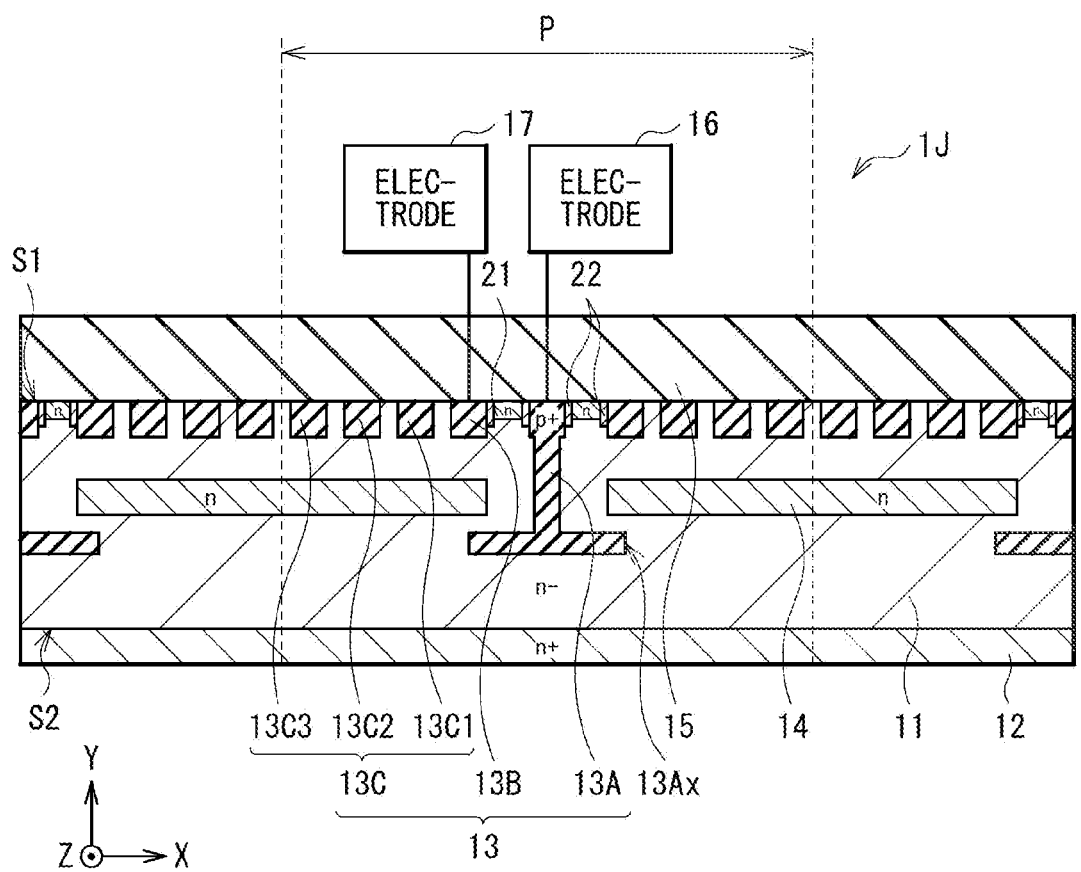
FIG. 33 is a schematic cross-sectional view of another example of the configuration of the light-receiving element according to Modification Example 10 of the present disclosure.

In the light-receiving element 1J of the present modification example, an overhanging section 13Ax of the anode 13A extending in an in-plane direction (an X-Z plane direction) of the semiconductor substrate 11 is provided between the drain 13B and the embedded layer 14. As illustrated in FIG. 33, the overhanging section 13Ax of the anode 13A may be provided on the side closer to the back surface S2 of the semiconductor substrate 11 than the embedded layer 14. The overhanging section 13Ax has a concentration of about $1e^{16}$ cm$^{-3}$ to $1e^{19}$ cm$^{-3}$, for example, equivalent to the impurity concentration of the p-type electrically-conductive region forming the anode 13A. The overhanging section 13Ax corresponds to an "electrically neutral diffusion region" of the present disclosure. Thus, it is possible to prevent the loss of signal charge to the drain 13B.

2-11. Modification Example 11

Figure 34:
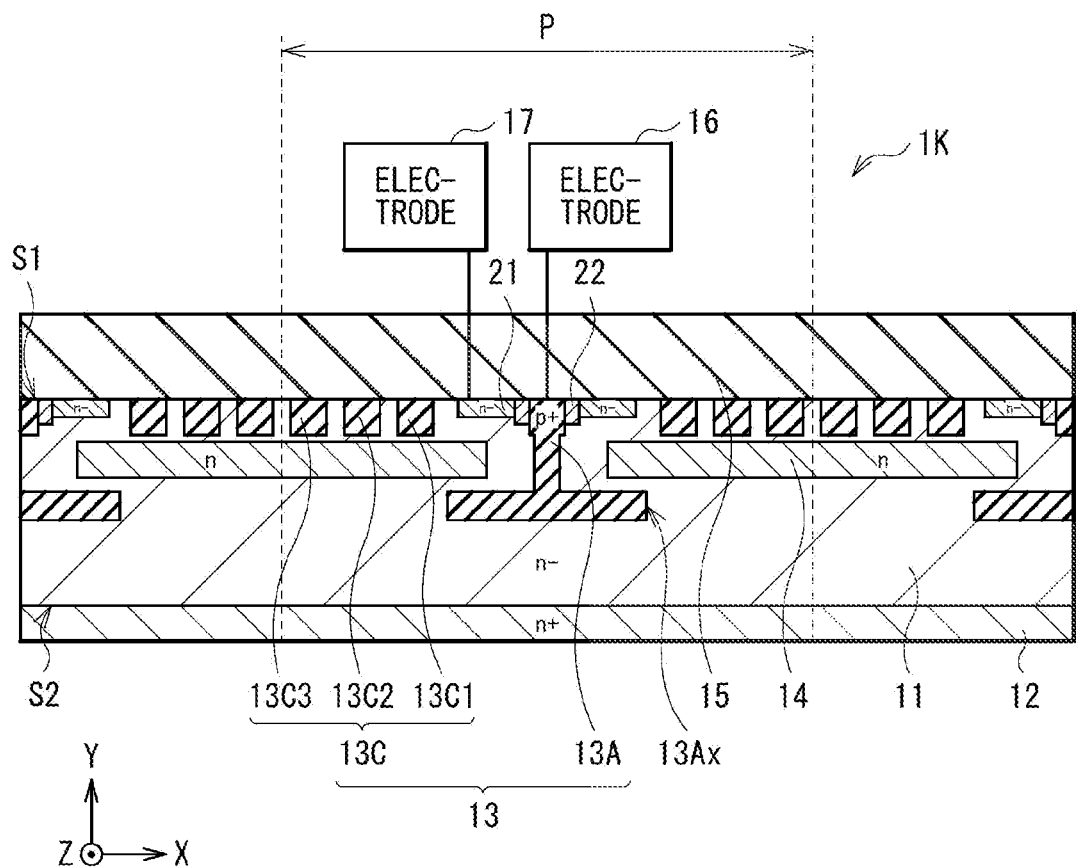
FIG. 34 is a schematic cross-sectional view of an example of a configuration of a light-receiving element according to Modification Example 11 of the present disclosure.

FIG. 34 schematically illustrates an example of a cross-sectional configuration of a light-receiving element (a light-receiving element 1K) according to Modification Example 11 of the present disclosure. In the same manner as the foregoing embodiment, the light-receiving element 1K includes, for example, a PIN type photodiode that applies a reverse bias between a front surface and a back surface of the semiconductor substrate 11. For example, the light-receiving element 1K constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.).

The foregoing Modification Example 10 exemplifies the case where the overhanging section 13Ax overhanging in a direction of a plane of the semiconductor substrate 11 is provided on the side closer to the back surface S2 of the semiconductor substrate 11 than the embedded layer 14 at the end of the anode 13A extending from the front surface S1 of the semiconductor substrate 11 toward the back surface S2 thereof. In a case where the overhanging section 13Ax is provided in this manner, however, it is preferable to have an interval between the anode 13A and the drain 13B not to cause the overhanging section 13Ax and the drain 13B to overlap each other, for example, in a plan view. This makes it possible to prevent electric charge from leaking from the overhanging section 13Ax into the drain 13B.

In addition, in a case where the overhanging section 13Ax and the drain 13B overlap each other, an impurity layer of an opposite electrical conductivity having an impurity concentration of about $1e^{16}$ cm$^{-3}$ to $1e^{19}$ cm$^{-3}$, for example, may be provided between the overhanging section 13Ax and the drain 13B. This enables the same effects as those of the present modification example to be obtained.

2-12. Modification Example 12

Figure 35:
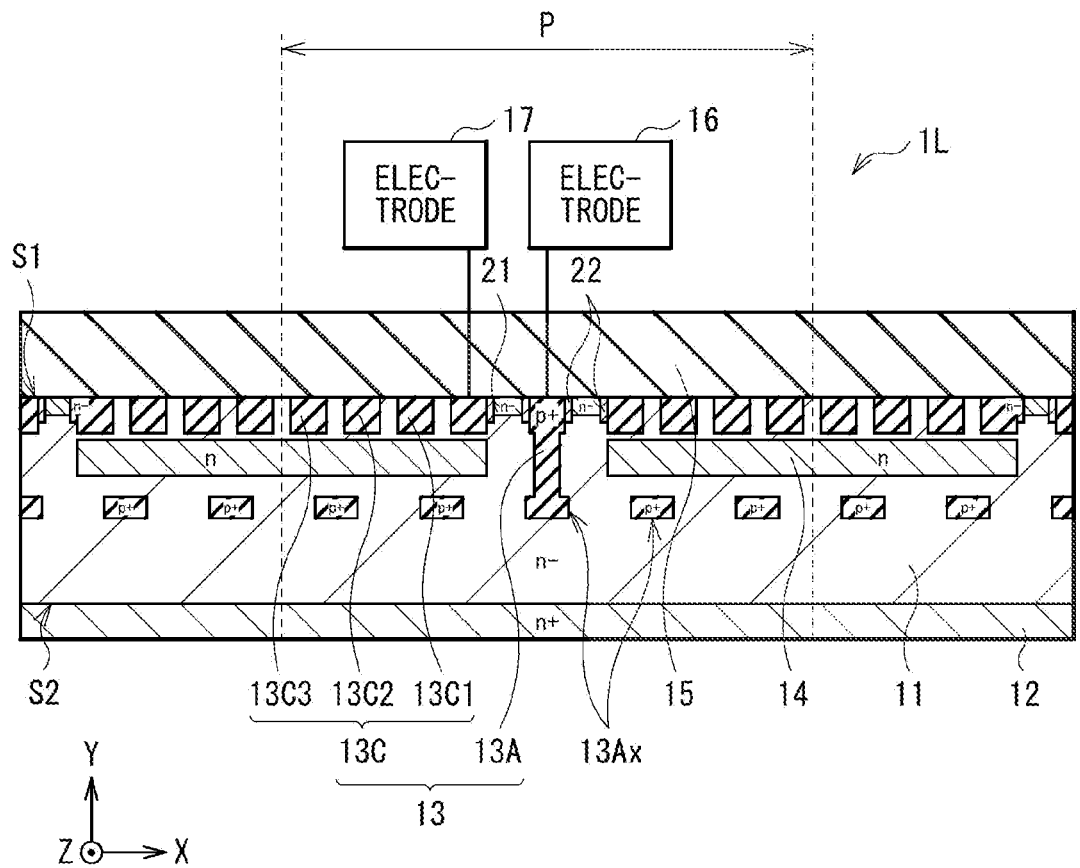
FIG. 35 is a schematic cross-sectional view of an example of a configuration of a light-receiving element according to Modification Example 12 of the present disclosure.
Figure 36:
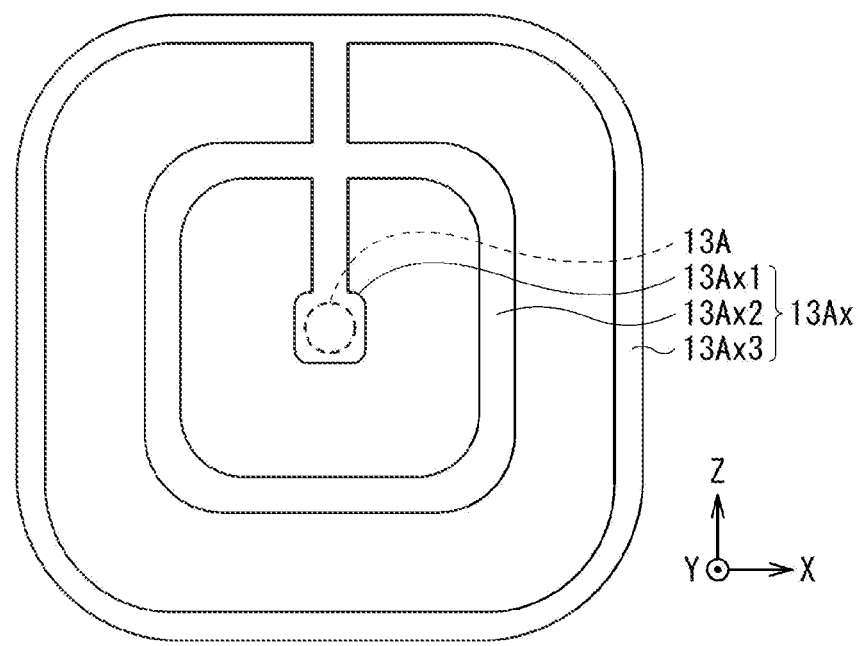
FIG. 36 is a schematic plan view of an example of a layout of an increased width section of the light-receiving element illustrated in FIG. 35.

FIG. 35 schematically illustrates an example of a cross-sectional configuration of a light-receiving element (a light-receiving element 1L) according to Modification Example 12 of the present disclosure. FIG. 36 schematically illustrates an example of a planar layout of the overhanging section 13Ax in the light-receiving element 1L illustrated in FIG. 35. In the same manner as the foregoing embodiment, the light-receiving element 1L includes, for example, a PIN type photodiode that applies a reverse bias between a front surface and a back surface of the semiconductor substrate 11. For example, the light-receiving element 1L constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.).

Figure 37A:
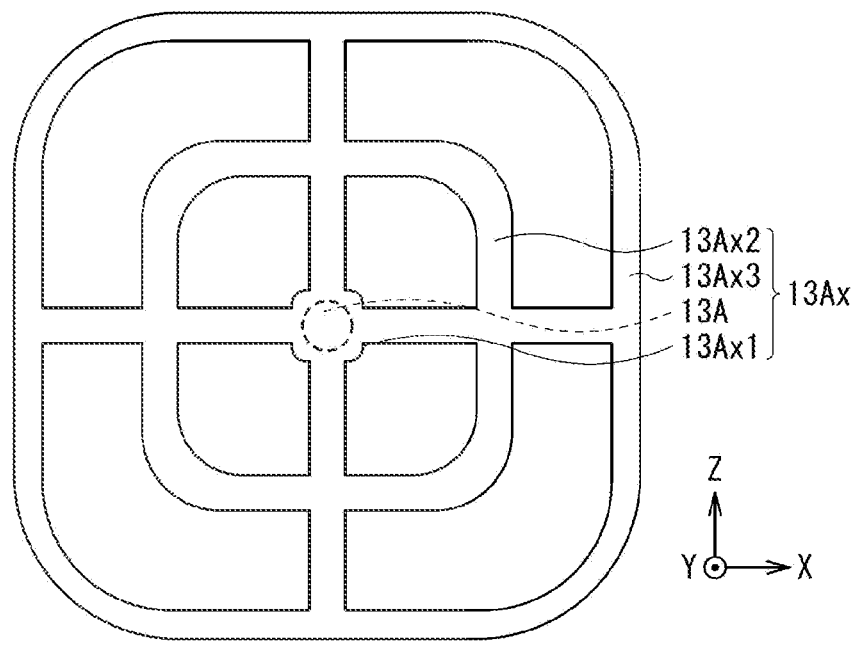
FIG. 37A is a schematic plan view of another example of the layout of the increased width section of the light-receiving element illustrated in FIG. 35.
Figure 37B:
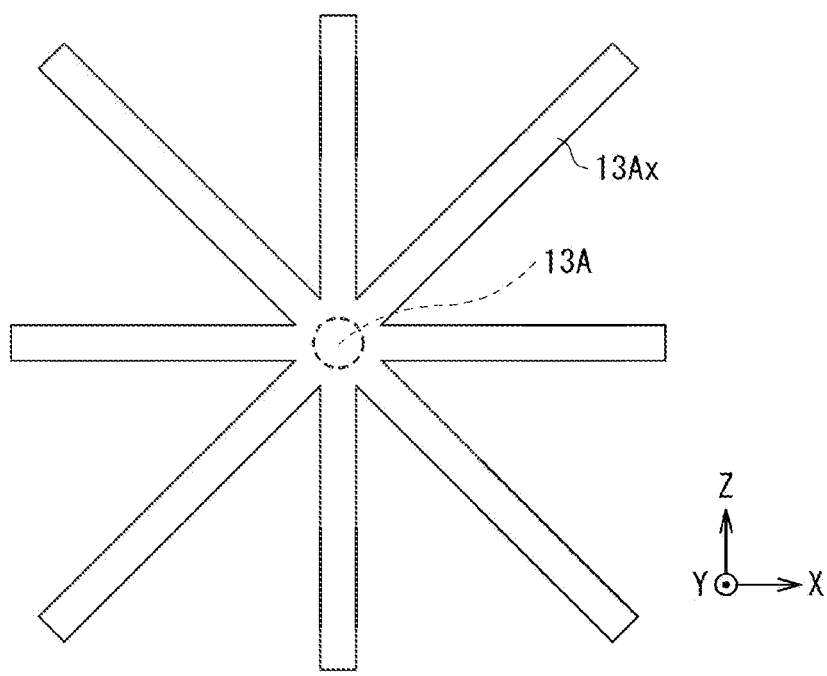
FIG. 37B is a schematic plan view of another example of the layout of the increased width section of the light-receiving element illustrated in FIG. 35.

The foregoing Modification Example 10 and Modification Example 11 exemplify the overhanging section 13Ax being uniformly provided on the side closer to the back surface S2 of the semiconductor substrate 11 than the embedded layer 14. However, as illustrated in FIGS. 35 and 36, a plurality of overhanging sections 13Ax may be provided substantially concentrically or substantially concentrically and polygonally about the anode 13A, for example, as in the guard ring 13C. It is to be noted that a plurality of overhanging sections 13Ax1, 13Ax2, and 13Ax3 may be electrically coupled to one another at one location as illustrated in FIG. 36, or may be electrically coupled to one another at a plurality of locations as illustrated in FIG. 37A. Alternatively, the plurality of overhanging sections 13Ax may be formed radially, for example, as illustrated in FIG. 37B.

In this manner, in the light-receiving element 1L of the present modification example, the total area of the overhanging section 13Ax is reduced as compared with the case where the overhanging section 13Ax is uniformly formed on the side closer to the back surface S2 of the semiconductor substrate 11 than the embedded layer 14 as in Modification Example 10 and Modification Example 11. This reduces the capacity of the anode 13A, thus making it possible to improve the efficiency of converting signal charge into a readout voltage.

2-13. Modification Example 13

FIG. 38 schematically illustrates an example of a cross-sectional configuration of a main part of a light-receiving element according to Modification Example 13 of the present disclosure. The foregoing Modification Example 2 exemplifies the gate electrode 24 provided in the insulating layer 15 between the anode 13A and the drain 13B; however, at that time, it is preferable to provide a Lightly Doped Drain (LDD) 22X having the following structure between the drain 13B and the n-type electrically-conductive region 21.

The LDD 22X has a configuration similar to that of the LDA 22 provided between the drain 13B and the n-type electrically-conductive region 21 in the foregoing embodiment and the like. For example, the LDD 22X is a region including p-type impurities (p-type impurity region); providing the LDD 22X below the gate electrode 24 makes it less susceptible to generation of fixed electric charge at the interface due to an X-ray. As for an impurity concentration, the LDD 22X has a peak concentration, which is a low concentration, of $1e^{17}$ cm$^{-3}$ to $1e^{19}$ cm$^{-3}$, for example.

The LDD 22X partially extends on the n-type electrically-conductive region 21, and forms a region where the n-type electrically-conductive region 21 and the LDD 22X overlap each other below the gate electrode 24. This enables a dark current, generated upon X-ray irradiation, caused by deterioration of an interface state of the semiconductor substrate 11 below the gate electrode 24 to be efficiently transferred to the drain 13B.

Figure 40:
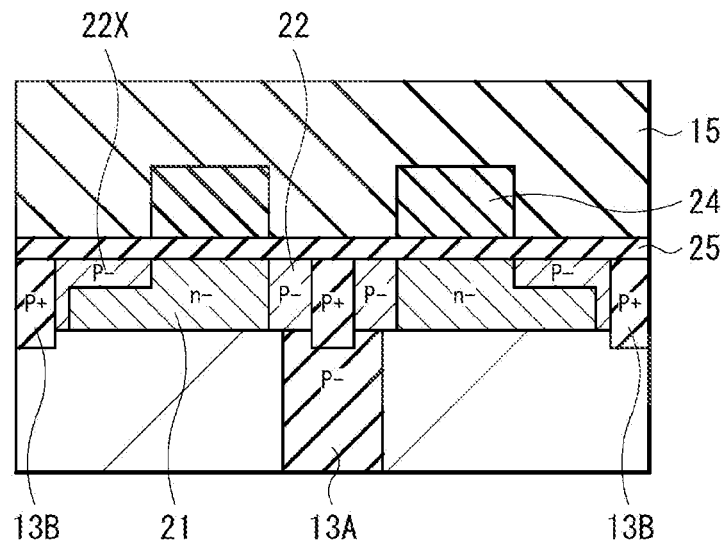
FIG. 40 is a schematic cross-sectional view of another example of the configuration of the main part of the light-receiving element according to Modification Example 13 of the present disclosure.

It is to be noted that FIG. 38 exemplifies the LDD 22X near the interface of the front surface S1 of the semiconductor substrate 11 being extended to the side of the anode 13A to form the overlapped region of the n-type electrically-conductive region 21 and the LDD 22X; however, this is not limitative. For example, as illustrated in FIG. 39, the n-type electrically-conductive region 21 may be formed up to a position deeper than the LDD 22X to allow the n-type electrically-conductive region 21 to extend to below the LDD 22X, thus forming an overlapped region. In addition, in a case where the overlapped region of the n-type electrically-conductive region 21 and the LDD 22X is formed, it is possible to reduce an area for formation of the gate electrode 24, as illustrated in FIG. 40. This makes it possible to improve reliability of the device.

2-14. Modification Example 14

Figure 41:
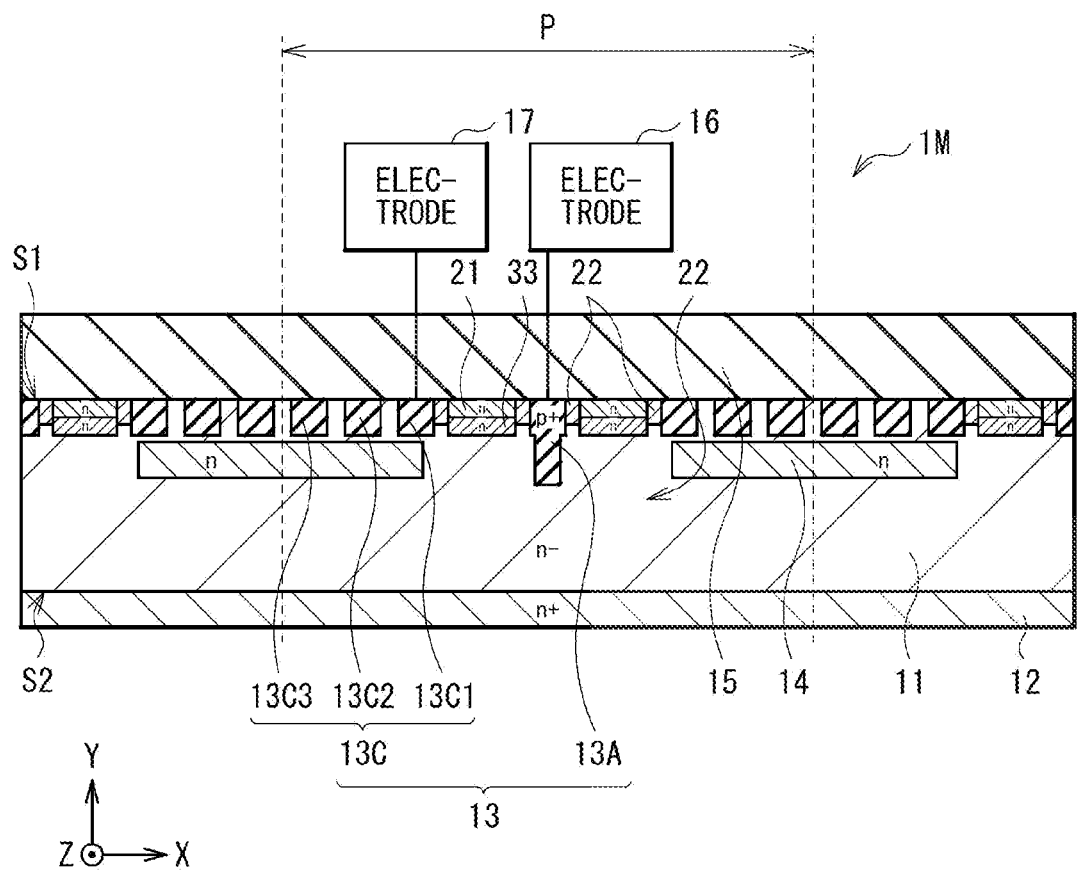
FIG. 41 is a schematic cross-sectional view of an example of a configuration of a light-receiving element according to Modification Example 14 of the present disclosure.

FIG. 41 schematically illustrates an example of a cross-sectional configuration of a light-receiving element (a light-receiving element 1M) according to Modification Example 14 of the present disclosure. The foregoing Modification Example 2 exemplifies the gate electrode 24 provided in the insulating layer 15 between the anode 13A and the drain 13B. At that time, however, the n-type electrically-conductive region 21 formed near the interface of the semiconductor substrate 11 below the gate electrode 24 may be formed up to a deeper position of the semiconductor substrate 11. Alternatively, as illustrated in FIG. 41, an n-type electrically-conductive region 33 having an impurity concentration of about $1e^{16}$ cm$^{-3}$ to $1e^{19}$ cm$^{-3}$, for example, may be further provided in contact with the n-type electrically-conductive region 21. This makes it possible to prevent signal charge from flowing into the drain 13B.

2-15. Modification Example 15

Figure 42:
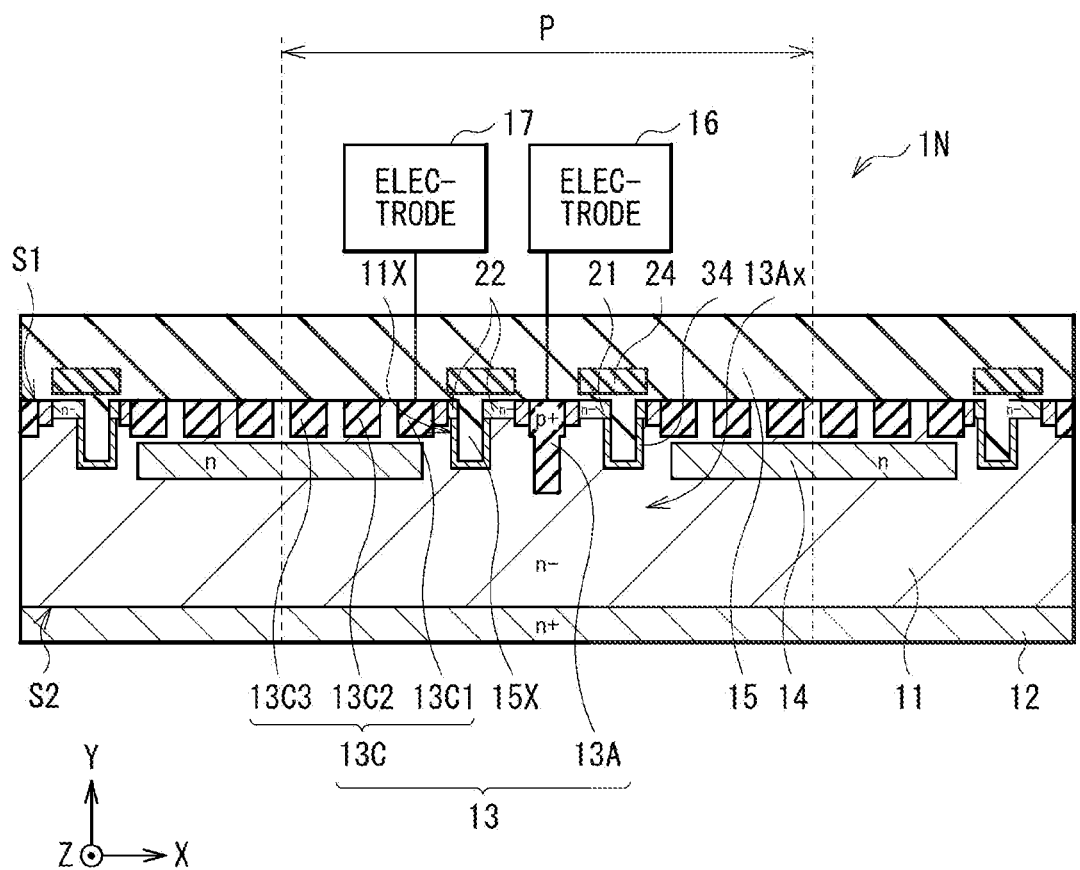
FIG. 42 is a schematic cross-sectional view of an example of a configuration of a light-receiving element according to Modification Example 15 of the present disclosure.

FIG. 42 schematically illustrates an example of a cross-sectional configuration of a light-receiving element (a light-receiving element 1N) according to Modification Example 15 of the present disclosure. The foregoing Modification Example 2 exemplifies the gate electrode 24 provided in the insulating layer 15 between the anode 13A and the drain 13B. At that time, however, a groove 11X may be provided in the semiconductor substrate 11 around the anode 13A to provide, for example, a separation section 15X embedding the insulating layer 15 in the groove 11X.

In this manner, in the present modification example, the separation section 15X including an oxide film is provided in the semiconductor substrate 11 around the anode 13A. This allows the anode 13A and the drain 13B to be physically separated from each other, thus making it possible to secure a separation performance between the anode 13A and the drain 13B.

In addition, it is preferable to form an n-type pinning layer 34 in the semiconductor substrate 11 around the separation section 15X. This makes it possible to prevent the generation of a dark current from the interface of the semiconductor substrate 11 in contact with the separation section 15X.

2-16. Modification Example 16

Figure 43:
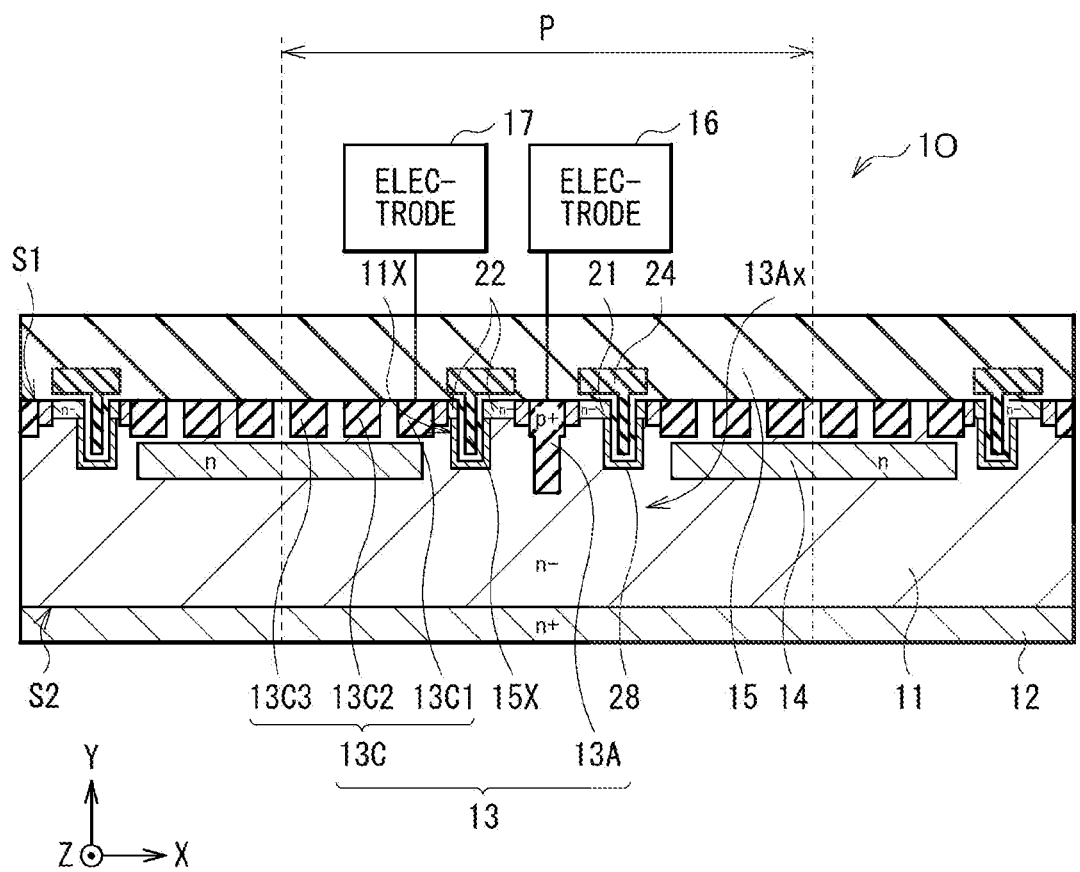
FIG. 43 is a schematic cross-sectional view of an example of a configuration of a light-receiving element according to Modification Example 16 of the present disclosure.

FIG. 43 schematically illustrates an example of a cross-sectional configuration of a light-receiving element (a light-receiving element 1O) according to Modification Example 16 of the present disclosure. The foregoing Modification Example 15 exemplifies the separation section 15X including an oxide film being provided in the semiconductor substrate 11 around the anode 13A. However, the gate electrode 24 may be embedded together with the insulating layer 15 (actually, the gate insulating layer 25) in the groove 11X forming the separation section 15X. In this manner, providing a separation section 24X embedding the gate electrode 24 in the groove 11X reduces a volume of the oxide film embedded in the semiconductor substrate 11, as compared with the foregoing Modification Example 15. This suppresses an increase in an interface state of the semiconductor substrate 11 in contact with the separation section 24X having been irradiated with an X-ray, thus making it possible to reduce the generation of a dark current.

2-17. Modification Example 17

Figure 44:
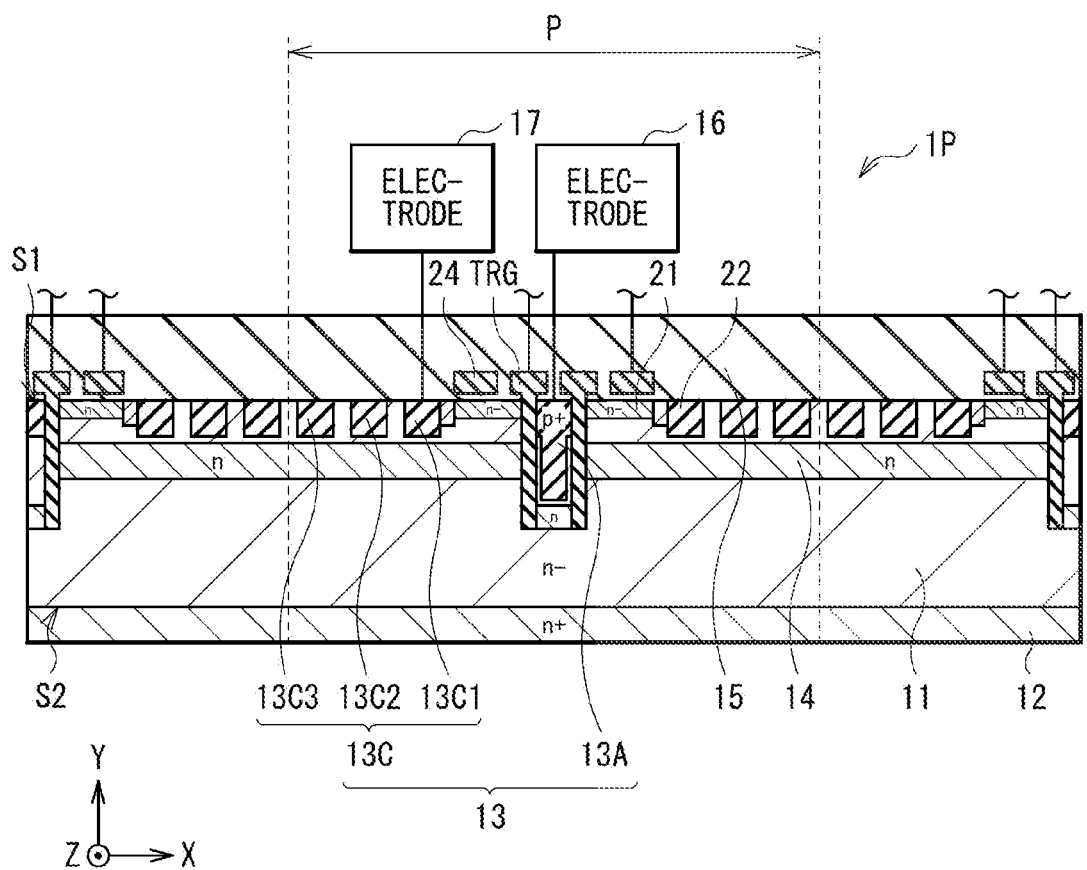
FIG. 44 is a schematic cross-sectional view of an example of a configuration of a light-receiving element according to Modification Example 17 of the present disclosure.

FIG. 44 schematically illustrates an example of a cross-sectional configuration of a light-receiving element (a light-receiving element 1P) according to Modification Example 17 of the present disclosure. In the same manner as the foregoing embodiment, the light-receiving element 1P includes, for example, a PIN type photodiode that applies a reverse bias between a front surface and a back surface of the semiconductor substrate 11. For example, the light-receiving element 1P constitutes one pixel (unit pixel P) in an electromagnetic wave detector or a radiation imaging element (e.g., X-ray imaging element 100) to read information on a subject (to capture an image of a subject), for example, on the basis of a radioactive ray (e.g., α-ray, β-ray, γ-ray, and X-ray, etc.). In the light-receiving element 1P of the present modification example, a vertical transfer transistor is added as a pixel circuit, a gate electrode (a transfer gate TRG) thereof is embedded around the anode 13A, and the embedded layer 14 is extended up to the transfer gate TRG. This allows signal charge to be accumulated below the embedded layer 14, thus enabling complete transfer upon reading. It is therefore possible to reduce superimposition of kTC noise on signal charge at the time of correlated double sampling (CDS), thus making it possible to achieve signal detection with less readout noise.

3. Application Example

Figure 45:
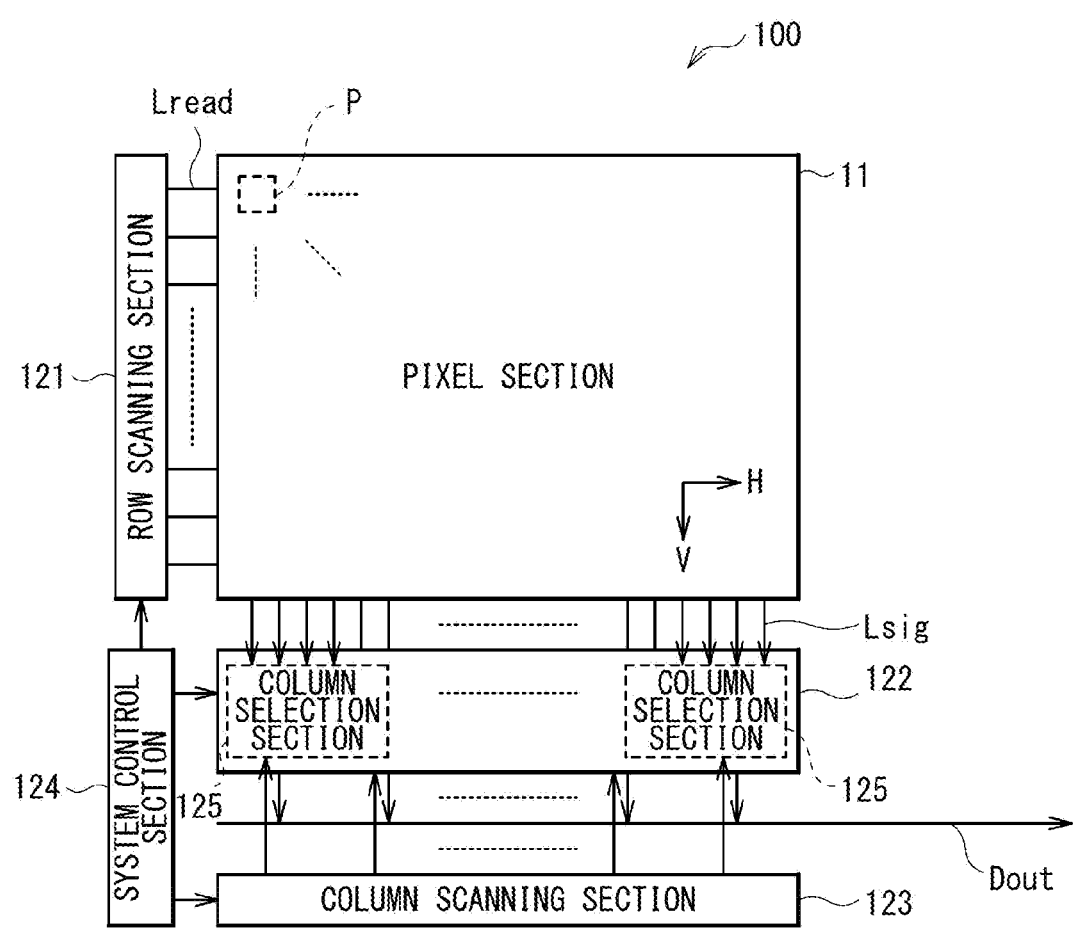
FIG. 45 is a block diagram illustrating a configuration of an X-ray imaging element.

FIG. 45 illustrates a functional configuration of the X-ray imaging element 100 as an example of an electronic apparatus using the light-receiving element (e.g., light-receiving element 1) described in the foregoing embodiment and Modification Examples 1 to 17. The X-ray imaging element 100 reads information on a subject (captures an image of a subject) on the basis of an incident radioactive ray Rrad (e.g., α-ray, β-ray, γ-ray, and X-ray, etc.), for example. The X-ray imaging element 100 includes a pixel section (pixel region 110A), and includes, as a drive circuit (peripheral circuit section) of the pixel region 110A, a row scanning section 121, an A/D conversion section 122, a column scanning section 123, and a system control section 124.

(Pixel Region 110A)

The pixel region 110A includes a plurality of unit pixels (imaging pixels) P that generates signal charge on the basis of a radioactive ray. The plurality of unit pixels P are two-dimensionally arranged in matrix (in a matrix shape). It is to be noted that, as illustrated in FIG. 1, a horizontal direction (row direction) in the pixel region 110A is defined as an "H" direction, and a vertical direction (column direction) is defined as a "V" direction.

(Row Scanning Section 121)

The row scanning section 121 includes a later-described shift register circuit, a predetermined logic circuit, and the like, and is a pixel drive section (row scanning circuit) that performs driving (line-sequential scanning), on a row-by-row basis (in unit of horizontal lines), on the plurality of unit pixels P in the pixel region 110A. Specifically, the row scanning section 121 performs an imaging operation such as a read operation or a reset operation on each of the unit pixels P by line-sequential scanning, for example. It is to be noted that the line-sequential scanning is performed by supplying each of the unit pixels P with a row scanning signal described above via a readout control line Lread.

(A/D Conversion Section 122)

The A/D conversion section 122 includes a plurality of column selection sections 125 each provided for every plurality of (four, in this example) signal lines Lsig, and performs A/D conversion (analog/digital conversion) on the basis of a signal voltage (voltage in response to signal charge) inputted via the signal line Lsig. This allows output data Dout (imaging signal) including a digital signal to be generated and outputted to the outside.

Figure 46:
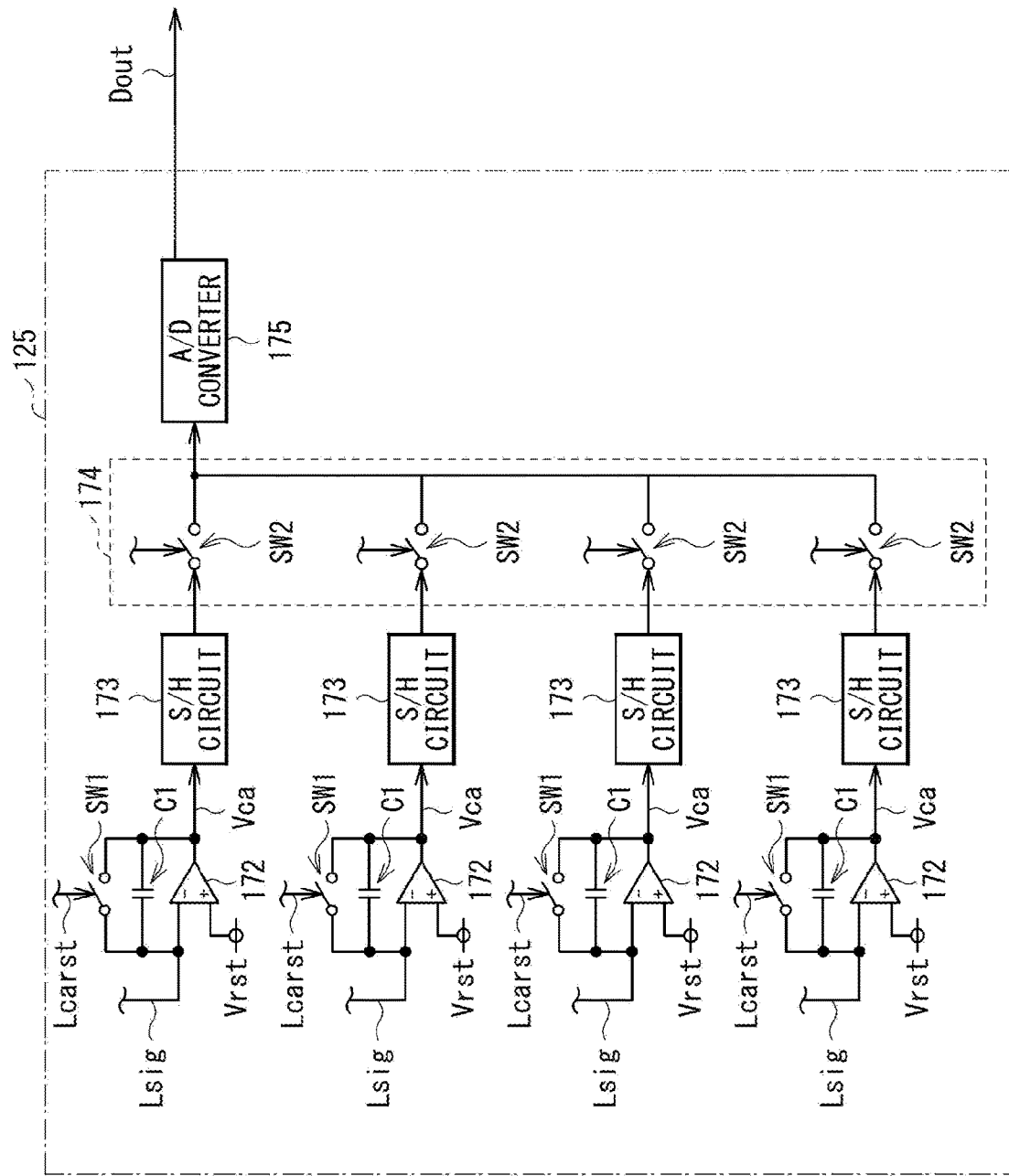
FIG. 46 is a block diagram illustrating a detailed configuration example of a column selection section illustrated in FIG. 45.

For example, as illustrated in FIG. 46, each of the column selection sections 125 includes a charge amplifier 172, a capacitor (condenser or feedback capacitor, etc.) C1, a switch SW1, a sample-and-hold (S/H) circuit 173, a multiplexer circuit (selection circuit) 174 including four switches SW2, and an A/D converter 175. Of these, the charge amplifier 172, the capacitor C1, the switch SW1, the S/H circuit 173, and the switch SW2 are provided for each of the signal lines Lsig. The multiplexer circuit 174 and the A/D converter 175 are provided for each of the column selection sections 125. It is to be noted that the charge amplifier 172, the capacitor C1, and the switch SW1 constitute a charge amplifier circuit.

The charge amplifier 172 is an amplifier (amplifier) to perform conversion (Q-V conversion) of signal charge read from the signal line Lsig into a voltage. In the charge amplifier 172, one end of the signal line Lsig is coupled to an input terminal on a negative side (− side), and a predetermined reset voltage Vrst is inputted to an input terminal on a positive side (+ side). An output terminal and the input terminal on the negative of the charge amplifier 172 are feedback-coupled to each other (feedback coupling) via a parallel connection circuit of the capacitor C1 and the switch SW1. That is, one terminal of the capacitor C1 is coupled to the input terminal on the negative side of the charge amplifier 172, and another terminal thereof is coupled to the output terminal of the charge amplifier 172. Likewise, one terminal of the switch SW1 is coupled to the input terminal on the negative side of the charge amplifier 172, and another terminal thereof is coupled to the output terminal of the charge amplifier 172. It is to be noted that an ON/OFF state of the switch SW1 is controlled by a control signal (amplifier reset control signal) supplied from the system control section 124 via an amplifier reset control line Lcarst.

The S/H circuit 173 is disposed between the charge amplifier 172 and the multiplexer circuit 174 (switch SW2), and is a circuit to temporarily hold an output voltage Vca from the charge amplifier 172.

The multiplexer circuit 174 is a circuit that selectively couples or decouples each of the S/H circuits 173 and the A/D converter 175 to and from each other by sequentially bringing one of the four switches SW2 into an ON state in accordance with scan driving by the column scanning section 123.

The A/D converter 175 is a circuit that generates and outputs the above-described output data Dout by performing A/D conversion on an output voltage from the S/H circuit 173 inputted via the switch SW2.

(Column Scanning Section 123)

The column scanning section 123 includes, for example, an unillustrated shift register, address decoder, and the like, and drives the switches SW2 in sequence in the above-described column selection section 125 while scanning. Such selective scanning by the column scanning section 123 allows signals (output data Dout described above) of the respective unit pixels P read via the respective signal lines Lsig to be outputted in sequence to the outside.

(System Control Section 124)

The system control section 124 controls respective operations of the row scanning section 121, the A/D conversion section 122, and the column scanning section 123. Specifically, the system control section 124 includes a timing generator that generates various timing signals (control signals) described above, and performs drive control of the row scanning section 121, the A/D conversion section 122, and the column scanning section 123 on the basis of the various timing signals generated by the timing generator. On the basis of the control of the system control section 124, the row scanning section 121, the A/D conversion section 122, and the column scanning section 123 each perform imaging driving (line-sequential imaging driving) on the plurality of unit pixels P in the pixel region 110A, thereby allowing the output data Dout to be acquired from the pixel region 110A.

Although the description has been given above by referring to the embodiment, Modification Examples 1 to 17, and the application example, the contents of the present disclosure are not limited to the foregoing embodiment, and the like, and may be modified in a wide variety of ways. For example, the foregoing embodiment, and the like exemplify the use of holes as signal charge; however, electrons may be used as the signal charge. It is to be noted, in that case, each member has an electrically-conductive type which is the opposite electrically-conductive type.

In addition, the layer configuration of the light-receiving element 1 described in the foregoing embodiment, and the like is merely exemplary, and another layer may further be included. Further, the materials or the thicknesses of the respective layers are also exemplary, and are not limited to those described above. Furthermore, although the foregoing application example mentions the X-ray imaging element 100, the light-receiving element 1 described in the foregoing embodiment, and the like is also applicable to a radiation imaging element or an electromagnetic wave detector of which application is not limited to an X-ray.

It is to be noted that the effects described herein are merely exemplary and non-limiting, and may have other effects.

It is to be noted that the present disclosure may also have the following configurations. According to the present technology of the following configurations, the first second electrically-conductive region having a different electrically-conductive type is provided between the first first electrically-conductive region coupled to the first electrode and the second first electrically-conductive region coupled to the second electrode, provided near the interface of the first surface of the semiconductor substrate including the photoelectric conversion region, and the fourth first electrically-conductive region having an impurity concentration lower than the first electrically-conductive region is further provided between the first first electrically-conductive region and the first second electrically-conductive region. This makes it possible to hinder the interface of the first surface of the semiconductor substrate having been irradiated with an X-ray from being brought into the second electrically-conductive type. It is therefore possible to reduce an influence of the total dose effect due to X-ray irradiation.

(1)

A light-receiving element including:
  a semiconductor substrate including a photoelectric conversion region;
  a first first electrically-conductive region provided at an interface of a first surface of the semiconductor substrate and coupled to a first electrode;
  a second first electrically-conductive region provided around the first first electrically-conductive region and coupled to a second electrode, at the interface of the first surface;
  a third first electrically-conductive region provided around the second first electrically-conductive region and being in an electrically floating state, at the interface of the first surface;
  a first second electrically-conductive region having a different electrically-conductive type provided between the first first electrically-conductive region and the second first electrically-conductive region, at the interface of the first surface; and
  a fourth first electrically-conductive region provided at least between the first first electrically-conductive region and the first second electrically-conductive region and having an impurity concentration lower than the first first electrically-conductive region, near the interface of the first surface.

(2)

The light-receiving element according to (1), in which the fourth first electrically-conductive region has a peak concentration of $1e^{19}$ $cm^3$ or less.

(3)

The light-receiving element according to (1) or (2), in which the fourth first electrically-conductive region is further provided between the first second electrically-conductive region and the second first electrically-conductive region at the interface of the first surface.

(4)

The light-receiving element according to any one of (1) to (3), further including:
  an insulating layer provided on a side of the first surface of the semiconductor substrate; and
  a wiring layer provided in the insulating layer, in which the insulating layer between the first surface and the wiring layer includes a monolayer film of silicon oxide or a stacked film in which at least a silicon oxide film having a thickness of 30 nm or more and a silicon nitride film are provided in this order from the side of the first surface.

(5)

The light-receiving element according to any one of (1) to (3), further including:
  a first insulating layer provided on the first surface of the semiconductor substrate and including a high-dielectric material having a relative permittivity higher than silicon oxide; and
  a first electrically-conductive film provided on the side of the first surface of the semiconductor substrate with at least the first insulating layer interposed therebetween.

(6)

The light-receiving element according to (5), in which
  the first electrically-conductive film includes a plurality of first electrically-conductive films,
  the first insulating layer is provided individually for each of the plurality of first electrically-conductive films, and
  the light-receiving element further includes a second insulating layer in which a plurality of the first insulating layers and the plurality of first electrically-conductive films are embedded and an air gap is formed at least between the first insulating layers adjacent to each other.

(7)

The light-receiving element according to any one of (1) to (3), further including an insulating layer provided on the side of the first surface of the semiconductor substrate, in which
  the insulating layer has an air gap formed between the first first electrically-conductive region and the second first electrically-conductive region.

(8)

The light-receiving element according to (7), in which
  the semiconductor substrate has a depression on the first surface, and
  the first first electrically-conductive region is provided in the depression.

(9)

The light-receiving element according to any one of (1) to (8), in which
  a plurality of the third first electrically-conductive regions are provided substantially concentrically and rectangularly or substantially concentrically about the first first electrically-conductive region, and
  the third first electrically-conductive regions adjacent to each other have a uniform interval therebetween in all formation regions.

(10)

The light-receiving element according to any one of (1) to (9), further including:
  the insulating layer provided on the side of the first surface of the semiconductor substrate; and
  a second electrically-conductive film provided wider than the third first electrically-conductive region to cover at least a portion of the third first electrically-conductive region with the insulating layer interposed therebetween, the second electrically-conductive film being electrically coupled to the third first electrically-conductive region via an opening provided in the insulating layer.

(11)

The light-receiving element according to (10), in which the second electrically-conductive film overhangs the third first electrically-conductive region on a side of the first first electrically-conductive region.

(12)

The light-receiving element according to any one of (1) to (11), in which the plurality of the third first electrically-conductive regions are provided substantially concentrically and rectangularly or substantially concentrically about the first first electrically-conductive region, and
  the light-receiving element further includes a second second electrically-conductive region provided between the third first electrically-conductive regions adjacent to each other near the interface of the first surface.

(13)

The light-receiving element according to (12), in which the third first electrically-conductive region includes, on both sides, a fifth first electrically-conductive region having an impurity concentration lower than the third first electrically-conductive region.

(14)

The light-receiving element according to (12) or (13), in which the second second electrically-conductive region is further provided near the interface of the first surface between the second first electrically-conductive region and the third first electrically-conductive region.

(15)

The light-receiving element according to (12) or (13), in which the second second electrically-conductive region is provided in contact with the third first electrically-conductive region on a side opposite to a side of the second first electrically-conductive region.

(16)

The light-receiving element according to any one of (12) to (15), further including a sixth first electrically-conductive region provided near the interface of the first surface between the second second electrically-conductive region and the third first electrically-conductive region on the side of the second first electrically-conductive region, the sixth first electrically-conductive region having an impurity concentration lower than the third first electrically-conductive region.

(17)

The light-receiving element according to (15) or (16), in which, of the second second electrically-conductive region provided in contact with each of the plurality of the third first electrically-conductive regions, the second second electrically-conductive region in contact with the third first electrically-conductive region is formed wider as being closer to the side opposite to the side of the second first electrically-conductive region.

(18)

The light-receiving element according to (15) or (16), in which, of the second second electrically-conductive region provided in contact with each of the plurality of the third first electrically-conductive regions, the second second electrically-conductive region in contact with the third first electrically-conductive region has a higher impurity concentration as being closer to the side opposite to the side of the second first electrically-conductive region.

(19)

The light-receiving element according to any one of (12) to (18), further including a multilayer wiring layer in which a plurality of wiring layers are stacked with the insulating layer interposed therebetween on the side of the first surface of the semiconductor substrate, in which
  the plurality of wiring layers includes a first wiring layer extending above the third first electrically-conductive region, and the first wiring layer is formed in a second layer or a subsequent layer, among the plurality of wiring layers, from the side of the first surface.

(20)
The light-receiving element according to any one of (1) to (19), in which
the semiconductor substrate further includes a third second electrically-conductive region embedded and formed in the substrate and facing the second first electrically-conductive region and the third first electrically-conductive region, and a plurality of pixels each including the first first electrically-conductive region, the second first electrically-conductive region, and the third first electrically-conductive region, and
the light-receiving element further includes a fourth second electrically-conductive region near the interface of the first surface between the pixels adjacent to each other.

(21)
The light-receiving element according to any one of (1) to (19), in which
the semiconductor substrate further includes a third second electrically-conductive region embedded and formed in the substrate and facing the second first electrically-conductive region and the third first electrically-conductive region, and a plurality of pixels each including the first first electrically-conductive region, the second first electrically-conductive region, and the third first electrically-conductive region, and
the plurality of the third first electrically-conductive regions provided in the respective pixels adjacent to each other are coupled to each other via a seventh first electrically-conductive region at least partially having an impurity concentration equivalent to the third first electrically-conductive regions.

(22)
The light-receiving element according to any one of (1) to (19), in which
the semiconductor substrate further includes a third second electrically-conductive region embedded and formed in the substrate and facing the second first electrically-conductive region and the third first electrically-conductive region, and a plurality of pixels each including the first first electrically-conductive region, the second first electrically-conductive region, and the third first electrically-conductive region, and
the plurality of the third first electrically-conductive regions of the respective pixels adjacent to each other are electrically coupled to each other via a wiring line provided on the first surface of the semiconductor substrate.

(23)
The light-receiving element according to (22), in which the first first electrically-conductive region extends toward a second surface opposed to the first surface, and extends in an in-plane direction of the semiconductor substrate with the third second electrically-conductive region interposed therebetween.

(24)
The light-receiving element according to any one of (1) to (23), further including an electrically neutral diffusion region extending from a bottom surface of the first first electrically-conductive region on a side of the second surface opposed to the first surface toward the second surface and extending to a position not overlapping the second first electrically-conductive region in the in-plane direction of the semiconductor substrate.

(25)
The light-receiving element according to any one of (1) to (24), in which
the semiconductor substrate further includes
the third second electrically-conductive region embedded and formed in the substrate and facing the second first electrically-conductive region and the third first electrically-conductive region, and
the electrically neutral diffusion region extending from the bottom surface of the first first electrically-conductive region on the side of the second surface opposed to the first surface toward the second surface, the electrically neutral diffusion region including a plurality of electrically neutral diffusion regions being provided substantially concentrically and rectangularly around the first first electrically-conductive region in a plan view in the in-plane direction of the semiconductor substrate with the third second electrically-conductive region interposed therebetween, the electrically neutral diffusion regions being electrically coupled to each other.

(26)
The light-receiving element according to any one of (3) to (25), further including the first electrically-conductive film provided above the first surface at least between the first first electrically-conductive region and the second first electrically-conductive region, in which
an overlapped region, in which the fourth first electrically-conductive region extends toward the first first electrically-conductive region across the first surface on the second first electrically-conductive region, is provided between the second first electrically-conductive region and the fourth first electrically-conductive region, the fourth first electrically-conductive region provided between the first second electrically-conductive region and the second first electrically-conductive region.

(27)
The light-receiving element according to any one of (1) to (25), further including the first electrically-conductive film provided above the first surface at least between the first first electrically-conductive region and the second first electrically-conductive region, in which
the first second electrically-conductive region is formed up to a position deeper than the second first electrically-conductive region from the interface of the first surface.

(28)
The light-receiving element according to any one of (1) to (27), further including:
the first electrically-conductive film provided above the first surface between the first first electrically-conductive region and the second first electrically-conductive region; and
a separation section including an oxide film embedded and formed in the first surface between the first first electrically-conductive region and the second first electrically-conductive region.

(29)
The light-receiving element according to any one of (1) to (28), further including the first electrically-conductive film provided above the first surface between the first first electrically-conductive region and the second first electrically-conductive region, the first electrically-conductive film partially protruding into the semiconductor substrate between the first first electrically-conductive region and the second first electrically-conductive region.

(30)

The light-receiving element according to any one of (1) to (28), further including, on the first surface between the first first electrically-conductive region and the second first electrically-conductive region, a vertical transistor that transfers electric charge generated by photoelectric conversion, in which the semiconductor substrate further includes the third second electrically-conductive region embedded and formed in the substrate and facing the second first electrically-conductive region and the third first electrically-conductive region, and a gate of the vertical transistor extends in the semiconductor substrate toward the second surface opposed to the first surface from the first surface of the semiconductor substrate, and is in contact with a side surface of the third second electrically-conductive region.

(31)

An X-ray imaging element including a plurality of light-receiving elements generating signal charge based on an X-ray, the light-receiving elements each including a semiconductor substrate including a photoelectric conversion region, a first first electrically-conductive region provided at an interface of a first surface of the semiconductor substrate and coupled to a first electrode, a second first electrically-conductive region provided around the first first electrically-conductive region and coupled to a second electrode, at the interface of the first surface, a third first electrically-conductive region provided around the second first electrically-conductive region and being in an electrically floating state, at the interface of the first surface, a first second electrically-conductive region having a different electrically-conductive type provided between the first first electrically-conductive region and the second first electrically-conductive region, at the interface of the first surface, and a fourth first electrically-conductive region provided at least between the first first electrically-conductive region and the first second electrically-conductive region and having an impurity concentration lower than the first first electrically-conductive region, near the interface of the first surface.

(32)

The X-ray imaging element according to (31), including a pixel region in which a plurality of pixels are arranged; and a peripheral region provided around the pixel region, in which the semiconductor substrate includes a depletion region in the pixel region and includes a neutral region in the peripheral region.

(33)

The X-ray imaging element according to (32), in which the light-receiving elements are provided for the respective pixels, and the light-receiving elements each include a p-n junction light-receiving element that applies a reverse bias between the first surface of the semiconductor substrate and a second surface opposed to the first surface.

(34)

An electronic apparatus including an X-ray imaging element, the X-ray imaging element including a plurality of light-receiving elements generating signal charge based on an X-ray, the light-receiving elements each including a semiconductor substrate including a photoelectric conversion region, a first first electrically-conductive region provided at an interface of a first surface of the semiconductor substrate and coupled to a first electrode, a second first electrically-conductive region provided around the first first electrically-conductive region and coupled to a second electrode, at the interface of the first surface, a third first electrically-conductive region provided around the second first electrically-conductive region and being in an electrically floating state, at the interface of the first surface, a first second electrically-conductive region having a different electrically-conductive type provided between the first first electrically-conductive region and the second first electrically-conductive region, at the interface of the first surface, and a fourth first electrically-conductive region provided at least between the first first electrically-conductive region and the first second electrically-conductive region and having an impurity concentration lower than the first first electrically-conductive region, near the interface of the first surface.

(35)

A light-receiving element including:

a semiconductor substrate including a photoelectric conversion region;

a first first electrically-conductive region provided at an interface of a first surface of the semiconductor substrate and coupled to a first electrode;

a second first electrically-conductive region provided around the first first electrically-conductive region and coupled to a second electrode, at the interface of the first surface;

a third first electrically-conductive region provided around the second first electrically-conductive region and being in an electrically floating state, at the interface of the first surface;

an electrically-conductive film provided on a side of the first surface of the semiconductor substrate; and an insulating layer provided between the first surface and the electrically-conductive film, the insulating layer including a monolayer film of silicon oxide or a stacked film in which at least a silicon oxide film having a thickness of 30 nm or more and a silicon nitride film are provided in this order from the side of the first surface.

(36)

A light-receiving element including:

a semiconductor substrate including a photoelectric conversion region;

a first first electrically-conductive region provided at an interface of a first surface of the semiconductor substrate and coupled to a first electrode;

a second first electrically-conductive region provided around the first first electrically-conductive region and coupled to a second electrode, at the interface of the first surface;

a third first electrically-conductive region provided around the second first electrically-conductive region and being in an electrically floating state, at the interface of the first surface;

a first insulating layer provided on the first surface of the semiconductor substrate and including a high-dielectric material having a relative permittivity higher than silicon oxide; and
an electrically-conductive film provided on a side of the first surface of the semiconductor substrate with at least the first insulating layer interposed therebetween.

(37)

A light-receiving element including:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a third first electrically-conductive region provided around the second first electrically-conductive region and being in an electrically floating state, at the interface of the first surface; and
an insulating layer provided on a side of the first surface of the semiconductor substrate and having an air gap between the first first electrically-conductive region and the second first electrically-conductive region.

(38)

A light-receiving element including:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a plurality of third first electrically-conductive regions provided around the second first electrically-conductive region substantially concentrically and rectangularly or substantially concentrically about the first first electrically-conductive region and being in an electrically floating state, at the interface of the first surface; and
a second second electrically-conductive region provided between the third first electrically-conductive regions adjacent to each other, at the interface of the first surface.

(39)

A light-receiving element including:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a third first electrically-conductive region provided around the second first electrically-conductive region and being in an electrically floating state, at the interface of the first surface;
an electrically-conductive film provided above the first surface at least between the first first electrically-conductive region and the second first electrically-conductive region;
a first second electrically-conductive region having a different electrically-conductive type provided between the first first electrically-conductive region and the second first electrically-conductive region, at the interface of the first surface; and
a fourth first electrically-conductive region provided between the second first electrically-conductive region and the first second electrically-conductive region, at the interface of the first surface, the fourth first electrically-conductive region partially extending on the second first electrically-conductive region and having an impurity concentration lower than the second first electrically-conductive region.

(40)

A light-receiving element including:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a third first electrically-conductive region provided around the second first electrically-conductive region and being in an electrically floating state, at the interface of the first surface;
an electrically-conductive film provided above the first surface between the first first electrically-conductive region and the second first electrically-conductive region;
a first second electrically-conductive region having a different electrically-conductive type formed up to a position deeper than the second first electrically-conductive region between the first first electrically-conductive region and the second first electrically-conductive region, at the interface of the first surface; and
a fourth first electrically-conductive region provided between the first first electrically-conductive region and the second first electrically-conductive region and between the second first electrically-conductive region and the first second electrically-conductive region, at the interface of the first surface, the fourth first electrically-conductive region having an impurity concentration lower than the second first electrically-conductive region.

This application claims the benefit of Japanese Priority Patent Application JP2021-112167 filed with the Japan Patent Office on Jul. 6, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:
1. A light-receiving element, comprising:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;

a third first electrically-conductive region provided around the second first electrically-conductive region and being in an electrically floating state, at the interface of the first surface;

a first second electrically-conductive region having a different electrically-conductive type provided between the first first electrically-conductive region and the second first electrically-conductive region, at the interface of the first surface; and a fourth first electrically-conductive region provided at least between the first first electrically-conductive region and the first second electrically-conductive region and having an impurity concentration lower than the first first electrically-conductive region, near the interface of the first surface.

2. The light-receiving element according to claim 1, wherein the fourth first electrically-conductive region has a peak concentration of $1e^{19}$ cm$^{-3}$ or less.

3. The light-receiving element according to claim 1, wherein the fourth first electrically-conductive region is further provided between the first second electrically-conductive region and the second first electrically-conductive region at the interface of the first surface.

4. The light-receiving element according to claim 1, further comprising:
   an insulating layer provided on a side of the first surface of the semiconductor substrate; and
   a wiring layer provided in the insulating layer, wherein
   the insulating layer between the first surface and the wiring layer includes a monolayer film of silicon oxide or a stacked film in which at least a silicon oxide film having a thickness of 30 nm or more and a silicon nitride film are provided in this order from the side of the first surface.

5. The light-receiving element according to claim 1, further comprising:
   a first insulating layer provided on the first surface of the semiconductor substrate and including a high-dielectric material having a relative permittivity higher than silicon oxide; and
   a first electrically-conductive film provided on a side of the first surface of the semiconductor substrate with at least the first insulating layer interposed therebetween.

6. The light-receiving element according to claim 5, wherein
   the first electrically-conductive film comprises a plurality of first electrically-conductive films,
   the first insulating layer is provided individually for each of the plurality of first electrically-conductive films, and
   the light-receiving element further comprises a second insulating layer in which a plurality of the first insulating layers and the plurality of first electrically-conductive films are embedded and an air gap is formed at least between the first insulating layers adjacent to each other.

7. The light-receiving element according to claim 1, further comprising an insulating layer provided on a side of the first surface of the semiconductor substrate, wherein
   the insulating layer has an air gap formed between the first first electrically-conductive region and the second first electrically-conductive region.

8. The light-receiving element according to claim 7, wherein
   the semiconductor substrate has a depression on the first surface, and the first first electrically-conductive region is provided in the depression.

9. The light-receiving element according to claim 1, wherein
   a plurality of the third first electrically-conductive regions are provided substantially concentrically and rectangularly or substantially concentrically about the first first electrically-conductive region, and
   the third first electrically-conductive regions adjacent to each other have a uniform interval therebetween in all formation regions.

10. The light-receiving element according to claim 1, further comprising:
    an insulating layer provided on a side of the first surface of the semiconductor substrate; and
    a second electrically-conductive film provided wider than the third first electrically-conductive region to cover at least a portion of the third first electrically-conductive region with the insulating layer interposed therebetween, the second electrically-conductive film being electrically coupled to the third first electrically-conductive region via an opening provided in the insulating layer.

11. The light-receiving element according to claim 10, wherein the second electrically-conductive film overhangs the third first electrically-conductive region on a side of the first first electrically-conductive region.

12. The light-receiving element according to claim 1, wherein
    a plurality of the third first electrically-conductive regions are provided substantially concentrically and rectangularly or substantially concentrically about the first first electrically-conductive region, and
    the light-receiving element further comprises a second second electrically-conductive region provided between the third first electrically-conductive regions adjacent to each other near the interface of the first surface.

13. The light-receiving element according to claim 12, wherein the third first electrically-conductive region includes, on both sides, a fifth first electrically-conductive region having an impurity concentration lower than the third first electrically-conductive region.

14. The light-receiving element according to claim 12, wherein the second second electrically-conductive region is further provided near the interface of the first surface between the second first electrically-conductive region and the third first electrically-conductive region.

15. The light-receiving element according to claim 12, wherein the second second electrically-conductive region is provided in contact with the third first electrically-conductive region on a side opposite to a side of the second first electrically-conductive region.

16. The light-receiving element according to claim 12, further comprising a sixth first electrically-conductive region provided near the interface of the first surface between the second second electrically-conductive region and the third first electrically-conductive region on a side of the second first electrically-conductive region, the sixth first electrically-conductive region having an impurity concentration lower than the third first electrically-conductive region.

17. The light-receiving element according to claim 15, wherein, of the second second electrically-conductive region provided in contact with each of the plurality of the third first electrically-conductive regions, the second second electrically-conductive region in contact with the third first electrically-conductive region is formed wider as being closer to the side opposite to the side of the second first electrically-conductive region.

18. The light-receiving element according to claim 15, wherein, of the second second electrically-conductive region provided in contact with each of the plurality of the third first electrically-conductive regions, the second second electrically-conductive region in contact with the third first electrically-conductive region has a higher impurity concentration as being closer to the side opposite to the side of the second first electrically-conductive region.

19. The light-receiving element according to claim 12, further comprising a multilayer wiring layer in which a plurality of wiring layers are stacked with an insulating layer interposed therebetween on a side of the first surface of the semiconductor substrate, wherein the plurality of wiring layers includes a first wiring layer extending above the third first electrically-conductive region, and the first wiring layer is formed in a second layer or a subsequent layer, among the plurality of wiring layers, from the side of the first surface.

20. The light-receiving element according to claim 1, wherein
the semiconductor substrate further includes a third second electrically-conductive region embedded and formed in the substrate and facing the second first electrically-conductive region and the third first electrically-conductive region, and a plurality of pixels each including the first first electrically-conductive region, the second first electrically-conductive region, and the third first electrically-conductive region, and
the light-receiving element further comprises a fourth second electrically-conductive region near the interface of the first surface between the pixels adjacent to each other.

21. The light-receiving element according to claim 1, wherein
the semiconductor substrate further includes a third second electrically-conductive region embedded and formed in the substrate and facing the second first electrically-conductive region and the third first electrically-conductive region, and a plurality of pixels each including the first first electrically-conductive region, the second first electrically-conductive region, and the third first electrically-conductive region, and
a plurality of the third first electrically-conductive regions provided in the respective pixels adjacent to each other are coupled to each other via a seventh first electrically-conductive region at least partially having an impurity concentration equivalent to the third first electrically-conductive regions.

22. The light-receiving element according to claim 1, wherein
the semiconductor substrate further includes a third second electrically-conductive region embedded and formed in the substrate and facing the second first electrically-conductive region and the third first electrically-conductive region, and a plurality of pixels each including the first first electrically-conductive region, the second first electrically-conductive region, and the third first electrically-conductive region, and
a plurality of the third first electrically-conductive regions of the respective pixels adjacent to each other are electrically coupled to each other via a wiring line provided on the first surface of the semiconductor substrate.

23. The light-receiving element according to claim 22, wherein the first first electrically-conductive region extends toward a second surface opposed to the first surface, and extends in an in-plane direction of the semiconductor substrate with the third second electrically-conductive region interposed therebetween.

24. The light-receiving element according to claim 1, further comprising an electrically neutral diffusion region extending from a bottom surface of the first first electrically-conductive region on a side of a second surface opposed to the first surface toward the second surface and extending to a position not overlapping the second first electrically-conductive region in an in-plane direction of the semiconductor substrate.

25. The light-receiving element according to claim 1, wherein
the semiconductor substrate further includes
a third second electrically-conductive region embedded and formed in the substrate and facing the second first electrically-conductive region and the third first electrically-conductive region, and
an electrically neutral diffusion region extending from a bottom surface of the first first electrically-conductive region on a side of a second surface opposed to the first surface toward the second surface, the electrically neutral diffusion region comprising a plurality of electrically neutral diffusion regions being provided substantially concentrically and rectangularly around the first first electrically-conductive region in a plan view in an in-plane direction of the semiconductor substrate with the third second electrically-conductive region interposed therebetween, the electrically neutral diffusion regions being electrically coupled to each other.

26. The light-receiving element according to claim 3, further comprising a first electrically-conductive film provided above the first surface at least between the first first electrically-conductive region and the second first electrically-conductive region, wherein
an overlapped region, in which the fourth first electrically-conductive region extends toward the first first electrically-conductive region across the first surface on the second first electrically-conductive region, is provided between the second first electrically-conductive region and the fourth first electrically-conductive region, the fourth first electrically-conductive region provided between the first second electrically-conductive region and the second first electrically-conductive region.

27. The light-receiving element according to claim 1, further comprising a first electrically-conductive film provided above the first surface at least between the first first electrically-conductive region and the second first electrically-conductive region, wherein
the first second electrically-conductive region is formed up to a position deeper than the second first electrically-conductive region from the interface of the first surface.

28. The light-receiving element according to claim 1, further comprising:
a first electrically-conductive film provided above the first surface between the first first electrically-conductive region and the second first electrically-conductive region; and
a separation section including an oxide film embedded and formed in the first surface between the first first electrically-conductive region and the second first electrically-conductive region.

29. The light-receiving element according to claim 1, further comprising a first electrically-conductive film provided above the first surface between the first first electrically-conductive region and the second first electrically-conductive region, the first electrically-conductive film partially protruding into the semiconductor substrate between the first first electrically-conductive region and the second first electrically-conductive region.

30. The light-receiving element according to claim 1, further comprising, on the first surface between the first first electrically-conductive region and the second first electrically-conductive region, a vertical transistor that transfers electric charge generated by photoelectric conversion, wherein
   the semiconductor substrate further includes a third second electrically-conductive region embedded and formed in the substrate and facing the second first electrically-conductive region and the third first electrically-conductive region, and
   a gate of the vertical transistor extends in the semiconductor substrate toward a second surface opposed to the first surface from the first surface of the semiconductor substrate, and is in contact with a side surface of the third second electrically-conductive region.

31. An X-ray imaging element comprising a plurality of light-receiving elements generating signal charge based on an X-ray,
   the light-receiving elements each including
      a semiconductor substrate including a photoelectric conversion region,
      a first first electrically-conductive region provided at an interface of a first surface of the semiconductor substrate and coupled to a first electrode,
      a second first electrically-conductive region provided around the first first electrically-conductive region and coupled to a second electrode, at the interface of the first surface,
      a third first electrically-conductive region provided around the second first electrically-conductive region and being in an electrically floating state, at the interface of the first surface,
      a first second electrically-conductive region having a different electrically-conductive type provided between the first first electrically-conductive region and the second first electrically-conductive region, at the interface of the first surface, and
      a fourth first electrically-conductive region provided at least between the first first electrically-conductive region and the first second electrically-conductive region and having an impurity concentration lower than the first first electrically-conductive region, near the interface of the first surface.

32. The X-ray imaging element according to claim 31, comprising
   a pixel region in which a plurality of pixels are arranged; and
   a peripheral region provided around the pixel region, wherein
   the semiconductor substrate includes a depletion region in the pixel region and includes a neutral region in the peripheral region.

33. The X-ray imaging element according to claim 32, wherein
   the light-receiving elements are provided for the respective pixels, and
   the light-receiving elements each comprise a p-n junction light-receiving element that applies a reverse bias between the first surface of the semiconductor substrate and a second surface opposed to the first surface.

34. An electronic apparatus comprising an X-ray imaging element,
   the X-ray imaging element including a plurality of light-receiving elements generating signal charge based on an X-ray,
   the light-receiving elements each including
      a semiconductor substrate including a photoelectric conversion region,
      a first first electrically-conductive region provided at an interface of a first surface of the semiconductor substrate and coupled to a first electrode,
      a second first electrically-conductive region provided around the first first electrically-conductive region and coupled to a second electrode, at the interface of the first surface,
      a third first electrically-conductive region provided around the second first electrically-conductive region and being in an electrically floating state, at the interface of the first surface,
      a first second electrically-conductive region having a different electrically-conductive type provided between the first first electrically-conductive region and the second first electrically-conductive region, at the interface of the first surface, and
      a fourth first electrically-conductive region provided at least between the first first electrically-conductive region and the first second electrically-conductive region and having an impurity concentration lower than the first first electrically-conductive region, near the interface of the first surface.

35. A light-receiving element comprising:
   a semiconductor substrate including a photoelectric conversion region;
      a first first electrically-conductive region provided at an interface of a first surface of the semiconductor substrate and coupled to a first electrode;
      a second first electrically-conductive region provided around the first first electrically-conductive region and coupled to a second electrode, at the interface of the first surface;
      a third first electrically-conductive region provided around the second first electrically-conductive region and being in an electrically floating state, at the interface of the first surface;
   an electrically-conductive film provided on a side of the first surface of the semiconductor substrate; and
      an insulating layer provided between the first surface and the electrically-conductive film, the insulating layer including a monolayer film of silicon oxide or a stacked film in which at least a silicon oxide film having a thickness of 30 nm or more and a silicon nitride film are provided in this order from the side of the first surface.

36. A light-receiving element comprising: a semiconductor substrate including a photoelectric conversion region; a first first electrically-conductive region provided at an interface of a first surface of the semiconductor substrate and coupled to a first electrode; a second first electrically-conductive region provided around the first first electrically-conductive region and coupled to a second electrode, at the interface of the first surface; a third first electrically-conductive region provided around the second first electrically-conductive region and being in an electrically floating state, at the interface of the first surface; a first insulating layer provided on the first surface of the semiconductor substrate and including a high-dielectric material having a relative permittivity higher than silicon oxide; and an electrically-conductive film provided on a side of the first surface of the semiconductor substrate with at least the first insulating layer interposed therebetween.

37. A light-receiving element comprising:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a third first electrically-conductive region provided around the second first electrically-conductive region and being in an electrically floating state, at the interface of the first surface; and
an insulating layer provided on a side of the first surface of the semiconductor substrate and having an air gap between the first first electrically-conductive region and the second first electrically-conductive region.

38. A light-receiving element, comprising:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a plurality of third first electrically-conductive regions provided around the second first electrically-conductive region substantially concentrically and rectangularly or substantially concentrically about the first first electrically-conductive region and being in an electrically floating state, at the interface of the first surface; and
a second second electrically-conductive region provided between the third first electrically-conductive regions adjacent to each other, at the interface of the first surface.

39. A light-receiving element, comprising:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a third first electrically-conductive region provided around the second first electrically-conductive region and being in an electrically floating state, at the interface of the first surface;
an electrically-conductive film provided above the first surface at least between the first first electrically-conductive region and the second first electrically-conductive region;
a first second electrically-conductive region having a different electrically-conductive type provided between the first first electrically-conductive region and the second first electrically-conductive region, at the interface of the first surface; and
a fourth first electrically-conductive region provided between the second first electrically-conductive region and the first second electrically-conductive region, at the interface of the first surface, the fourth first electrically-conductive region partially extending on the second first electrically-conductive region and having an impurity concentration lower than the second first electrically-conductive region.

40. A light-receiving element, comprising:
a semiconductor substrate including a photoelectric conversion region;
a first first electrically-conductive region provided at an interface of a first surface of the semiconductor substrate and coupled to a first electrode;
a second first electrically-conductive region provided around the first first electrically-conductive region and coupled to a second electrode, at the interface of the first surface;
a third first electrically-conductive region provided around the second first electrically-conductive region and being in an electrically floating state, at the interface of the first surface;
an electrically-conductive film provided above the first surface between the first first electrically-conductive region and the second first electrically-conductive region;
a first second electrically-conductive region having a different electrically-conductive type formed up to a position deeper than the second first electrically-conductive region between the first first electrically-conductive region and the second first electrically-conductive region, at the interface of the first surface; and
a fourth first electrically-conductive region provided between the first first electrically-conductive region and the second first electrically-conductive region and between the second first electrically-conductive region and the first second electrically-conductive region, at the interface of the first surface, the fourth first electrically-conductive region having an impurity concentration lower than the second first electrically-conductive region.

* * * * *